(12) United States Patent
Srinivas et al.

(10) Patent No.: US 8,748,749 B2
(45) Date of Patent: Jun. 10, 2014

(54) PATTERNED TRANSPARENT CONDUCTORS AND RELATED MANUFACTURING METHODS

(75) Inventors: Arjun Srinivas, San Francisco, CA (US); Matthew R. Robinson, San Francisco, CA (US); Alexander Chow Mittal, Berkeley, CA (US); Michael Eugene Young, Emeryville, CA (US); David Buchanan, San Francisco, CA (US); Joseph George, Fremont, CA (US); Yuka Yoshioka, Emeryville, CA (US)

(73) Assignee: Innova Dynamics, Inc., San Francisco, CA (US)

( * ) Notice: Subject to any disclaimer, the term of this patent is extended or adjusted under 35 U.S.C. 154(b) by 99 days.

(21) Appl. No.: 13/594,758

(22) Filed: Aug. 24, 2012

(65) Prior Publication Data

US 2013/0056244 A1    Mar. 7, 2013

Related U.S. Application Data

(60) Provisional application No. 61/527,069, filed on Aug. 24, 2011, provisional application No. 61/536,985, filed on Sep. 20, 2011, provisional application No. 61/537,514, filed on Sep. 21, 2011, provisional application No. 61/539,415, filed on Sep. 26, 2011, provisional application No. 61/539,868, filed on Sep. 27, 2011, provisional application No. 61/541,923, filed on Sep. 30, 2011, provisional application No. 61/609,128, filed on Mar. 9, 2012, provisional application No. 61/636,524, filed on Apr. 20, 2012.

(51) Int. Cl.
H05K 1/00   (2006.01)
B32B 5/16   (2006.01)
H05K 1/03   (2006.01)

(52) U.S. Cl.
USPC ............ 174/250; 428/323; 428/327; 174/256

(58) Field of Classification Search
USPC .......................... 174/250, 256; 428/323, 327
See application file for complete search history.

(56) References Cited

U.S. PATENT DOCUMENTS 3,849,284 A   11/1974   Kossmann
4,604,427 A   8/1986   Roberts et al.

(Continued)

FOREIGN PATENT DOCUMENTS

JP   2008-157743 A   6/1996
JP   2007-39392      2/2007

(Continued)

OTHER PUBLICATIONS

U.S. Appl. No. 13/536,968, filed Jun. 28, 2012, Srinivas et al.

(Continued)

*Primary Examiner* — Jeremy C Norris
*Assistant Examiner* — Nathan Milakovich
(74) *Attorney, Agent, or Firm* — Foley & Lardner LLP; Cliff Z. Liu

(57) ABSTRACT

A patterned transparent conductor includes a substrate and additives at least partially embedded into at least one surface of the substrate and localized adjacent to the surface according to a pattern to form higher sheet conductance portions. The higher sheet conductance portions are laterally adjacent to lower sheet conductance portions.

30 Claims, 22 Drawing Sheets

(56) References Cited

U.S. PATENT DOCUMENTS

| | | | |
|---|---|---|---|
| 5,071,221 A | 12/1991 | Fujitani et al. | |
| 5,474,814 A | 12/1995 | Komatsu et al. | |
| 5,492,769 A | 2/1996 | Pryor et al. | |
| 5,879,740 A | 3/1999 | Miyazaki | |
| 6,156,550 A | 12/2000 | Glad | |
| 6,187,448 B1 | 2/2001 | Hanoka | |
| 6,248,342 B1 | 6/2001 | Trogolo et al. | |
| 6,383,397 B1 | 5/2002 | Kojima et al. | |
| 6,602,932 B2 | 8/2003 | Feldheim et al. | |
| 6,882,051 B2 | 4/2005 | Marjumdar et al. | |
| 7,642,463 B2 | 1/2010 | Guiheen et al. | |
| 7,785,557 B2* | 8/2010 | Gruner et al. | 423/445 R |
| 7,849,424 B2* | 12/2010 | Wolk et al. | 716/117 |
| 7,960,027 B2 | 6/2011 | Guiheen et al. | |
| 8,018,568 B2 | 9/2011 | Allemand et al. | |
| 8,049,333 B2 | 11/2011 | Alden et al. | |
| 8,094,247 B2 | 1/2012 | Allemand et al. | |
| 8,138,568 B2 | 3/2012 | Yoon et al. | |
| 8,174,667 B2 | 5/2012 | Allemand et al. | |
| 8,460,747 B2* | 6/2013 | Veerasamy | 427/122 |
| 8,518,472 B2* | 8/2013 | Veerasamy | 427/58 |
| 8,530,262 B2* | 9/2013 | Van Duren et al. | 438/57 |
| 8,604,332 B2* | 12/2013 | Veerasamy | 136/243 |
| 8,609,975 B2* | 12/2013 | Veerasamy | 136/243 |
| 2002/0115747 A1 | 8/2002 | Feldheim et al. | |
| 2002/0119251 A1 | 8/2002 | Chen et al. | |
| 2002/0175408 A1 | 11/2002 | Majumdar et al. | |
| 2003/0129415 A1 | 7/2003 | Rasmussen et al. | |
| 2003/0157354 A1 | 8/2003 | Vanveghel et al. | |
| 2003/0203207 A1 | 10/2003 | Pessey et al. | |
| 2004/0166166 A1 | 8/2004 | Matsunami et al. | |
| 2004/0169151 A1 | 9/2004 | Yagi et al. | |
| 2006/0038182 A1 | 2/2006 | Rogers et al. | |
| 2006/0111008 A1 | 5/2006 | Arthur et al. | |
| 2006/0194037 A1 | 8/2006 | Fink et al. | |
| 2006/0257638 A1 | 11/2006 | Glatkowski et al. | |
| 2007/0065651 A1 | 3/2007 | Glatkowski et al. | |
| 2007/0093181 A1 | 4/2007 | Lugg et al. | |
| 2007/0104605 A1 | 5/2007 | Hampden-Smith et al. | |
| 2007/0153353 A1* | 7/2007 | Gruner | 359/245 |
| 2007/0196650 A1 | 8/2007 | Yamamoto et al. | |
| 2007/0264481 A1 | 11/2007 | DeSimone et al. | |
| 2007/0298253 A1 | 12/2007 | Hata et al. | |
| 2008/0143906 A1 | 6/2008 | Allemand et al. | |
| 2008/0152870 A1 | 6/2008 | Takada et al. | |
| 2008/0193634 A1 | 8/2008 | Yaniv et al. | |
| 2008/0259262 A1 | 10/2008 | Jones et al. | |
| 2008/0276987 A1 | 11/2008 | Flood | |
| 2009/0129004 A1* | 5/2009 | Gruner | 361/679.21 |
| 2009/0165844 A1 | 7/2009 | Dutta | |
| 2009/0188697 A1 | 7/2009 | Guiheen et al. | |
| 2009/0229652 A1 | 9/2009 | Mapel | |
| 2010/0012190 A1 | 1/2010 | Goto | |
| 2010/0197068 A1* | 8/2010 | Poon et al. | 438/63 |
| 2010/0230344 A1 | 9/2010 | Srinivas et al. | |
| 2010/0273060 A1* | 10/2010 | Yang et al. | 429/231.8 |
| 2011/0139253 A1 | 6/2011 | Wachi et al. | |
| 2011/0217544 A1 | 9/2011 | Young et al. | |
| 2011/0281070 A1 | 11/2011 | Mittal et al. | |
| 2012/0055013 A1* | 3/2012 | Finn | 29/600 |
| 2012/0094090 A1 | 4/2012 | Yamazaki et al. | |
| 2012/0098419 A1 | 4/2012 | Chiba et al. | |
| 2012/0132930 A1 | 5/2012 | Young et al. | |
| 2012/0273262 A1* | 11/2012 | Chu | 174/256 |
| 2013/0000952 A1 | 1/2013 | Srinivas | |
| 2013/0014980 A1* | 1/2013 | Takeda et al. | 174/257 |
| 2013/0277625 A1* | 10/2013 | Srinivas et al. | 252/514 |
| 2013/0319729 A1* | 12/2013 | Poon | 174/250 |
| 2013/0341074 A1* | 12/2013 | Virkar et al. | 174/255 |
| 2014/0014171 A1* | 1/2014 | Alam et al. | 136/256 |

FOREIGN PATENT DOCUMENTS

| | | |
|---|---|---|
| WO | WO 2005/061598 A1 | 7/2005 |
| WO | WO 2005/089480 | 9/2005 |
| WO | WO 2007/013871 A2 | 2/2007 |
| WO | WO 2007/095058 A2 | 8/2007 |
| WO | WO 2008/150867 A2 | 12/2008 |
| WO | WO 2008/150867 A3 | 12/2008 |
| WO | WO 2010/022353 A1 | 2/2010 |
| WO | WO 2010/030374 A2 | 3/2010 |
| WO | WO 2010/150619 | 12/2010 |
| WO | WO 2011/106438 A1 | 9/2011 |
| WO | WO 2011/106730 A2 | 9/2011 |
| WO | WO 2011/106730 A3 | 9/2011 |
| WO | WO 2012/021460 A2 | 2/2012 |
| WO | WO 2012/021460 A3 | 2/2012 |
| WO | WO 2012/021460 A9 | 2/2012 |

OTHER PUBLICATIONS

Australian Patent Appln. No. 2008260162, Examination Report (Feb. 6, 2012).

Chinese Patent Appln. No. 200880100186.0, Notification of 2nd Office Action (Apr. 28, 2012).

Hu, et al., "Scalable coating and properties of transparent, flexible, silver nanowire electrodes." ACS Nano, vol. 4:5, 2955-2963 (2010).

Office Action from JP 2011-524032 (Notice of Reasons for Rejection) dated Apr. 1, 2013.

PCT/US2009/054655, International Search Report & Written Opinion dated Oct. 19, 2009.

PCT/US2011/046969, International Search Report dated Feb. 20, 2012.

Search report from PCT/US2011/026362 dated Oct. 10, 2011.

Search report from PCT/US2012/052396 dated Mar. 29, 2013.

Supplementary Search Report EP08756437, Sep. 19, 2011, 8 pages.

U.S. Appl. No. 13/035,888, filed Feb. 25, 2011, Advisory Action dated Oct. 5, 2012.

U.S. Appl. No. 13/035,888, filed Feb. 25, 2011, Office Action dated Dec. 22, 2011.

U.S. Appl. No. 13/035,888, filed Feb. 25, 2011, Office Action dated Jul. 19, 2012.

\* cited by examiner

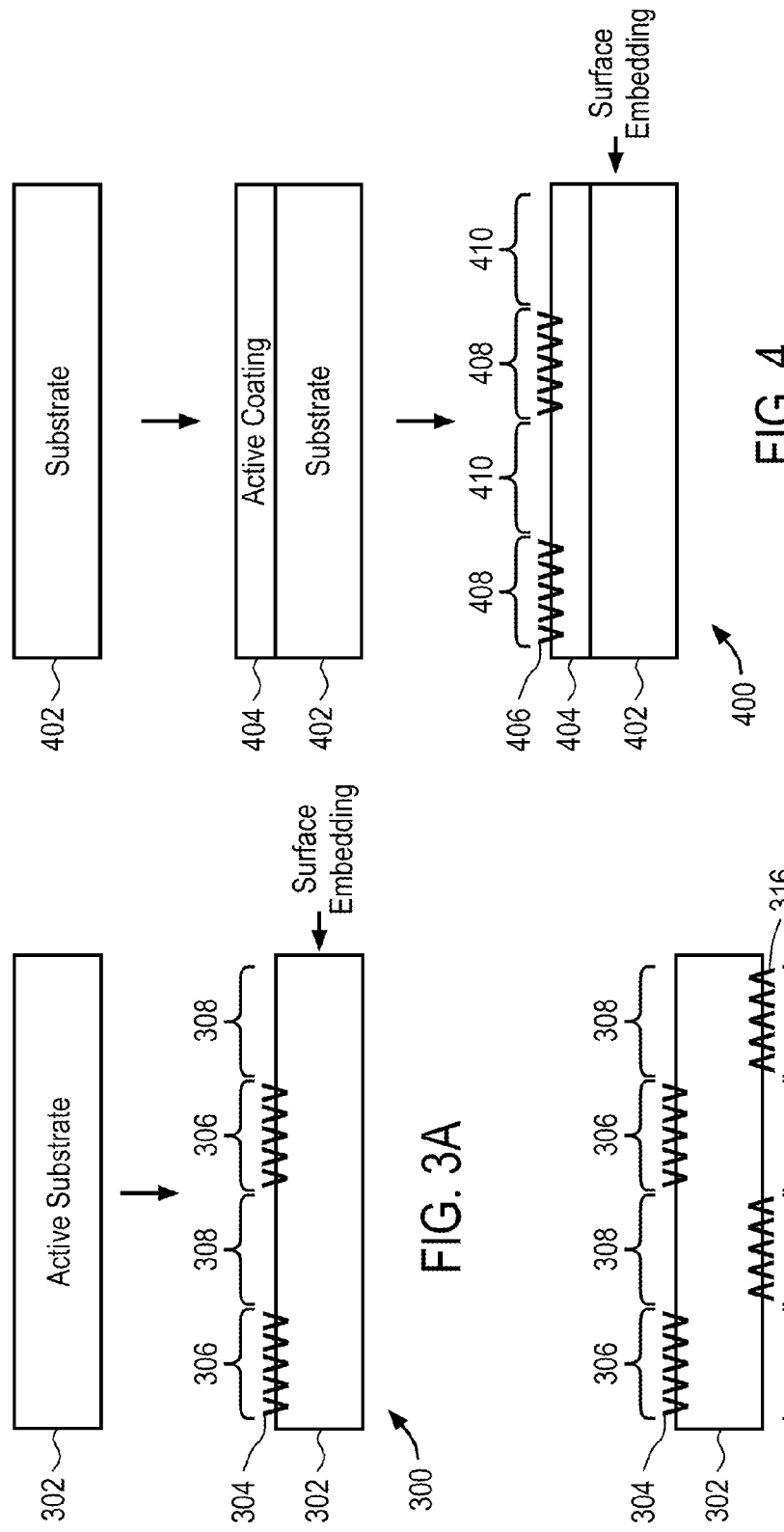

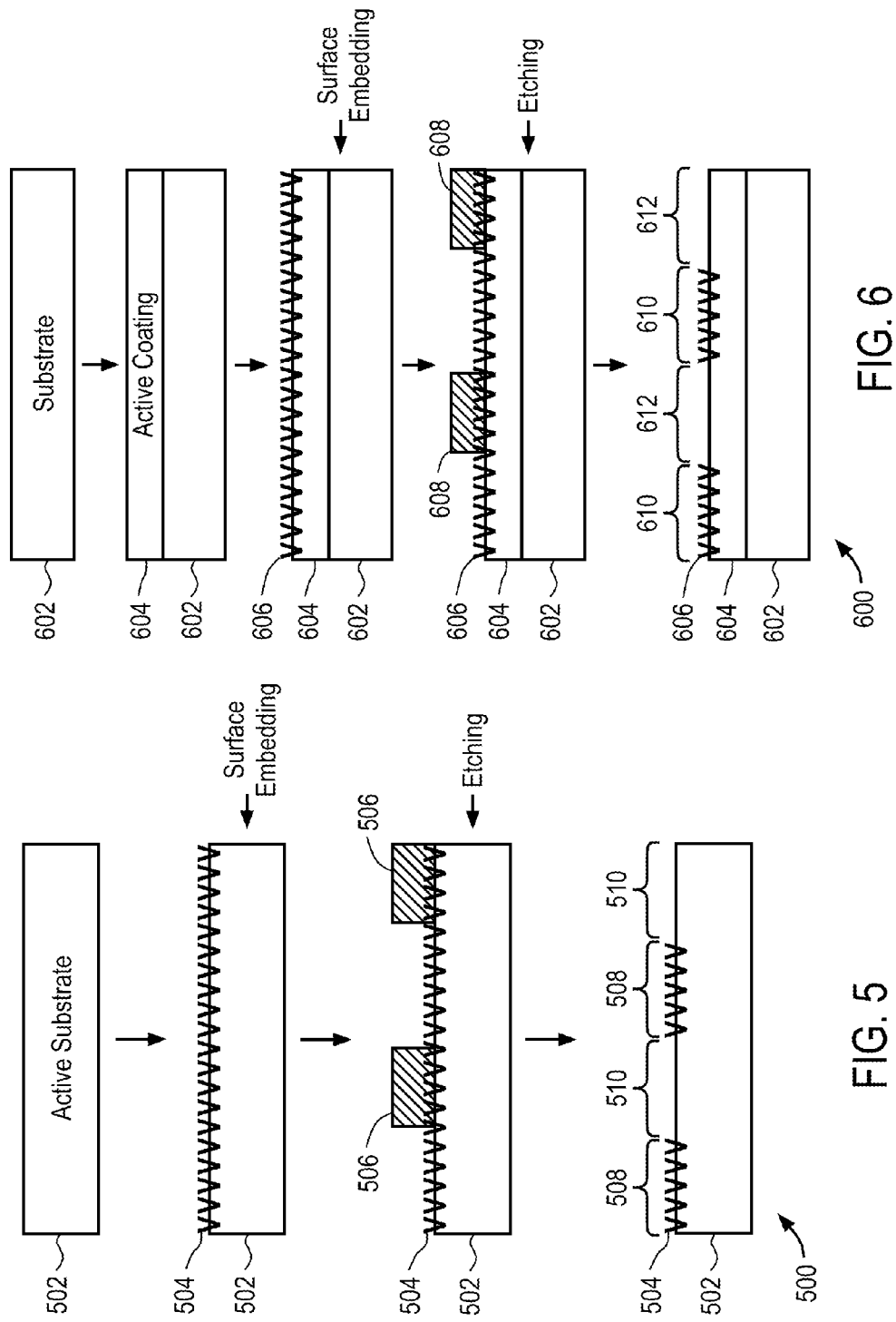

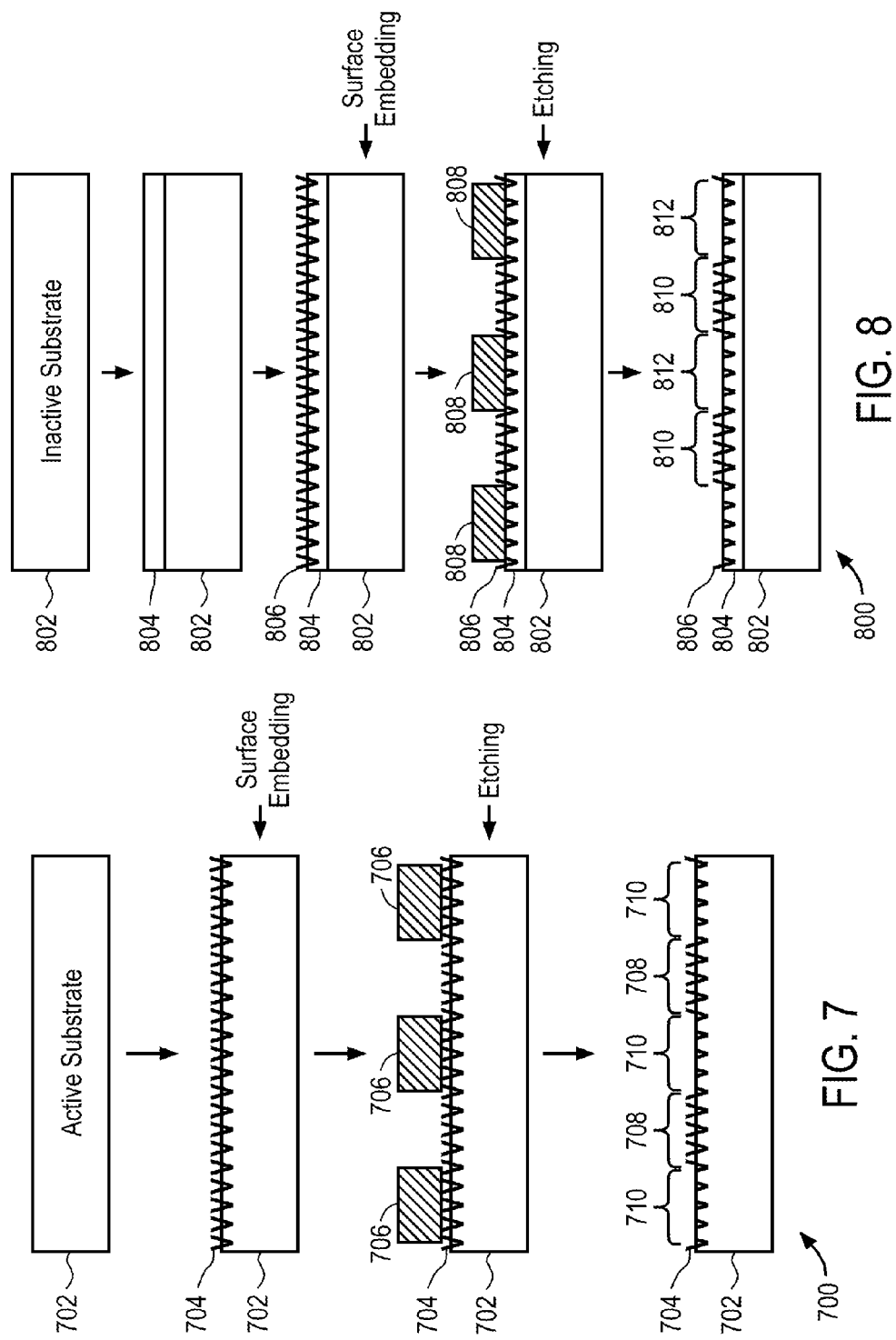

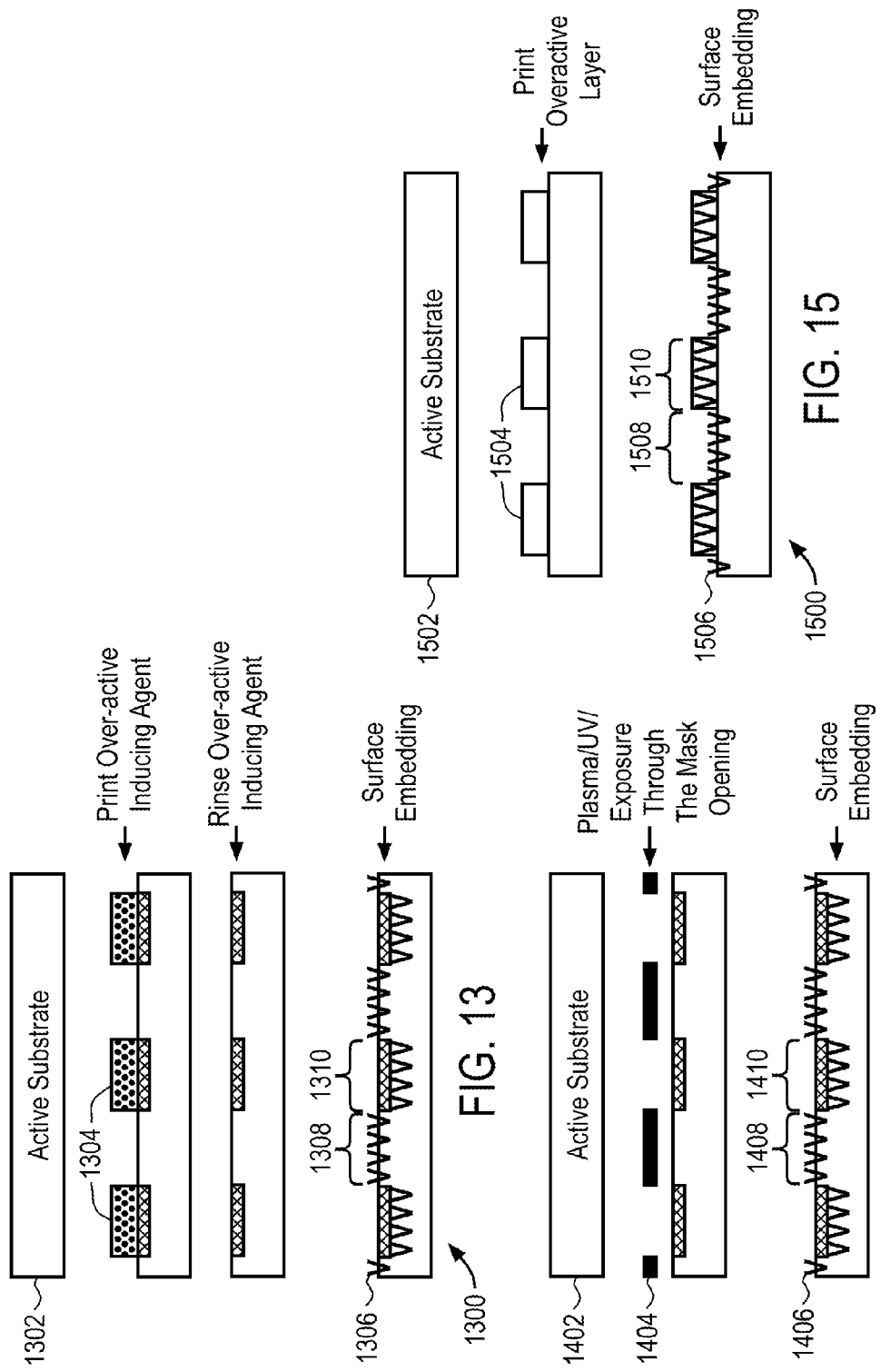

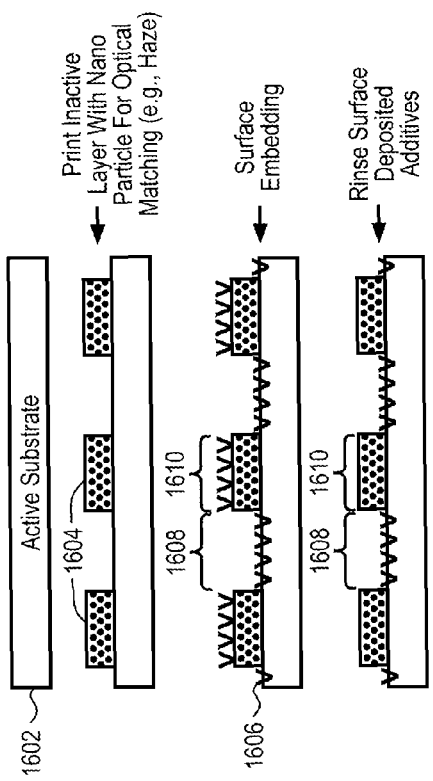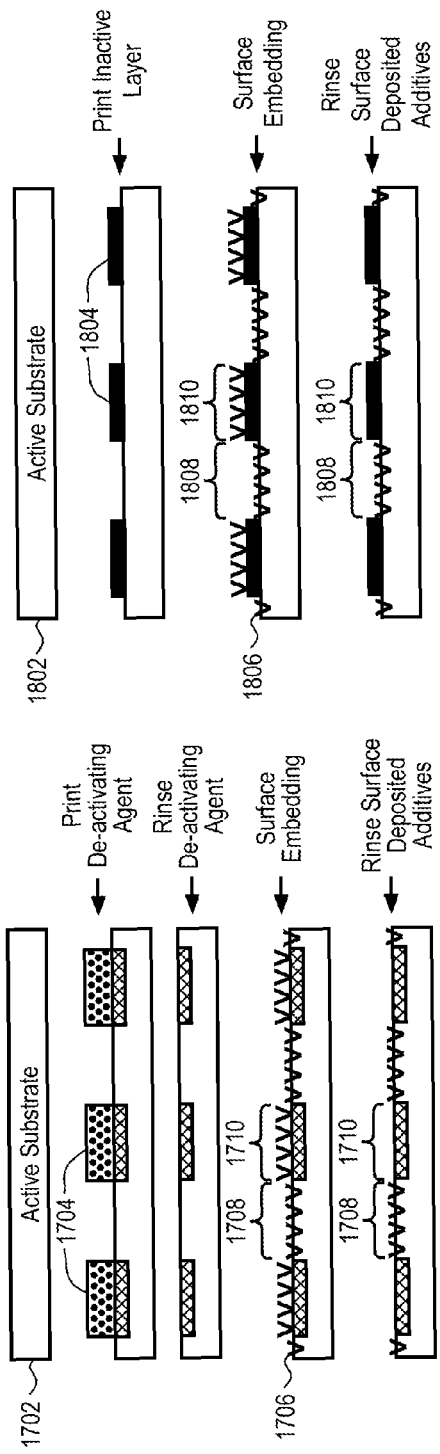

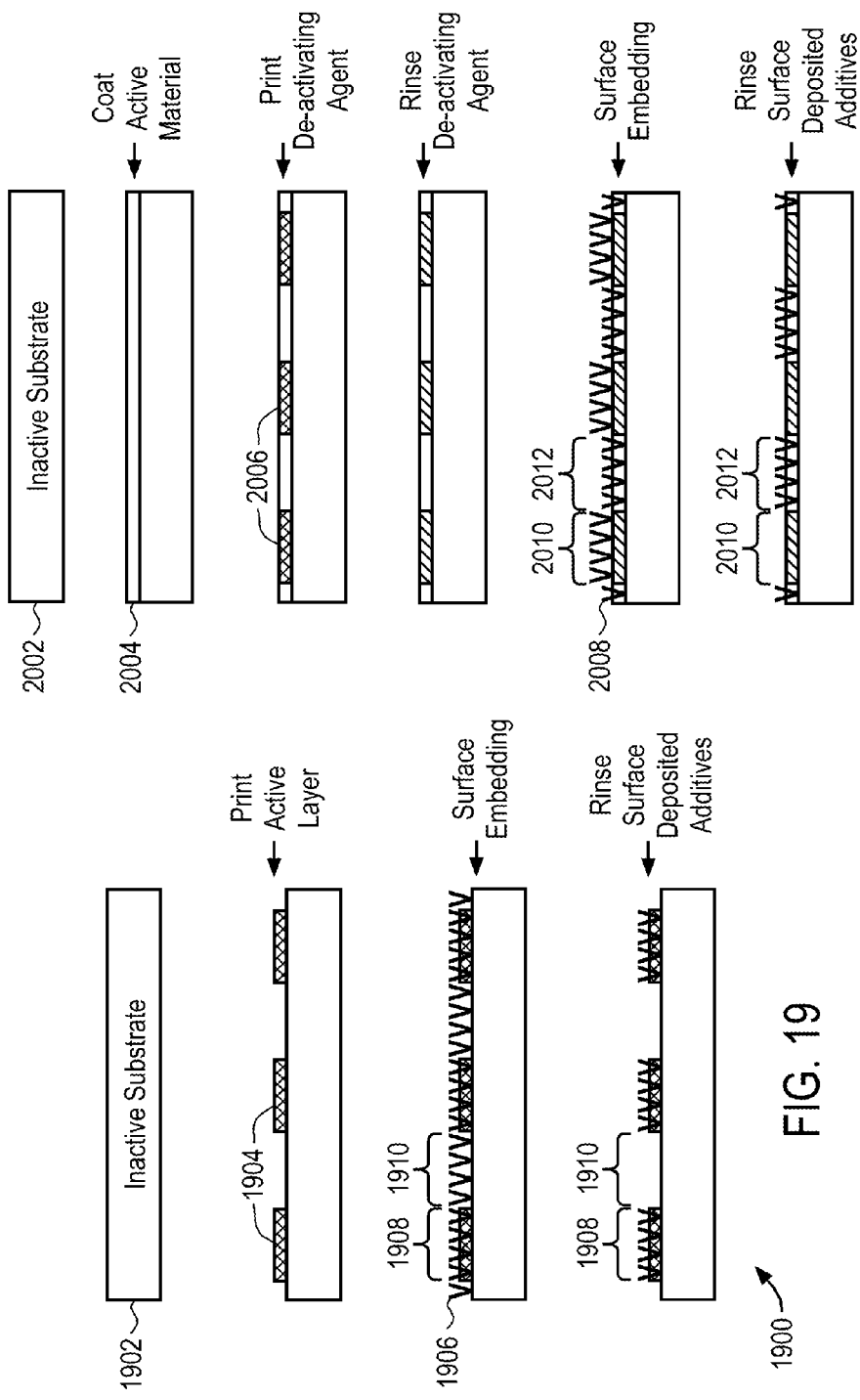

PATTERNED TRANSPARENT CONDUCTORS AND RELATED MANUFACTURING METHODS

CROSS REFERENCE TO RELATED APPLICATIONS

This application claims the benefit of U.S. Provisional Application No. 61/527,069, filed on Aug. 24, 2011, U.S. Provisional Application No. 61/536,985, filed on Sep. 20, 2011, U.S. Provisional Application No. 61/537,514, filed on Sep. 21, 2011, U.S. Provisional Application No. 61/539,415, filed on Sep. 26, 2011, U.S. Provisional Application No. 61/539,868, filed on Sep. 27, 2011, U.S. Provisional Application No. 61/541,923, filed on Sep. 30, 2011, U.S. Provisional Application No. 61/609,128, filed on Mar. 9, 2012, and U.S. Provisional Application No. 61/636,524, filed on Apr. 20, 2012, the disclosures of which are incorporated herein by reference in their entireties.

FIELD OF THE INVENTION

The invention relates generally to structures incorporating additives. More particularly, the invention relates to patterned transparent conductors incorporating additives to impart improved functionality such as electrical conductivity and low visibility patterning.

BACKGROUND

A transparent conductor permits the transmission of light while providing a conductive path for an electric current to flow through a device including the transparent conductor. Traditionally, a transparent conductor is formed as a coating of a doped metal oxide, such as tin-doped indium oxide (or ITO), which is disposed on top of a glass or plastic substrate. ITO coatings are typically formed through the use of a dry process, such as through the use of specialized physical vapor deposition (e.g., sputtering) or specialized chemical vapor deposition techniques. The resulting coating can exhibit good electrical conductivity. However, drawbacks to techniques for forming ITO coatings include high cost, high process complexity, intensive energy requirements, high capital expenditures for equipment, and poor productivity.

For some applications, patterning of a transparent conductor is desirable to form conductive traces and non-conductive gaps between the traces. In the case of ITO coatings, patterning is typically accomplished via photolithography. However, removing material via photolithography and related masking and etching processes further exacerbate the process complexity, the energy requirements, the capital expenditures, and the poor productivity for forming ITO-based transparent conductors. Also, low visibility of patterned transparent conductors is desirable for certain applications, such as touch screens. Conventional patterning techniques for ITO coatings typically result in patterns that are visible to the eye, which can be undesirable for those applications.

It is against this background that a need arose to develop the transparent conductors and related manufacturing methods described herein.

SUMMARY

One aspect of the invention relates to a patterned transparent conductor. In one embodiment, the patterned transparent conductor includes a substrate and additives at least partially embedded into at least one surface of the substrate and localized adjacent to the surface according to a pattern to form higher sheet conductance portions. The higher sheet conductance portions are laterally adjacent to lower sheet conductance portions.

In another embodiment, the patterned transparent conductor includes a substrate, a coating disposed over at least one side of the substrate, and additives embedded into a surface of the coating according to a pattern to form higher sheet conductance portions, wherein the additives are localized within a depth from the surface that is less than a thickness of the coating, and the higher sheet conductance portions are spaced apart by gaps that correspond to lower sheet conductance portions.

In another embodiment, the patterned transparent conductor includes a substrate, a patterned layer covering an area of the substrate, and additives embedded into a surface of the patterned layer to form a higher sheet conductance portion. The additives are localized within a depth from the surface that is less than a thickness of the patterned layer, and a laterally adjacent area of the substrate corresponds to a lower sheet conductance portion.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

FIG. 3A through FIG. 3B illustrate a manufacturing method of a patterned transparent conductor, according to an embodiment of the invention.

FIG. 4 illustrates a manufacturing method of a patterned transparent conductor, according to an embodiment of the invention.

FIG. 5 illustrates a manufacturing method of a patterned transparent conductor, according to an embodiment of the invention.

FIG. 6 illustrates a manufacturing method of a patterned transparent conductor, according to an embodiment of the invention.

FIG. 7 illustrates a manufacturing method of a patterned transparent conductor, according to an embodiment of the invention.

FIG. 8 illustrates a manufacturing method of a patterned transparent conductor, according to an embodiment of the invention.

FIG. 13 illustrates a manufacturing method of a patterned transparent conductor, according to an embodiment of the invention.

FIG. 14 illustrates a manufacturing method of a patterned transparent conductor, according to an embodiment of the invention.

FIG. 15 illustrates a manufacturing method of a patterned transparent conductor, according to an embodiment of the invention.

FIG. 16 illustrates a manufacturing method of a patterned transparent conductor, according to an embodiment of the invention.

FIG. 17 illustrates a manufacturing method of a patterned transparent conductor, according to an embodiment of the invention.

FIG. 18 illustrates a manufacturing method of a patterned transparent conductor, according to an embodiment of the invention.

FIG. 19 illustrates a manufacturing method of a patterned transparent conductor, according to an embodiment of the invention.

FIG. 20 illustrates a manufacturing method of a patterned transparent conductor, according to an embodiment of the invention.

DETAILED DESCRIPTION

Definitions

Figure 1A:
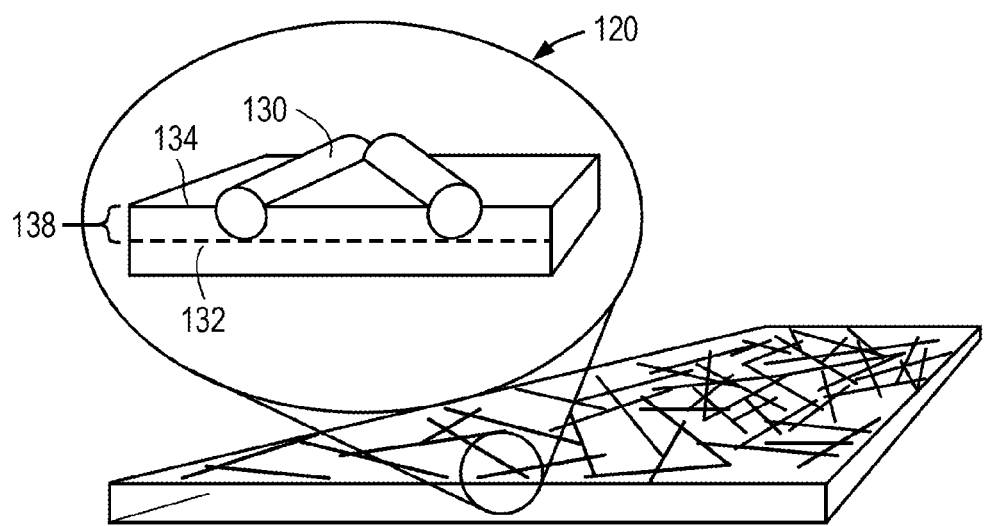
FIG. 1A and FIG. 1B illustrate transparent conductors implemented in accordance with embodiments of the invention.

The following definitions apply to some of the aspects described with regard to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set can also be referred to as members of the set. Objects of a set can be the same or different. In some instances, objects of a set can share one or more common characteristics.

As used herein, the term "adjacent" refers to being near or adjoining. Adjacent objects can be spaced apart from one another or can be in actual or direct contact with one another. In some instances, adjacent objects can be connected to one another or can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein.

As used herein, the terms "optional" and "optionally" mean that the subsequently described event or circumstance may or may not occur and that the description includes instances where the event or circumstance occurs and instances in which it does not.

As used herein, relative terms, such as "inner," "interior," "outer," "exterior," "top," "bottom," "front," "rear," "back," "upper," "upwardly," "lower," "downwardly," "vertical," "vertically," "lateral," "laterally," "above," and "below," refer to an orientation of a set of objects with respect to one another, such as in accordance with the drawings, but do not require a particular orientation of those objects during manufacturing or use.

As used herein, the term "nanometer range" or "nm range" refers to a range of dimensions from about 1 nanometer ("nm") to about 1 micrometer ("µm"). The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 µm.

As used herein, the term "micrometer range" or "µm range" refers to a range of dimensions from about 1 µm to about 1 millimeter ("mm"). The µm range includes the "lower µm range," which refers to a range of dimensions from about 1 µm to about 10 µm, the "middle µm range," which refers to a range of dimensions from about 10 µm to about 100 µm, and the "upper µm range," which refers to a range of dimensions from about 100 µm to about 1 mm.

As used herein, the term "aspect ratio" refers to a ratio of a largest dimension or extent of an object and an average of remaining dimensions or extents of the object, where the remaining dimensions are orthogonal with respect to one another and with respect to the largest dimension. In some instances, remaining dimensions of an object can be substantially the same, and an average of the remaining dimensions can substantially correspond to either of the remaining dimensions. For example, an aspect ratio of a cylinder refers to a ratio of a length of the cylinder and a cross-sectional diameter of the cylinder. As another example, an aspect ratio of a spheroid refers to a ratio of a major axis of the spheroid and a minor axis of the spheroid.

As used herein, the term "nano-sized" object refers to an object that has at least one dimension in the nm range. A nano-sized object can have any of a wide variety of shapes, and can be formed of a wide variety of materials. Examples of nano-sized objects include nanowires, nanotubes, nanoplatelets, nanoparticles, and other nanostructures.

As used herein, the term "nanowire" refers to an elongated, nano-sized object that is substantially solid. Typically, a nanowire has a lateral dimension (e.g., a cross-sectional dimension in the form of a width, a diameter, or a width or diameter that represents an average across orthogonal directions) in the nm range, a longitudinal dimension (e.g., a length) in the µm range, and an aspect ratio that is about 3 or greater.

As used herein, the term "nanoplatelet" refers to a planar-like, nano-sized object that is substantially solid.

As used herein, the term "nanotube" refers to an elongated, hollow, nano-sized object. Typically, a nanotube has a lateral dimension (e.g., a cross-sectional dimension in the form of a width, an outer diameter, or a width or outer diameter that represents an average across orthogonal directions) in the nm range, a longitudinal dimension (e.g., a length) in the μm range, and an aspect ratio that is about 3 or greater.

As used herein, the term "nanoparticle" refers to a spheroidal (e.g., approximately spheroidal), nano-sized object. Typically, each dimension (e.g., a cross-sectional dimension in the form of a width, a diameter, or a width or diameter that represents an average across orthogonal directions) of a nanoparticle is in the nm range, and the nanoparticle has an aspect ratio that is less than about 3, such as about 1.

As used herein, the term "micron-sized" object refers to an object that has at least one dimension in the μm range. Typically, each dimension of a micron-sized object is in the μm range or beyond the μm range. A micron-sized object can have any of a wide variety of shapes, and can be formed of a wide variety of materials. Examples of micron-sized objects include microwires, microtubes, microparticles, and other microstructures.

As used herein, the term "microwire" refers to an elongated, micron-sized object that is substantially solid. Typically, a microwire has a lateral dimension (e.g., a cross-sectional dimension in the form of a width, a diameter, or a width or diameter that represents an average across orthogonal directions) in the μm range and an aspect ratio that is about 3 or greater.

As used herein, the term "microtube" refers to an elongated, hollow, micron-sized object. Typically, a microtube has a lateral dimension (e.g., a cross-sectional dimension in the form of a width, an outer diameter, or a width or outer diameter that represents an average across orthogonal directions) in the μm range and an aspect ratio that is about 3 or greater.

As used herein, the term "microparticle" refers to a spheroidal, micron-sized object. Typically, each dimension (e.g., a cross-sectional dimension in the form of a width, a diameter, or a width or diameter that represents an average across orthogonal directions) of a microparticle is in the μm range, and the microparticle has an aspect ratio that is less than about 3, such as about 1.

Transparent Conductors

Embodiments of the invention relate to electrically conductive or semiconducting additives that are incorporated into host materials for use as transparent conductors or other types of conductive structures. Embodiments of transparent conductors exhibit improved performance (e.g., higher electrical and thermal conductivity and higher light transmittance), as well as cost benefits arising from their structure, composition, and manufacturing process. In some embodiments, transparent conductors can be manufactured by a surface embedding process in which additives are physically embedded into a host material, while preserving desired characteristics of the host material (e.g., transparency) and imparting additional desired characteristics to the resulting transparent conductors (e.g., electrical conductivity). In some embodiments, transparent conductors can be patterned so as to include a first set of portions having a first sheet conductance and a second set of portions having a second sheet conductance lower than the first sheet conductance. The first set of portions can correspond to higher sheet conductance portions that function as conductive traces or grids, while the second set of portions can correspond to lower sheet conductance portions that function as gaps for electrically isolating the conductive traces. Additives can be surface-embedded into either, or both, of the portions.

Figure 1B:
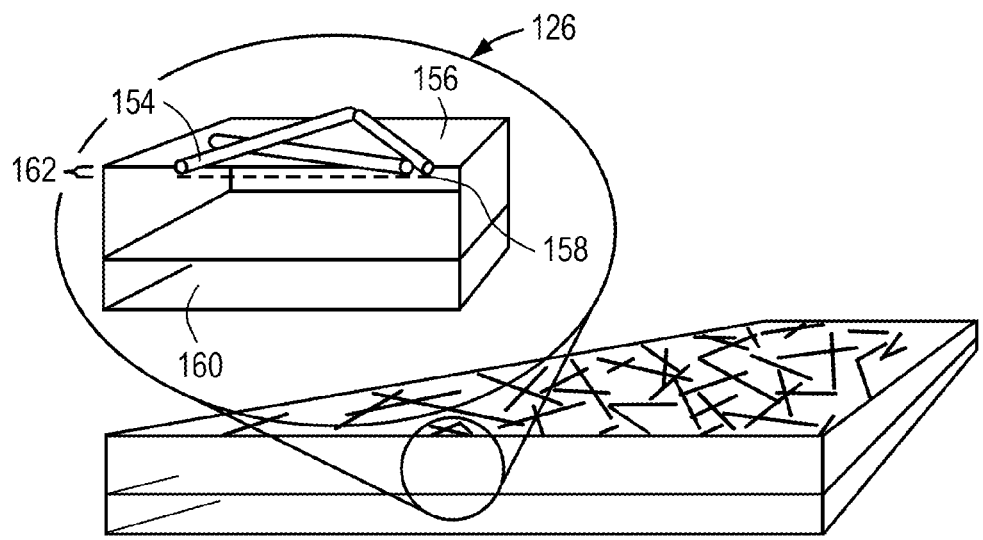

FIG. 1A and FIG. 1B illustrate examples of transparent conductors 120 and 126 implemented in accordance with embodiments of the invention. Specifically, FIG. 1A is a schematic of surface-embedded additives 130 that form a network that is partially exposed and partially buried into a top, embedding surface 134 of a host material 132, which corresponds to a substrate. The embedding surface 134 also can be a bottom surface of the host material 132, or multiple surfaces (e.g., both top and bottom surfaces) on different sides of the host material 132 can be embedded with the same or different additives. As illustrated in FIG. 1A, the network of the additives 130 is localized adjacent to the embedding surface 134 and within an embedded region 138 of the host material 132, with a remainder of the host material 132 largely devoid of the additives 130. In the illustrated embodiment, the embedded region 138 is relatively thin (e.g., having a thickness less than or much less than an overall thickness of the host material 132, or having a thickness comparable to a characteristic dimension of the additives 130), and, therefore, can be referred to as "planar" or "planar-like." The transparent conductor 120 can be patterned, such that FIG. 1A can represent a view of a particular portion of the patterned transparent conductor 120, such as a higher sheet conductance portion. FIG. 1A also can represent a view of a lower sheet conductance portion, in which the network of the additives 130 is treated or otherwise processed to result in reduced electrical conductivity.

FIG. 1B is a schematic of surface-embedded additives 154 that form a network that is partially exposed and partially buried into a top, embedding surface 156 of a host material 158, which corresponds to a coating or other secondary material that is disposed on top of a substrate 160. As illustrated in FIG. 1B, the network of the additives 154 can be localized adjacent to the embedding surface 156 and within an embedded region 162 of the host material 158, with a remainder of the host material 158 largely devoid of the additives 154. It is also contemplated that the additives 154 can be distributed throughout a larger volume fraction within the host material 158, such as in the case of a relatively thin coating having a thickness comparable to a characteristic dimension of the additives 154. In the illustrated embodiment, the embedded region 162 is relatively thin, and, therefore, can be referred to as "planar" or "planar-like." The transparent conductor 126 can be patterned, such that FIG. 1B can represent a view of a particular portion of the patterned transparent conductor 126, such as a higher sheet conductance portion. FIG. 1B also can represent a view of a lower sheet conductance portion, in which the network of the additives 154 is treated or otherwise processed to result in reduced electrical conductivity.

One aspect of certain transparent conductors described herein is the provision of a vertical additive concentration gradient or profile within at least a portion of a host material, namely a gradient or profile along a thickness direction of the host material. Bulk incorporation within a substrate or a coating aims to provide a relatively uniform vertical additive concentration profile throughout the substrate or the coating. In contrast, certain transparent conductors described herein allow for variable, controllable vertical additive concentration profile, in accordance with a localization of additives within an embedded region of at least a portion of a host material. For certain implementations, the extent of localization of additives within an embedded region is such that at least a majority (by weight, volume, or number density) of the additives are included within the embedded region, such as at least about 60% (by weight, volume, or number density) of the additives are so included, at least about 70% (by weight, volume, or number density) of the additives are so included, at least about 80% (by weight, volume, or number density) of the additives are so included, at least about 90% (by weight, volume, or number density) of the additives are so included, or at least about 95% (by weight, volume, or number density) of the additives are so included. For example, substantially all of the additives can be localized within the embedded region, such that a remainder of the host material is substantially devoid of the additives. In the case of a patterned transparent conductor, localization of additives can vary according to a horizontal additive concentration gradient or profile in a host material, or can vary across multiple host materials included in the patterned transparent conductor.

Additives can be in the form of nano-sized additives, micron-sized additives, or a combination thereof. To impart electrical conductivity, additives can include an electrically conductive material, a semiconductor, or a combination thereof.

Examples of electrically conductive materials include metals (e.g., silver, copper, and gold in the form of silver nanowires, copper nanowires, and gold nanowires), metal alloys, silver-nickel, silver oxide, silver with a polymeric capping agent, silver-copper, copper-nickel, carbon-based conductors (e.g., in the form of carbon nanotubes, graphene, and buckyballs), conductive ceramics (e.g., conducting oxides and chalcogenides that are optionally doped and transparent, such as metal oxides and chalcogenides that are optionally doped and transparent), electrically conductive polymers (e.g., polyaniline, poly(acetylene), poly(pyrrole), poly(thiophene), poly(p-phenylene sulfide), poly(p-phenylene vinylene) (or PPV), poly(3-alkylthiophene), olyindole, polypyrene, polycarbazole, polyazulene, polyazepine, poly(fluorene), polynaphthalene, melanins, poly(3,4-ethylenedioxythiophene) (or PEDOT), poly(styrenesulfonate) (or PSS), PEDOT-PSS, PEDOT-polymethacrylic acid (or PEDOT-PMA), poly(3-hexylthiophene) (or P3HT), poly(3-octylthiophene) (or P3OT), poly(C-61-butyric acid-methyl ester) (or PCBM), and poly[2-methoxy-5-(2'-ethyl-hexyloxy)-1,4-phenylene vinylene](or MEH-PPV)), and any combination thereof.

Examples of semiconductor materials include semiconducting polymers, Group IVB elements (e.g., carbon (or C), silicon (or Si), and germanium (or Ge)), Group IVB-IVB binary alloys (e.g., silicon carbide (or SiC) and silicon germanium (or SiGe)), Group IIB-VIB binary alloys (e.g., cadmium selenide (or CdSe), cadmium sulfide (or CdS), cadmum telluride (or CdTe), zinc oxide (or ZnO), zinc selenide (or ZnSe), zinc telluride (or ZnTe), and zinc sulfide (or ZnS)), Group IIB-VIB ternary alloys (e.g., cadmium zinc telluride (or CdZnTe), mercury cadmium telluride (or HgCdTe), mercury zinc telluride (or HgZnTe), and mercury zinc selenide (or HgZnSe)), Group IIIB-VB binary alloys (e.g., aluminum antimonide (or AlSb), aluminum arsenide (or AlAs), aluminium nitride (or AlN), aluminium phosphide (or AlP), boron nitride (or BN), boron phosphide (or BP), boron arsenide (or BAs), gallium antimonide (or GaSb), gallium arsenide (or GaAs), gallium nitride (or GaN), gallium phosphide (or GaP), indium antimonide (or InSb), indium arsenide (or InAs), indium nitride (or InN), and indium phosphide (or InP)), Group IIIB-VB ternary alloys (e.g., aluminium gallium arsenide (or AlGaAs or $Al_x Ga_{1-x}As$), indium gallium arsenide (or InGaAs or $In_xGa_{1-x}As$), indium gallium phosphide (or InGaP), aluminium indium arsenide (or AlInAs), aluminium indium antimonide (or AlInSb), gallium arsenide nitride (or GaAsN), gallium arsenide phosphide (or GaAsP), aluminium gallium nitride (or AlGaN), aluminium gallium phosphide (or AlGaP), indium gallium nitride (or InGaN), indium arsenide antimonide (or InAsSb), and indium gallium antimonide (or InGaSb)), Group IIIB-VB quaternary alloys (e.g., aluminium gallium indium phosphide (or AlGaInP), aluminium gallium arsenide phosphide (or AlGaAsP), indium gallium arsenide phosphide (or InGaAsP), aluminium indium arsenide phosphide (or AlInAsP), aluminium gallium arsenide nitride (or AlGaAsN), indium gallium arsenide nitride (or InGaAsN), indium aluminium arsenide nitride (or InAlAsN), and gallium arsenide antimonide nitride (or GaAsSbN)), and Group IIIB-VB quinary alloys (e.g., gallium indium nitride arsenide antimonide (or GaInNAsSb) and gallium indium arsenide antimonide phosphide (or GaInAsSbP)), Group IB-VIIB binary alloys (e.g., cuprous chloride (or CuCl)), Group IVB-VIB binary alloys (e.g., lead selenide (or PbSe), lead sulfide (or PbS), lead telluride (or PbTe), tin sulfide (or SnS), and tin telluride (or SnTe)), Group IVB-VIB ternary alloys (e.g., lead tin telluride (or PbSnTe), thallium tin telluride (or $Tl_2SnTes$), and thallium germanium telluride (or $Tl_2GeTes$)), Group VB-VIB binary alloys (e.g., bismuth telluride (or $Bi_2Te_3$)), Group IIB-VB binary alloys (e.g., cadmium phosphide (or $Cd_3P_2$), cadmium arsenide (or $Cd_3As_2$), cadmium antimonide (or $Cd_3Sb_2$), zinc phosphide (or $Zn_3P_2$), zinc arsenide (or $Zn_3As_2$), and zinc antimonide (or $Zn_3Sb_2$)), and other binary, ternary, quaternary, or higher order alloys of Group IB (or Group 11) elements, Group IIB (or Group 12) elements, Group IIIB (or Group 13) elements, Group IVB (or Group 14) elements, Group VB (or Group 15) elements, Group VIB (or Group 16) elements, and Group VIIB (or Group 17) elements, such as copper indium gallium selenide (or CIGS), as well as any combination thereof.

Additives can include, for example, metallic or semiconducting nanoparticles, nanowires (e.g. silver, copper, or zinc), nanoplates, nanoflakes, nanofibers, nanorods, nanotubes (e.g., carbon nanotubes, multi-walled nanotubes ("MWNTs"), single-walled nanotubes ("SWNTs"), double-walled nanotubes ("DWNTs"), and graphitized or modified nanotubes), fullerenes, buckyballs, graphene, microparticles, microwires, microtubes, core-shell nanoparticles or microparticles, core-multishell nanoparticles or microparticles, core-shell nanowires, and other additives having shapes that are substantially tubular, cubic, spherical, or pyramidal, and characterized as amorphous, crystalline, tetragonal, hexagonal, trigonal, orthorhombic, monoclinic, or triclinic, or any combination thereof.

Examples of core-shell nanoparticles and core-shell nanowires include those with a ferromagnetic core (e.g., iron, cobalt, nickel, manganese, as well as their oxides and alloys formed with one or more of these elements), with a shell formed of a metal, a metal alloy, a metal oxide, carbon, or any combination thereof (e.g., silver, copper, gold, platinum, a conducting oxide or chalcogenide, graphene, and other materials listed as suitable additives herein). A particular example of a core-shell nanowire is one with a silver core and a gold shell (or a platinum shell or another type of shell) surrounding the silver core to reduce or prevent oxidation of the silver core. Another example of a core-shell nanowire is one with a silver core (or a core formed of another metal or other electrically conductive material), with a shell or other coating formed of one or more of the following: (a) conducting polymers, such as poly(3,4-ethylenedioxythiophene) (or PEDOT) and polyaniline (or PANI); (b) conducting oxides, chalcogenides, and ceramics (e.g., deposited by sol-gel, chemical vapor deposition, physical vapor deposition, plasma-enhanced chemical vapor deposition, or chemical bath deposition); (c) insulators in the form of ultra-thin layers, such as polymers, $SiO_2$, $BaTiO$, and $TiO_2$; and (d) thin layers of metals, such as gold, copper, nickel, chromium, molybdenum, and tungsten. Such coated or core-shell form of nanowires can be desirable to impart electrical conductivity, while avoiding or reducing adverse interactions with a host material, such as potential yellowing or other discoloration in the presence of a metal such as silver, oxidation (e.g., a silver/gold core/shell nanowires can have substantially lower oxidation due to the gold shell), and sulfidation (e.g., a silver/platinum core/shell nanowire can have substantially lower sulfidation due to the platinum shell).

For certain implementations, high aspect ratio additives are desirable, such as in the form of nanowires, nanotubes, and combinations thereof. For example, desirable additives include nanotubes formed of carbon or other materials (e.g., MWNTs, SWNTs, graphitized MWNTs, graphitized SWNTs, modified MWNTs, modified SWNTs, and polymer-containing nanotubes), nanowires formed of a metal, a metal oxide, a metal alloy, or other materials (e.g., silver nanowires, copper nanowires, zinc oxide nanowires (undoped or doped by, for example, aluminum, boron, fluorine, and others), tin oxide nanowires (undoped or doped by, for example, fluorine), cadmium tin oxide nanowires, tin-doped indium oxide (or ITO) nanowires, polymer-containing nanowires, and gold nanowires), as well as other materials that are electrically conductive or semiconducting and having a variety of shapes, whether cylindrical, spherical, pyramidal, or otherwise. Additional examples of additives include those formed of activated carbon, graphene, carbon black, ketjen black, and nanoparticles formed of a metal, a metal oxide, a metal alloy, or other materials (e.g., silver nanoparticles, copper nanoparticles, zinc oxide nanoparticles, ITO nanoparticles, and gold nanoparticles).

A host material can have a variety of shapes and sizes, can be transparent, translucent, or opaque, can be flexible, bendable, foldable, stretchable, or rigid, can be electromagnetically opaque or electromagnetically transparent, and can be electrically conductive, semiconducting, or insulating. A host material can be in the form of a layer, a film, or a sheet serving as a substrate, or can be in the form of a coating or multiple coatings disposed on top of a substrate or another material. A host material can be patterned or unpatterned. For example, a host material can be formed as a patterned layer that covers certain areas of an underlying substrate while leaving remaining areas of the substrate exposed. As another example, a first host material can be formed as a first patterned layer overlying certain areas of an underlying substrate, and a second host material (which can differ from the first host material in some manner) can be formed as a second patterned layer that covers remaining areas of the substrate. In such manner, the first host material can provide a first pattern, and the second host material can provide a second pattern that is an "inverse" of the first pattern. Stated in another way, the first host material can provide "positive" portions of a pattern, and the second host material can provide "negative" portions of the pattern.

Examples of suitable host materials include organic materials, inorganic materials, and hybrid organic-inorganic materials. For example, a host material can include a thermoplastic polymer, a thermoset polymer, an elastomer, or a copolymer or other combination thereof, such as selected from polyolefin, polyethylene (or PE), polypropylene (or PP), ethylene vinyl acetate (or EVA), an ionomer, polyvinyl butyral (or PVB), polyacrylate, polyester, polysulphone, polyamide, polyimide, polyurethane, polyvinyl, fluoropolymer, polycarbonate (or PC), polysulfone, polylactic acid, polymer based on allyl diglycol carbonate, nitrile-based polymer, acrylonitrile butadiene styrene (or ABS), cyclic olefin polymer (or COP) (e.g., available under the trademark ARTON® and ZeonorFilm®), cyclic olefin resin, cellulose triacetate (or TAC), phenoxy-based polymer, phenylene ether/oxide, a plastisol, an organosol, a plastarch material, a polyacetal, aromatic polyamide, polyamide-imide, polyarylether, polyetherimide, polyarylsulfone, polybutylene, polyketone, polymethylpentene, polyphenylene, polystyrene, high impact polystyrene, polymer based on styrene maleic anhydride, polymer based on polyallyl diglycol carbonate monomer, bismaleimide-based polymer, polyallyl phthalate, thermoplastic polyurethane, high density polyethylene, low density polyethylene, copolyesters (e.g., available under the trademark Tritan™), polyvinyl chloride (or PVC), acrylic-based polymer, polyethylene terephthalate glycol (or PETG), polyethylene terephthalate (or PET), epoxy, epoxy-containing resin, melamine-based polymer, silicone and other silicon-containing polymers (e.g., polysilanes and polysilsesquioxanes), polymers based on acetates, poly(propylene fumarate), poly(vinylidene fluoride-trifluoroethylene), poly-3-hydroxybutyrate polyesters, polyamide, polycaprolactone, polyglycolic acid (or PGA), polyglycolide, polylactic acid (or PLA), polylactide acid plastics, polyphenylene vinylene, electrically conducting polymer (e.g., polyaniline, poly(acetylene), poly(pyrrole), poly(thiophene), poly(p-phenylene sulfide), poly(p-phenylene vinylene) (or PPV), poly(3-alkylthiophene), olyindole, polypyrene, polycarbazole, polyazulene, polyazepine, poly(fluorene), polynaphthalene, melanins, poly(3,4-ethylenedioxythiophene) (or PEDOT), poly (styrenesulfonate) (or PSS), PEDOT-PSS, PEDOT-polymethacrylic acid (or PEDOT-PMA), poly(3-hexylthiophene) (or P3HT), poly(3-octylthiophene) (or P3OT), poly(C-61-butyric acid-methyl ester) (or PCBM), and poly[2-methoxy-5-(2'-ethyl-hexyloxy)-1,4-phenylene vinylene](or MEH-PPV)), polyolefins, liquid crystal polymers, polyurethane, polyester, copolyester, polymethyl mechacrylate copolymer, tetrafluoroethylene-based polymer, sulfonated tetrafluoroethylene copolymer, ionomers, fluorinated ionomers, polymer corresponding to, or included in, polymer electrolyte membranes, ethanesulfonyl fluoride-based polymer, polymer based on 2-[1-[difluoro-[(trifluoroethenyl)oxy]methyl]-1,2,2,2-tetrafluoroethoxy]-1,1,2,2,-tetrafluoro- (with tetrafluoro ethylene, tetrafluoroethylene-perfluoro-3,6-dioxa-4-methyl-7-octenesulfonic acid copolymer), polypropylene, polybutene, polyisobutene, polyisoprene, polystyrene, polylactic acid, polyglycolide, polyglycolic acid, polycaprolactone, polymer based on vinylidene fluoride, polymer based on trifluoroethylene, poly (vinylidene fluoride-trifluoroethylene), polyphenylene vinylene, polymer based on copper phthalocyanine, graphene, poly(propylene fumarate), cellophane, cuprammonium-based polymer, rayon, and biopolymers (e.g., cellulose acetate (or CA), cellulose acetate butyrate (or CAB), cellulose acetate propionate (or CAP), cellulose propionate (or CP), polymers based on urea, wood, collagen, keratin, elastin, nitrocellulose, plastarch, celluloid, bamboo, bio-derived polyethylene, carbodiimide, cartilage, cellulose nitrate, cellulose, chitin, chitosan, connective tissue, copper phthalocyanine, cotton cellulose, elastin, glycosaminoglycans, linen, hyaluronic acid, nitrocellulose, paper, parchment, plastarch, starch, starch-based plastics, vinylidene fluoride, and viscose), polymers based on cyclic olefins (e.g., cyclic olefin polymers and copolymers), or any monomer, copolymer, blend, or other combination thereof. Additional examples of suitable host materials include ceramics, such as dielectric or non-conductive ceramics (e.g., $SiO_2$-based glass; $SiO_x$-based glass; $TiO_x$-based glass; other titanium, cerium, magnesium analogues of $SiO_x$-based glass; spin-on glass; glass formed from sol-gel processing, silane precursor, siloxane precursor, silicate precursor, tetraethyl orthosilicate, silane, siloxane, phosphosilicates, spin-on glass, silicates, sodium silicate, potassium silicate, a glass precursor, a ceramic precursor, silsesquioxane, metallasilsesquioxanes, polyhedral oligomeric silsesquioxanes, halosilane, sol-gel, silicon-oxygen hydrides, silicones, stannoxanes, silathianes, silazanes, polysilazanes, metallocene, titanocene dichloride, vanadocene dichloride; and other types of glasses), conductive ceramics (e.g., conducting oxides and chalcogenides that are optionally doped and transparent, such as metal oxides and chalcogenides that are optionally doped and transparent), and any combination thereof. Additional examples of suitable host materials include electrically conductive materials and semiconductors listed above as suitable materials for additives. The host material can be, for example, n-doped, p-doped, or un-doped. Further examples of suitable host materials include polymer-ceramic composite, polymer-wood composite, polymer-carbon composite (e.g., formed of ketjen black, activated carbon, carbon black, graphene, and other forms of carbon), polymer-metal composite, polymer-oxide, or any combination thereof.

In some embodiments, confining additives to a "planar" or "planar-like" embedded region within at least a portion of a host material can lead to decreased topological disorder of the additives and increased occurrence of junction formation between the additives for improved electrical conductivity. Although an embedded region is sometimes referred as "planar," it will be understood that such embedded region is typically not strictly two-dimensional, as the additives themselves are typically three-dimensional. Rather, "planar" can be used in a relative sense, with a relatively thin, slab-like (or layered) local concentration of the additives within a certain region of the host material, and with the additives largely absent from a remainder of the host material. It is noted that the local concentration of additives can be non-planar in the sense that it can be non-flat. For example, the additives can be concentrated in a thin region of the host material that is characterized by curvature with respect to one or more axes, with the additives largely absent from a remainder of the host material. It will also be understood that an embedded region can be referred as "planar," even though such an embedded region can have a thickness that is greater than (e.g., several times greater than) a characteristic dimension of additives. In general, an embedded region can be located adjacent to a side of a host material, adjacent to a middle of the host material, or adjacent to any arbitrary location along a thickness direction of the host material, and multiple embedded regions can be located adjacent to one another or spaced apart from one another within the host material. Each embedded region can include one or more types of additives, and embedded regions (which are located in the same host material) can include different types of additives. In the case of a patterned transparent conductor, multiple embedded regions can be located across a host material according to a pattern to define a set of higher sheet conductance portions, a set of lower sheet conductance portions, or both. In some embodiments, by confining electrically conductive additives to a set of "planar" embedded regions of a host material (as opposed to randomly throughout the host material), a higher electrical conductivity can be achieved for a given amount of the additives per unit of area. Any additives not confined to an embedded region represent an excess amount of additives that can be omitted.

In some embodiments, transparent conductors can have additives embedded or otherwise incorporated into at least a portion of a host material from about 10% (or less, such as from about 0.1%) by volume into an embedding surface and up to about 100% by volume into the embedding surface, and can have the additives exposed at varying surface area coverage, such as from about 0.1% surface area coverage (or less, such as 0% when an embedded region is entirely below the surface, or when the additives are completely encapsulated by the host material) up to about 99.9% (or more) surface area coverage. For example, in terms of a volume of an additive embedded below the embedding surface relative to a total volume of the additive, at least one additive can have an embedded volume percentage (or a population of the additives can have an average embedded volume percentage) in the range of about 0% to about 100%, such as from 10% to about 50%, or from about 50% to about 100%.

Transparent conductors of some embodiments can have an embedded region with a thickness greater than a characteristic dimension of additives used (e.g., for nanowires, greater than a diameter of an individual nanowire or an average diameter across the nanowires), with the additives largely confined to the embedded region with the thickness less than an overall thickness of the host material. For example, the thickness of the embedded region can be no greater than about 95% of the overall thickness of the host material, such as no greater than about 80%, no greater than about 75%, no greater than about 50%, no greater than about 40%, no greater than about 30%, no greater than about 20%, no greater than about 10%, or no greater than about 5% of the overall thickness.

In some embodiments, additives can be embedded or otherwise incorporated into at least a portion of a host material by varying degrees relative to a characteristic dimension of the additives used (e.g., for nanowires, relative to a diameter of an individual nanowire or an average diameter across the nanowires). For example, in terms of a distance of a furthest embedded point on an additive below an embedding surface, at least one additive can be embedded to an extent of more than about 100% of the characteristic dimension, or can be embedded to an extent of not more than about 100% of the characteristic dimension, such as at least about 5% or about 10% and up to about 80%, up to about 50%, or up to about 25% of the characteristic dimension. As another example, a population of the additives, on average, can be embedded to an extent of more than about 100% of the characteristic dimension, or can be embedded to an extent of not more than about 100% of the characteristic dimension, such as at least about 5% or about 10% and up to about 80%, up to about 50%, or up to about 25% of the characteristic dimension. As will be understood, the extent to which additives are embedded into a host material can impact a roughness of an embedding surface, such as when measured as an extent of variation of heights across the embedding surface (e.g., a standard deviation relative to an average height). In some embodiments, a roughness of the surface-embedded structure is less than a characteristic dimension of partially embedded additives.

In some embodiments, at least one additive can extend out from an embedding surface of a host material from about 0.1 nm to about 1 cm, such as from about 1 nm to about 50 nm, from about 50 nm to 100 nm, or from about 100 nm to about 100 microns. In other embodiments, a population of additives, on average, can extend out from an embedding surface of a host material from about 0.1 nm to about 1 cm, such as from about 1 nm to about 50 nm, from about 50 nm to 100 nm, or from about 100 nm to about 100 microns. In other embodiments, substantially all of a surface area of a host material (e.g., an area of an embedding surface) is occupied by additives. In other embodiments, up to about 100% or up to about 75% of the surface area is occupied by additives, such as up to about 50% of the surface area, up to about 25% of the surface area, up to about 10%, up to about 5%, up to about than 3% of the surface area, or up to about 1% of the surface area is occupied by additives. Additives need not extend out from an embedding surface of a host material, and can be localized entirely below the embedding surface The degree of embedding and surface coverage of additives for a surface-embedded structure can be selected in accordance with a particular application.

In some embodiments, if nanowires are used as additives, characteristics that can influence electrical conductivity and other desirable characteristics include, for example, nanowire concentration, density, or loading level; surface area coverage; nanowire length; nanowire diameter; uniformity of the nanowires; material type; stability of the nanowire formulations; wire-wire junction resistance; host-material resistance; nanowire conductivity; crystallinity of the nanowire; and purity. There can be a preference for nanowires with a low junction resistance and a low bulk resistance in some embodiments. For attaining higher electrical conductivity while maintaining high transparency, thinner diameter, longer length nanowires can be used (e.g., with relatively large aspect ratios to facilitate nanowire junction formation and in the range of about 50 to about 2,000, such as from about 50 to about 1,000, or from about 100 to about 800), and metallic nanowires, such as silver, copper, and gold nanowires, can be used. In other embodiments, if the nanowires are thin, their bulk conductivity can decrease because of the small cross-sectional area of the wires; therefore, in some embodiments, thicker diameter wires can be selected. Using nanowires as additives to form nanowire networks, such as silver nanowire networks, can be desirable for some embodiments. Other metallic nanowires, non-metallic nanowires, such as ITO and other oxide and chalcogenide nanowires, also can be used. Additives composed of semiconductors with bandgaps outside the visible optical spectrum energies (e.g., <1.8 eV and >3.1 eV) or approximately near this range, can be used to create transparent conductors with high optical transparency in that visible light will typically not be absorbed by the bandgap energies or by interfacial traps therein. Various dopants can be used to tune the conductivity of these aforementioned semiconductors, taking into account the shifted Fermi levels and bandgap edges via the Moss-Burstein effect. The nanowires can be largely uniform or monodisperse in terms of dimensions (e.g., diameter and length), such as the same within about 5% (e.g., a standard deviation relative to an average diameter or length), the same within about 10%, the same within about 15%, or the same within about 20%. Purity can be, for example, at least about 50%, at least about 75%, at least about 85%, at least about 90%, at least about 95%, at least about 99%, at least about 99.9%, or at least about 99.99%. Surface area coverage of nanowires can be, for example, up to about 100%, less than about 100%, up to about 75%, up to about 50%, up to about 25%, up to about 10%, up to about 5%, up to about 3%, or up to about 1%. Silver nanowires can be particularly desirable for certain embodiments, since silver oxide, which can form (or can be formed) on surfaces of the nanowires as a result of oxidation, is electrically conductive. Also, core-shell nanowires (e.g., silver core with gold or platinum shell) also can decrease junction resistance. Nanowires can be solution synthesized via a number of processes, such as a solution-phase synthesis (e.g., the polyol process), a vapor-liquid-solid ("VLS") synthesis, an electrospinning process (e.g., using a polyvinyl-based polymer and silver nitrate, then annealing in forming gas, and baking), a suspension process (e.g., chemical etching or nano-melt retraction), and so forth.

In some embodiments, if nanotubes are used as additives (whether formed of carbon, a metal, a metal alloy, a metal oxide, or another material), characteristics that can influence electrical conductivity and other desirable characteristics include, for example, nanotube concentration, density, or loading level; surface area coverage; nanotube length; nanotube inner diameter; nanotube outer diameter; whether single-walled or multi-walled nanotubes are used; uniformity of the nanotubes; material type; and purity. There can be a preference for nanotubes with a low junction resistance in some embodiments. For reduced scattering in the context of certain devices such as displays, nanotubes, such as carbon nanotubes, can be used to form nanotube networks. Alternatively, or in combination, smaller diameter nanowires can be used to achieve a similar reduction in scattering relative to the use of nanotubes. Nanotubes can be largely uniform or monodisperse in terms of dimensions (e.g., outer diameter, inner diameter, and length), such as the same within about 5% (e.g., a standard deviation relative to an average outer/inner diameter or length), the same within about 10%, the same within about 15%, or the same within about 20%. Purity can be, for example, at least about 50%, at least about 75%, at least about 85%, at least about 90%, at least about 95%, at least about 99%, at least about 99.9%, or at least about 99.99%. Surface area coverage of nanotubes can be, for example, up to about 100%, less than about 100%, up to about 75%, up to about 50%, up to about 25%, up to about 10%, up to about 5%, up to about 3%, or up to about 1%.

In some embodiments, a combination of different types of high aspect ratio electrically conductive or semiconducting additives (e.g., conductive nanowires, nanotubes, or both) can be embedded into at least a portion of a host material, resulting in a transparent yet conductive structure. Specifically, the combination can include a first population of additives having a first set of morphological characteristics (e.g., length (average, median, or mode), diameter (average, median, or mode), aspect ratio (average, median, or mode), or a combination thereof) and at least a second population of additives having a second set of morphological characteristics that differ in some manner from the first set of morphological characteristics. Each population of additives can be largely uniform or monodisperse in terms of its respective set of morphological characteristics, such as the same within about 5% (e.g., a standard deviation relative to an average diameter, length, or aspect ratio), the same within about 10%, the same within about 15%, or the same within about 20%. The resulting combination of additives can be bimodal or multimodal. For example, longer and larger diameter nanowires can promote lower percolation thresholds, thereby achieving higher transparency with lower conductive material usage. On the other hand, shorter and smaller diameter nanowires can promote lower haze and higher transmission of light through a percolating network. However, smaller diameter nanowires may have higher Ohmic resistance compared to larger diameter nanowires of the same material. The use of a combination of longer and larger diameter nanowires and shorter and smaller diameter nanowires provides a practical tradeoff between various factors, including higher transparency (e.g., lower percolation threshold from the longer nanowires), a lower haze (e.g., lower scattering from the smaller diameter nanowires), and higher conductivity (e.g., lower resistance from the larger diameter nanowires) relative to the use of either population of nanowires alone. By way of analogy and not limitation, the longer and larger diameter nanowires can act as larger current arteries, while the shorter and smaller diameter nanowires can act as smaller current capillaries.

It should be understood that the number of additive types can be varied for a given device or application. For example, any, or a combination, of silver nanowires, copper nanowires, and gold nanowires can be used along with ITO nanoparticles to yield high optical transparency and high electrical conductivity. Similar combinations include, for example, any, or a combination, of silver nanowires, copper nanowires, and gold nanowires along with any one or more of ITO nanowires, ZnO nanowires, ZnO nanoparticles, silver nanoparticles, gold nanoparticles, SWNTs, MWNTs, fullerene-based materials (e.g., carbon nanotubes and buckyballs), and ITO nanoparticles. The use of ITO nanoparticles, nanowires, or layers of conductive oxides or ceramics (e.g., ITO, aluminum-doped zinc oxide, or other types of doped or undoped zinc oxides) can provide additional functionality, such as by serving as a buffer layer to adjust a work function in the context of a transparent conductor for use in a solar device, a thin-film solar device, an OLED display type device, an OLED lighting type device, or similar device to provide a conductive path for the flow of an electric current, in place of, or in combination with, a conductive path provided by other additives.

In some embodiments, additives are initially provided as discrete objects. Upon embedding or incorporation into at least a portion of a host material, the host material can envelop or surround the additives such that the additives become aligned or otherwise arranged within a "planar" or "planar-like" embedded region. In some embodiments for the case of additives such as nanowires, nanotubes, microwires, microtubes, or other additives with an aspect ratio greater than 1, the additives become aligned such that their lengthwise or longitudinal axes are largely confined to within a range of angles relative to a horizontal plane, or another plane corresponding, or parallel, to a plane of an embedding surface. For example, the additives can be elongated and can be aligned such that their lengthwise or longest-dimension axes, on average, are confined to a range from about −45° to about +45° relative to the horizontal plane, such as from about −35° to about +35°, from about −25° to about +25°, from about −15° to about +15°, from about −5° to about +5°, from about −1° to about +1°, from about −0.1° to about +0.1°, or from about −0.01° to about +0.01°. Stated in another way, lengthwise axes of the additives can be confined such that $\theta < SIN^{-1}(t/L)$, where L=length of an additive, t=thickness of the host material, and θ is an angle relative to a horizontal plane corresponding to the embedding surface. In this example, little or substantially none of the additives can have their lengthwise or longitudinal axes oriented outside of the range from about −45° to about +45° relative to the horizontal plane. Within the embedded region, neighboring additives can contact one another in some embodiments. Such contact can be improved using longer aspect ratio additives, while maintaining a relatively low surface area coverage for desired transparency. In some embodiments, contact between additives, such as nanowires, nanoparticles, microwires, and microparticles, can be increased through pressure (e.g., a calendar press), sintering, or annealing, such as low temperature sintering at temperatures of about 50° C., about 125° C., about 150° C., about 175° C., or about 200° C., or in the range of about 50° C. to about 125° C., about 100° C. to about 125° C., about 125° C. to about 150° C., about 150° C. to about 175° C., or about 175° C. to about 200° C., flash sintering, sintering through the use of redox reactions to cause deposits onto additives to grow and fuse the additives together, or any combination thereof. For example, in the case of silver or gold additives, silver ions or gold ions can be deposited onto the additives to cause the additives to fuse with neighboring additives. High temperature sintering at temperatures at or above about 200° C. is also contemplated. It is also contemplated that little or no contact is needed for certain applications and devices, where charge tunneling or hopping provides sufficient electrical conductivity in the absence of actual contact, or where a host material or a coating on top of the host material may itself be electrically conductive or semiconducting. Such applications and devices can operate with a sheet resistance up to about $10^6$ Ω/sq or more. Individual additives can be separated by electrical and quantum barriers for electron transfer.

Transparent conductors described herein can be quite durable. In some embodiments, such durability is in combination with rigidity and robustness, and, in other embodiments, such durability is in combination with the ability to be flexed, rolled, bent, and folded, amongst other physical actions, with, for example, no greater than about 50%, no greater than about 40%, no greater than about 30%, no greater than about 20%, no greater than about 15%, no greater than about 10%, no greater than about 5%, no greater than about 3%, or substantially no decrease in transmittance, and no greater than about 50%, no greater than about 40%, no greater than about 30%, no greater than about 20%, no greater than about 15%, no greater than about 10%, no greater than about 5%, no greater than about 3%, or substantially no increase in resistance (e.g., surface or sheet resistance). In some embodiments, the transparent conductors can survive a standard test for adhesion of coatings (e.g., a Scotch Tape Test) used in the coatings industry and yield substantially no decrease, or no greater than about 5% decrease, no greater than about 10% decrease, no greater than about 15% decrease, no greater than about 20% decrease, no greater than about 30% decrease, no greater than about 40% decrease, or no greater than about 50% decrease in observed transmittance, and yield substantially no increase, or no greater than about 5% increase, no greater than about 10% increase, no greater than about 15% increase, no greater than about 20% increase, no greater than about 30% increase, no greater than about 40% increase, or no greater than about 50% increase in observed resistance (e.g., sheet resistance). In some embodiments, the transparent conductors can also survive rubbing, scratching, flexing, physical abrasion, thermal cycling (e.g., exposure to temperatures up to (or at least) about 600° C., up to (or at least) about 550° C., up to (or at least) about 500° C., up to (or at least) about 450° C., or up to (or at least) about 400° C.), chemical exposure, accelerated life test ("ALT"), and humidity cycling with substantially no decrease, no greater than about 50% decrease, no greater than about 40% decrease, no greater than about 30% decrease, no greater than about 20% decrease, no greater than about 15% decrease, no greater than about 10% decrease, no greater than about 5% decrease, or no greater than about 3% decrease in observed transmittance, and with substantially no increase, no greater than about 50% increase, no greater than about 40% increase, no greater than about 30% increase, no greater than about 20% increase, no greater than about 15% increase, no greater than about 10% increase, no greater than about 5% increase, or no greater than about 3% increase in observed resistance (e.g., sheet resistance). This enhanced durability can result from embedding or incorporation of additives within at least a portion of a host material, such that the additives are physically or chemically held inside the host material by molecular chains or other components of the host material. In some cases, flexing or pressing can be observed to increase conductivity.

Various standard tests can be used to measure durability, such as in terms of abrasion resistance. One such test, among others, is ASTM-F735-06 Standard Test Method for Abrasion Resistance of Transparent Plastics and Coatings Using the Oscillating Sand Method. Another test that can be used is ASTM D1044-08 Standard Test Method for Resistance of Transparent Plastics to Surface Abrasion. Yet another possible standard test is ASTM D4060-10 Standard Test Method for Abrasion Resistance of Organic Coatings by the Taber Abraser. Additional standard tests that can be used include tests for hardness, such as ASTM D3363-05 (2011)e1 Standard Test Method for Film Hardness by Pencil Test, ASTM E384, ASTM E10, ASTM B277-95 Standard Test Method for Hardness of Electrical Contact Materials, and ASTM D2583-06 Standard Test Method for Indentation Hardness of Rigid Plastics by Means of a Barcol Impressor. Further details on these tests are available from ASTM International of West Conshohocken, Pa. Other standardized protocols include the ISO 15184, JIS K-5600, ECCA-T4-1, BS 3900-E19, SNV 37113, SIS 184187, NCN 5350, and MIL C 27 227.

Another set of tests can be used to measure and evaluate reliability under ALT conditions. Some industry standards include dry heat (e.g., 85° C./dry), moist heat (e.g., 60° C./90% RH, or 85° C./85° RH), dry cold (e.g., −30° C./dry), thermal shock (e.g., 80° C.← → 40° C. cycle for 30 minutes each). These ALT conditions can be carried out over hours, days, weeks, or months with samples exposed to those conditions for extended periods of time or number of cycles. In certain embodiments of the transparent conductors disclosed herein, the change in sheet resistance, transparency, and/or haze are controlled within +/−50%, in other cases +/−25%, in other cases +/−10%, and in other cases +/−5%, or lower.

Another aspect of some embodiments of transparent conductors is that an electrical percolation threshold can be attained using a lesser amount of additives. Stated in another way, electrical conductivity can be attained using less additive material, thereby saving additive material and associated cost and increasing transparency. As will be understood, an electrical percolation threshold is typically reached when a sufficient amount of additives is present to allow percolation of electrical charge from one additive to another additive, thereby providing a conductive path across at least portion of a network of additives. In some embodiments, an electrical percolation threshold can be observed via a change in slope of a logarithmic plot of resistance versus loading level of additives. A lesser amount of additive material can be used since additives are largely confined to a "planar" or "planar-like" embedded region in some embodiments, thereby greatly reducing topological disorder and resulting in a higher probability of inter-additive (e.g., inter-nanowire or inter-nanotube) junction formation. In other words, because the additives are confined to a thin embedded region in at least a portion of the host material, as opposed to dispersed throughout the thickness of the host material, the probability that the additives will interconnect and form junctions can be greatly increased. A lesser amount of additive material can also be used in embodiments where a host material is itself electrically conductive or semiconducting. In some embodiments, an electrical percolation threshold can be attained at a loading level of additives in the range of about 0.001 µg/cm² to about 100 µg/cm² (or higher), such as from about 0.01 µg/cm² to about 100 µg/cm², from about 10 µg/cm² to about 100 µg/cm², from 0.01 µg/cm² to about 0.4 µg/cm², from about 0.5 µg/cm² to about 5 µg/cm², or from about 0.8 µg/cm² to about 3 µg/cm² for certain additives such as silver nanowires. These loading levels can be varied according to dimensions, material type, spatial dispersion, and other characteristics of additives.

In addition, a lesser amount of additives can be used (e.g., as evidenced by a thickness of an embedded region) to achieve a network-to-bulk transition, which is a parameter representing a transition of a thin layer from exhibiting effective material properties of a sparse two-dimensional conducting network to one exhibiting effective properties of a three-dimensional conducting bulk material. By confining additives to a "planar" or "planar-like" embedded region, a lower sheet resistance can be attained at specific levels of transmittance. Furthermore, in some embodiments, carrier recombination can be reduced due to the reduction or elimination of interfacial defects associated with a separate coating or other secondary material into which additives are mixed.

To expound further on these advantages, a network of additives can be characterized by a topological disorder and by contact resistance. Topologically, above a critical density of additives and above a critical density of additive-additive (e.g., nanowire-nanowire, nanotube-nanotube, or nanotube-nanowire) junctions, electrical current can readily flow from a source to a drain. A "planar" or "planar-like" network of additives can reach a network-to-bulk transition with a reduced thickness, represented in terms of a characteristic dimension of the additives (e.g., for nanowires, relative to a diameter of an individual nanowire or an average diameter across the nanowires). For example, an embedded region can have a thickness up to about 10 times (or more) the characteristic dimension, such as up to about 9 times, up to about 8 times, up to about 7 times, up to about 6 times, up to about 5 times, up to about 4 times, up to about 3 times, or up to about 2 times the characteristic dimension, and down to about 0.05, about 0.1, about 0.2, about 0.3, about 0.4, or about 0.5 times the characteristic dimension, allowing devices to be thinner while increasing optical transparency and electrical conductivity. Accordingly, the transparent conductors described herein provide, in some embodiments, an embedded region with a thickness up to about n×d (in terms of nm) within which are localized additives having a characteristic dimension of d (in terms of nm), where n=2, 3, 4, 5, or higher.

Another advantage of some embodiments of transparent conductors is that, for a given level of electrical conductivity, the transparent conductors can yield higher transparency. This is because less additive material can be used to attain that level of electrical conductivity, in view of the efficient formation of additive-additive junctions for a given loading level of additives, in view of the use of a host material that is itself electrically conductive or semiconducting, or both. As will be understood, a transmittance of a thin conducting material (e.g., in the form of a film) can be expressed as a function of its sheet resistance $R_\square$ and an optical wavelength, as given by the following approximate relation for a thin film:

$$T(\lambda) = \left(1 + \frac{188.5}{R_\square} \frac{\sigma_{Op}(\lambda)}{\sigma_{DC}}\right)^{-2}$$

where $\sigma_{Op}$ and $\sigma_{DC}$ are the optical and DC conductivities of the material, respectively. In some embodiments, silver nanowire networks surface-embedded or otherwise incorporated into flexible transparent substrates can have sheet resistances as low as about 3.2 Ω/sq or about 0.2 Ω/sq, or even lower. In other embodiments, transparent conductors can reach up to about 85% (or more) for human vision or photometric-weighted transmittance T (e.g., from about 350 nm to about 700 nm) and sheet resistances as low as about 20 Ω/sq (or below). In still other embodiments, a sheet resistance of ≤10 Ω/sq at ≥85% (e.g., at least about 85%, at least about 90%, or at least about 95%, and up to about 97%, about 98%, or more) human vision transmittance can be obtained with the transparent conductors. It will be understood that transmittance can be measured relative to other ranges of optical wavelength, such as transmittance at a given wavelength or range of wavelengths in the visible range, such as about 550 nm, a solar-flux weighted transmittance, transmittance at a given wavelength or range of wavelengths in the infrared range, and transmittance at a given wavelength or range of wavelengths in the ultraviolet range. It will also be understood that transmittance can be measured relative to a substrate (if present) (e.g., the transmittance value would not include the transmittance loss from an underlying substrate that is below a host material that includes additives), or can be measured relative to air (e.g., the transmittance value would include the transmittance loss from an underlying substrate). Unless otherwise specified herein, transmittance values are designated relative to a substrate (if present), although similar transmittance values (albeit with somewhat higher values) are also contemplated when measured relative to air. Also, it will also be understood that transmittance or another optical characteristic can be measured relative to an overcoat, such as an optically clear adhesive (if present) (e.g., the transmittance value would not include the transmittance loss from an overcoat overlying a host material that includes additives), or can be measured relative to air (e.g., the transmittance value would include the transmittance loss from an overlying overcoat). Unless otherwise specified herein, values of optical characteristics are designated relative to an overlying overcoat (if present), although similar values are also contemplated when measured relative to air. For some embodiments, a DC-to-optical conductivity ratio of transparent conductors can be at least about 100, at least about 115, at least about 300, at least about 400, or at least about 500, and up to about 600, up to about 800, or more.

Certain transparent conductors can include additives of nanowires (e.g., silver nanowires) of average diameter in the range of about 1 nm to about 100 nm, about 10 nm to about 80 nm, about 20 nm to about 80 nm, or about 25 nm to about 45 nm, and an average length in the range of about 50 nm to about 1,000 µm, about 50 nm to about 500 µm, about 100 nm to about 100 µm, about 500 nm to 50 µm, about 5 µm to about 50 µm, about µm to about 150 µm, about 5 µm to about 35 µm, about 25 µm to about 80 µm, about 25 µm to about 50 µm, or about 25 µm to about 40 µm. A top of an embedded region can be located about 0 nm to about 100 µm below a top, embedding surface of a host material, such as about 0.0001 nm to about 100 µm below the embedding surface, about 0.01 nm to about 100 µm below the embedding surface, about 0.1 nm to 100 µm below the embedding surface, about 0.1 nm to about 5 µm below the embedding surface, about 0.1 nm to about 3 µm below the embedding surface, about 0.1 nm to about 1 µm below the embedding surface, or about 0.1 nm to about 500 nm below the embedding surface. Nanowires embedded or incorporated into a host material can protrude from an embedding surface from about 0% by volume and up to about 90%, up to about 95%, or up to about 99% by volume. For example, in terms of a volume of a nanowire exposed above the embedding surface relative to a total volume of the nanowire, at least one nanowire can have an exposed volume percentage (or a population of the nanowires can have an average exposed volume percentage) of up to about 1%, up to about 5%, up to about 20%, up to about 50%, or up to about 75% or about 95%. At a transmittance of about 85% or greater (e.g., human vision transmittance or one measured at another range of optical wavelengths), a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or about 0.1 Ω/sq, or less. At a transmittance of about 90% or greater, a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or less.

Certain transparent conductors can include additives of nanotubes (e.g., either, or both, MWCNT and SWCNT) of average outer diameter in the range of about 1 nm to about 100 nm, about 1 nm to about 10 nm, about 10 nm to about 50 nm, about 10 nm to about 80 nm, about 20 nm to about 80 nm, or about 40 nm to about 60 nm, and an average length in the range of about 50 nm to about 100 µm, about 100 nm to about 100 µm, about 500 nm to 50 µm, about 5 µm to about 50 µm, about 5 µm to about 35 µm, about 25 µm to about 80 µm, about 25 µm to about 50 µm, or about 25 µm to about 40 µm. A top of an embedded region can be located about 0 nm to about 100 µm below a top, embedding surface of a host material, such as about 0.01 nm to about 100 µm below the embedding surface, about 0.1 nm to 100 µm below the embedding surface, about 0.1 nm to about 5 µm below the embedding surface, about 0.1 nm to about 3 µm below the embedding surface, about 0.1 nm to about 1 µm below the embedding surface, or about 0.1 nm to about 500 nm below the embedding surface. Nanotubes embedded or incorporated into a host material can protrude from an embedding surface from about 0% by volume and up to about 90%, up to about 95%, or up to about 99% by volume. For example, in terms of a volume of a nanotube exposed above the embedding surface relative to a total volume of the nanotube (e.g., as defined relative to an outer diameter of a nanotube), at least one nanotube can have an exposed volume percentage (or a population of the nanotubes can have an average exposed volume percentage) of up to about 1%, up to about 5%, up to about 20%, up to about 50%, or up to about 75% or about 95%. At a transmittance of about 85% or greater (e.g., human vision transmittance or one measured at another range of optical wavelengths), a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or less. At a transmittance of about 90% or greater, a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or about 0.1 Ω/sq, or less.

In the case of a patterned transparent conductor, multiple embedded regions can be located across a single host material or across multiple host materials according to a pattern. The characteristics and ranges set forth herein regarding the nature and extent of surface embedding generally can apply across the multiple embedded regions, although the particular nature and extent of surface embedding can vary across the embedded regions to create a spatially varying contrast in electrical conductivity.

Surface Embedding Process

The transparent conductors described herein can be formed according to manufacturing methods that can be carried out in a highly-scalable, rapid, and low-cost fashion, in which additives are durably incorporated into a wide variety of host materials. Some embodiments of the manufacturing methods can be generally classified into two categories: (1) surface embedding additives into a dry composition to yield a host material with the surface-embedded additives; and (2) surface embedding additives into a wet composition to yield a host material with the surface-embedded additives. It will be understood that such classification is for ease of presentation, and that "dry" and "wet" can be viewed as relative terms (e.g., with varying degrees of dryness or wetness), and that the manufacturing methods can apply to a continuum spanned between fully "dry" and fully "wet." Accordingly, processing conditions and materials described with respect to one category (e.g., dry composition) can also apply with respect to another category (e.g., wet composition), and vice versa. It will also be understood that hybrids or combinations of the two categories are contemplated, such as where a wet composition is dried or otherwise converted into a dry composition, followed by surface embedding of additives into the dry composition to yield a host material with the surface-embedded additives. It will further be understood that, although "dry" and "wet" sometimes may refer to a level of water content or a level of solvent content, "dry" and "wet" also may refer to another characteristic of a composition in other instances, such as a degree of cross-linking or polymerization.

Figure 2A:
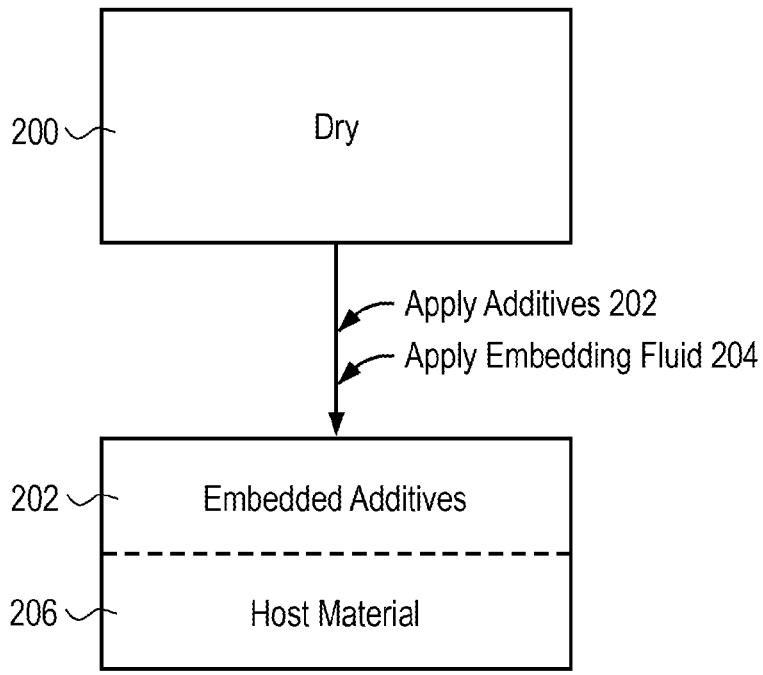
FIG. 2A through FIG. 2C illustrate manufacturing methods to form transparent conductors, according to embodiments of the invention.
Figure 2B:
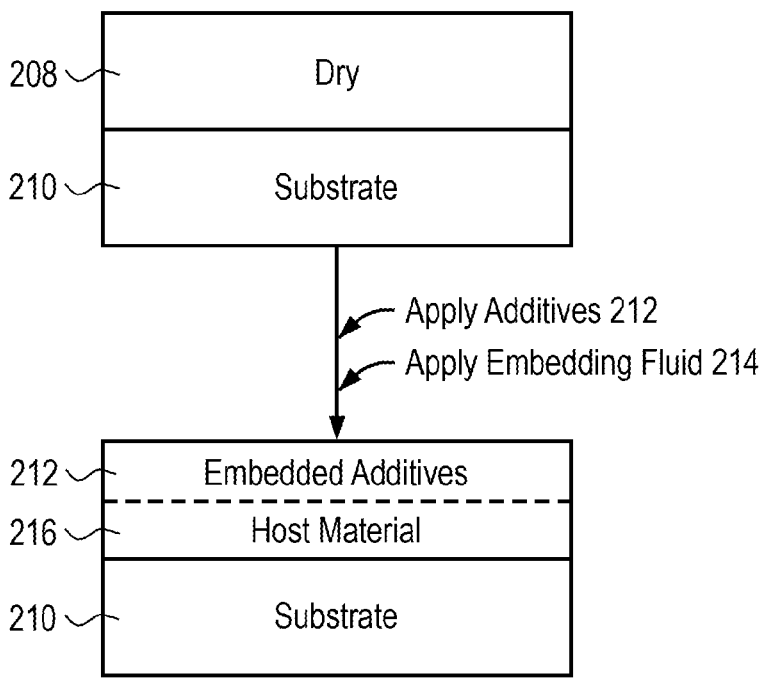

Attention first turns to FIG. 2A and FIG. 2B, which illustrates examples of manufacturing methods for surface embedding additives into dry compositions, according to embodiments of the invention.

By way of overview, the illustrated embodiments involve the application of an embedding fluid to allow additives to be embedded into a dry composition. In general, the embedding fluid serves to reversibly alter the state of the dry composition, such as by dissolving, reacting, softening, solvating, swelling, or any combination thereof, thereby facilitating embedding of the additives into the dry composition. For example, the embedding fluid can be specially formulated to act as an effective solvent for a polymer, while possibly also being modified with stabilizers (e.g., dispersants) to help suspend the additives in the embedding fluid. The embedding fluid also can be specially formulated to reduce or eliminate problems with solvent/polymer interaction, such as hazing, crazing, and blushing. The embedding fluid can include a solvent or a solvent mixture that is optimized to be low-cost, Volatile Organic Compound ("VOC")-free, VOC-exempt or low-VOC, Hazardous Air Pollutant ("HAP")-free, non-ozone depleting substances ("non-ODS"), low volatility or non-volatile, and low hazard or non-hazardous. As another example, the dry composition can include a ceramic or a ceramic precursor in the form of a gel or a semisolid, and application of the embedding fluid can cause the gel to be swollen by filling pores with the fluid, by elongation of partially uncondensed oligomeric or polymeric chains, or both. As a further example, the dry composition can include a ceramic or a ceramic precursor in the form of an ionic polymer, such as sodium silicate or another alkali metal silicate, and application of the embedding fluid can dissolve at least a portion of the ionic polymer to allow embedding of the additives. The embedding of the additives is then followed by hardening or other change in state of the softened or swelled composition, resulting in a host material having the additives embedded therein. For example, the softened or swelled composition can be hardened by exposure to ambient conditions, or by cooling the softened or swelled composition. In other embodiments, the softened or swelled composition is hardened by evaporating or otherwise removing at least a portion of the embedding fluid (or other liquid or liquid phase that is present), applying airflow, applying a vacuum, or any combination thereof. In the case of a ceramic precursor, curing can be carried out after embedding such that the ceramic precursor is converted into a glass or another ceramic. Curing can be omitted, depending on the particular application. Depending on the particular ceramic precursor (e.g., a silane), more or less heat can be involved to achieve various degrees of curing or conversion into a fully reacted or fully formed glass.

Referring to FIG. 2A, a dry composition 200 can be provided in the form of a sheet, a film, or other suitable form. The dry composition 200 can correspond to a host material and, in particular, can include any material previously listed as suitable host materials. It is also contemplated that the dry composition 200 can correspond to a host material precursor, which can be converted into the host material by suitable processing, such as drying, curing, cross-linking, polymerizing, or any combination thereof. In some embodiments, the dry composition 200 can include a material with a solid phase as well as a liquid phase, or can include a material that is at least partially solid or has properties resembling those of a solid, such as a semisolid, a gel, and the like. Next, and referring to FIG. 2A, additives 202 and an embedding fluid 204 are applied to the dry composition 200. The additives 202 can be in solution or otherwise dispersed in the embedding fluid 204, and can be simultaneously applied to the dry composition 200 via one-step embedding. Alternatively, the additives 202 can be separately applied to the dry composition 200 before, during, or after the embedding fluid 204 treats the dry composition 200. Embedding that involves separate application of the additives 202 and the embedding fluid 204 can be referred as two-step embedding. Subsequently, the resulting host material 206 has at least some of the additives 202 partially or fully embedded into a surface of the host material 206. Optionally, suitable processing can be carried out to convert the softened or swelled composition 200 into the host material 206. During device assembly, the host material 206 with the embedded additives 202 can be laminated or otherwise connected to adjacent device layers, or can serve as a substrate onto which adjacent device layers are formed, laminated, or otherwise applied.

In the case of a patterned transparent conductor, surface embedding according to FIG. 2A can be carried out generally uniformly across the dry composition 200, followed by spatially selective or varying treatment to yield higher conductance and lower conductance portions across the host material 206. Alternatively, or in conjunction, surface embedding according to FIG. 2A can be carried out in a spatially selective or varying manner, such as by applying the additives 202 in a spatially selective or varying manner, by applying the embedding fluid 204 in a spatially selective or varying manner, or both.

FIG. 2B is a process flow similar to FIG. 2A, but with a dry composition 208 provided in the form of a coating or layer that is disposed on top of a substrate 210. The dry composition 208 can correspond to a host material, or can correspond to a host material precursor, which can be converted into the host material by suitable processing, such as drying, curing, cross-linking, polymerizing, or any combination thereof. Other characteristics of the dry composition 208 can be similar to those described above with reference to FIG. 2A, and are not repeated below. Referring to FIG. 2B, the substrate 210 can be transparent or opaque, can be flexible or rigid, and can be comprised of, for example, a polymer, an ionomer, a coated polymer (e.g., a PET film with a PMMA hardcoat), ethylene vinyl acetate (or EVA), cyclic olefin polymer (or COP), cyclic olefin copolymer (or COC), polyvinyl butyral (or PVB), thermoplastic olefin (or TPO), thermoplastic polyurethane (or TPU), polyethylene (or PE), polyethylene terephthalate (or PET), polyethylene terephthalate glycol (or PETG), polycarbonate, polyvinyl chloride (or PVC), polypropylene (or PP), acrylic-based polymer, acrylonitrile butadiene styrene (or ABS), ceramic, glass, silicon, metal (e.g., stainless steel or aluminum), or any combination thereof, as well as any other material previously listed as suitable host materials. The substrate 210 can serve as a temporary substrate that is subsequently removed during device assembly, or can be retained in a resulting device as a layer or other component of the device. Next, additives 212 and an embedding fluid 214 are applied to the dry composition 208. The additives 212 can be in solution or otherwise dispersed in the embedding fluid 214, and can be simultaneously applied to the dry composition 208 via one-step embedding. Alternatively, the additives 212 can be separately applied to the dry composition 208 before, during, or after the embedding fluid 214 treats the dry composition 208. As noted above, embedding involving the separate application of the additives 212 and the embedding fluid 214 can be referred as two-step embedding. Subsequently, the resulting host material 216 (which is disposed on top of the substrate 210) has at least some of the additives 212 partially or fully embedded into a surface of the host material 216. Optionally, suitable processing can be carried out to convert the softened or swelled composition 208 into the host material 216. During device assembly, the host material 216 with the embedded additives 212 can be laminated or otherwise connected to adjacent device layers, or can serve as a substrate onto which adjacent device layers are formed, laminated, or otherwise applied.

In the case of a patterned transparent conductor, surface embedding according to FIG. 2B can be carried out generally uniformly across the dry composition 208, followed by spatially selective or varying treatment to yield higher conductance and lower conductance portions across the host material 216. Alternatively, or in conjunction, surface embedding according to FIG. 2B can be carried out in a spatially selective or varying manner, such as by disposing or forming the dry composition 208 in a spatially selective or varying manner over the substrate 210, by applying the additives 212 in a spatially selective or varying manner across either, or both, of the dry composition 208 and the substrate 210, by applying the embedding fluid 214 in a spatially selective or varying manner across either, or both, of the dry composition 208 and the substrate 210, or any combination thereof.

In some embodiments, additives are dispersed in an embedding fluid, or dispersed in a separate carrier fluid and separately applied to a dry composition. Dispersion can be accomplished by mixing, milling, sonicating, shaking (e.g., wrist action shaking, rotary shaking), vortexing, vibrating, flowing, chemically modifying the additives' surfaces, chemically modifying a fluid, increasing the viscosity of the fluid, adding a dispersing or suspending agent to the fluid, adding a stabilization agent to the fluid, changing the polarity of the fluid, changing the hydrogen bonding of the fluid, changing the pH of the fluid, or otherwise processing the additives to achieve the desired dispersion. The dispersion can be uniform or non-uniform, and can be stable or unstable. A carrier fluid can serve as an embedding fluid (e.g., an additional embedding fluid), or can have similar characteristics as an embedding fluid. In other embodiments, a carrier fluid can serve as a transport medium to carry or convey additives, but is otherwise substantially inert towards the additives and the dry composition.

Fluids (e.g., embedding fluids and carrier fluids) can include liquids, gases, or supercritical fluids. Combinations of different types of fluids are also suitable. Fluids can include one or more solvents. For example, a fluid can include water, an ionic or ion-containing solution, an ionic liquid, an organic solvent (e.g., a polar, organic solvent; a non-polar, organic solvent; an aprotic solvent; a protic solvent; a polar aprotic solvent, or a polar, protic solvent); an inorganic solvent, or any combination thereof. Oils also can be considered suitable fluids. Salts, surfactants, dispersants, stabilizers, polymers, monomers, oligomers, cross-linking agents, polymerization agents, acids, bases, or binders can also be included in the fluids.

Examples of suitable organic solvents include 2-methyltetrahydrofuran, a chloro-hydrocarbon, a fluoro-hydrocarbon, a ketone, a paraffin, acetaldehyde, acetic acid, acetic anhydride, acetone, acetonitrile, an alkyne, an olefin, aniline, benzene, benzonitrile, benzyl alcohol, benzyl ether, butanol, butanone, butyl acetate, butyl ether, butyl formate, butyraldehyde, butyric acid, butyronitrile, carbon disulfide, carbon tetrachloride, chlorobenzene, chlorobutane, chloroform, cycloaliphatic hydrocarbons, cyclohexane, cyclohexanol, cyclohexanone, cyclopentanone, cyclopentyl methyl ether, diacetone alcohol, dichloroethane, dichloromethane, diethyl carbonate, diethyl ether, diethylene glycol, diglyme, di-isopropylamine, dimethoxyethane, dimethyl formamide, dimethyl sulfoxide, dimethylamine, dimethylbutane, dimethylether, dimethylformamide, dimethylpentane, dimethylsulfoxide, dioxane, dodecafluoro-1-heptanol, ethanol, ethyl acetate, ethyl ether, ethyl formate, ethyl propionate, ethylene dichloride, ethylene glycol, formamide, formic acid, glycerine, heptane, hexafluoroisopropanol (or HFIP), hexamethylphosphoramide, hexamethyl phosphorous triamide, hexane, hexanone, hydrogen peroxide, hypochlorite, i-butyl acetate, i-butyl alcohol, i-butyl formate, i-butylamine, i-octane, i-propyl acetate, i-propyl ether, isopropanol, isopropylamine, ketone peroxide, methanol and calcium chloride solution, methanol, methoxyethanol, methyl acetate, methyl ethyl ketone (or MEK), methyl formate, methyl n-butyrate, methyl n-propyl ketone, methyl t-butyl ether, methylene chloride, methylene, methylhexane, methylpentane, mineral oil, m-xylene, n-butanol, n-decane, n-hexane, nitrobenzene, nitroethane, nitromethane, nitropropane, 2-N-methyl-2-pyrrolidinone, n-propanol, octafluoro-1-pentanol, octane, pentane, pentanone, petroleum ether, phenol, propanol, propionaldehyde, propionic acid, propionitrile, propyl acetate, propyl ether, propyl formate, propylamine, propylene glycol, p-xylene, pyridine, pyrrolidine, t-butanol, t-butyl alcohol, t-butyl methyl ether, tetrachloroethane, tetrafluoropropanol (or TFP), tetrahydrofuran (or THF), tetrahydronaphthalene, toluene, triethyl amine, trifluoroacetic acid, trifluoroethanol (or TFE), trifluoropropanol, trimethylbutane, trimethylhexane, trimethylpentane, valeronitrile, xylene, xylenol, or any combination thereof. Alcohols including from one to ten carbon atoms (i.e., $C_1$-$C_{10}$ alcohols, such as $C_1$-$C_6$ alcohols) can be considered suitable, such as methanol, ethanol, 1-propanol, 2-propanol, 1-butanol, 2-butanol, 2-methyl-1-propanol, 2-methyl-2-propanol, 1-pentanol, 2-pentanol, 3-pentanol, 2-2-dimethyl-1-propanol, 1-hexanol, as well as combinations, functionalized forms, and mixtures thereof with another fluid such as water. Alcohols include primary alcohols (e.g., n-propyl alcohol, isobutyl alcohol), secondary alcohols (e.g., isopropyl alcohol, cyclohexanol), tertiary alcohols (e.g., tert-amyl alcohol), or any combination thereof. Other examples of suitable alcohols include monohydric alcohols (e.g., methanol, ethanol, isopropyl alcohol, butyl alcohol, butanol, pentanol, hexadecan-1-ol, amyl alcohol, cetyl alcohol), polyhydric alcohols (e.g., ethylene glycol, glycerin, Butan-1,2,3,4-tetraol, erythritol, Pentane-1,2,3,4,5-pentol, xylitol, Hexane-1,2,3,4,5,6-hexyl, mannitol, sorbitol, Heptane-1,2,3,4,5,6,7-heptol, volemitol), unsaturated aliphatic alcohols (e.g., Prop-2-ene-1-ol, allyl alcohol, 3,7-Dimethyloca-2,6-dien-1-ol, Geraniol, prop-2-in-1-ol, propargyl alcohol), alicyclic alcohols (e.g., cyclohexane-1,2,3,4,5,6-hexyl, inositol, 2-(2-propyl)-5-methyl-cyclohexane-1-ol, Menthol), as well as combinations, functionalized forms, and mixtures thereof with other fluids (e.g., water).

Suitable inorganic solvents include, for example, water, ammonia, sodium hydroxide, sulfur dioxide, sulfuryl chloride, sulfuryl chloride fluoride, phosphoryl chloride, phosphorus tribromide, dinitrogen tetroxide, antimony trichloride, bromine pentafluoride, hydrogen fluoride, or any combination thereof.

Suitable ionic solutions include, for example, choline chloride, urea, malonic acid, phenol, glycerol, 1-alkyl-3-methylimidazolium, 1-alkylpyridinium, N-methyl-N-alkylpyrrolidinium, 1-butyl-3-methylimidazolium hexafluorophosphate, ammonium, choline, imidazolium, phosphonium, pyrazolium, pyridinium, pyrrolidinium, sulfonium, 1-ethyl-1-methylpiperidinium methyl carbonate, 4-ethyl-4-methylmorpholinium methyl carbonate, or any combination thereof. Other methylimidazolium solutions can be considered suitable, including 1-ethyl-3-methylimidazolium acetate, 1-butyl-3-methylimidazolium tetrafluoroborate, 1-n-butyl-3-methylimidazolium tetrafluoroborate, 1-butyl-3-methylimidazolium hexafluorophosphate, 1-n-butyl-3-methylimidazoliumhexafluoro phosphate, 1-butyl-3-methylimidazolium 1,1,1-trifluoro-N [(trifluoromethyl)sulfonyl]methanesulfonamide, 1-butyl-3-methylimidazolium bis(trifluoro methylsulfonyl)imide, 1-butyl-3-methylimidazolium bis[(trifluoromethyl)sulfonyl]amide, and 1-butyl-3-methylimidazolium bis[(trifluoromethyl)sulfonyl]imide, or any combination thereof.

Other suitable fluids include halogenated compounds, imides, and amides, such as N-ethyl-N,N-bis(1-methylethyl)-1-heptanaminium bis[(trifluoromethyl)sulfonyl]imide, ethyl heptyl-di-(1-methylethyl)ammonium 1,1,1-trifluoro-N-[(trifluoromethyl)sulfonyl]methane sulfonamide, ethylheptyl-di-(1-methyl ethyl)ammonium bis(trifluoromethylsulfonyl)imide, ethylheptyl-di-(1-methylethyl)ammonium bis[(trifluoromethyl)sulfonyl]amide, or any combination thereof. A fluid can also include ethylheptyl-di-(1-methylethyl)ammonium bis[(trifluoromethyl)sulfonyl]imide, $N_5N_5$N-tributyl-1-octanaminium trifluoromethane sulfonate, tributyloctylammonium triflate, tributyloctylammonium trifluoromethanesulfonate, N,N,N-tributyl-1-hexanaminium bis [(trifluoromethyl)sulfonyl]imide, tributylhexylammonium 1,1,1-trifluoro-N-[(trifluoromethyl)sulfonyl]methanesulfonamide, tributylhexylammonium bis(trifluoromethylsulfonyl)imide, tributylhexylammonium bis[(trifluoromethyl)sulfonyl]amide, tributylhexylammonium bis[(trifluoromethyl)sulfonyl]imide, N,N,N-tributyl-1-heptanaminium bis[(trifluoromethyl)sulfonyl]imide, tributylheptylammonium 1,1,1-trifluoro-N-[(trifluoro methyl)sulfonyl]methanesulfonamide, tributylheptylammonium bis(trifluoromethylsulfonyl)imide; tributylheptylammonium bis[(trifluoromethyl)sulfonyl]amide, tributylheptylammonium bis[(trifluoromethyl)sulfonyl]imide, N,N,N-tributyl-1-octanaminium bis[(trifluoromethyl) sulfonyl] imide, tributyloctylammonium 1,1,1-trifluoro-N-[(trifluoromethyl)sulfonyl]methane sulfonamide, tributyloctylammonium bis(trifluoromethylsulfonyl)imide, tributyloctylammonium bis[(trifluoromethyl)sulfonyl]amide, tributyloctylammonium bis[(trifluoromethyl)sulfonyl]imide, 1-butyl-3-methylimidazolium trifluoroacetate, 1-methyl-1-propylpyrrolidinium 1,1,1-trifluoro-N-[(trifluoromethyl)sulfonyl]methanesulfonamide, 1-methyl-1-propylpyrrolidinium bis(trifluoro methylsulfonyl)imide, 1-methyl-1-propylpyrrolidinium bis[(trifluoromethyl)sulfonyl]amide, 1-methyl-1-propylpyrrolidinium bis[(trifluoromethyl)sulfonyl]imide, 1-butyl-1-methylpyrrolidinium 1,1,1-trifluoro-N-[(trifluoromethyl)sulfonyl]methanesulfonamide, 1-butyl-1-methylpyrrolidinium bis(trifluoromethylsulfonyl)imide, 1-butyl-1-methylpyrrolidinium bis [(trifluoromethyl)sulfonyl]amide, 1-butyl-1-methylpyrrolidinium bis[(trifluoromethyl)sulfonyl]imide, 1-butylpyridinium 1,1,1-trifluoro-N-[(trifluoromethyl)sulfonyl]methanesulfonamide, 1-butylpyridinium bis(trifluoromethylsulfonyl)imide, 1-butylpyridinium bis[(trifluoromethyl) sulfonyl]amide, 1-butylpyridinium bis[(trifluoromethyl)sulfonyl]imide, 1-butyl-3-methyl imidazolium bis(perfluoroethylsulfonyl)imide, butyltrimethylammonium bis(trifluoromethyl sulfonyl) imide, 1-octyl-3-methylimidazolium 1,1,1-trifluoro-N-[(trifluoromethyl)sulfonyl]methanesulfonamide, 1-octyl-3-methylimidazolium bis(trifluoromethylsulfonyl)imide, 1-octyl-3-methylimidazolium bis[(trifluoromethyl)sulfonyl]amide, 1-octyl-3-methylimidazolium bis[(trifluoromethyl)sulfonyl] imide, 1-ethyl-3-methylimidazolium tetrafluoroborate, $N_5N_5$N-trimethyl-1-hexanaminium bis[(trifluoromethyl)sulfonyl]imide, hexyltrimethylammonium 1,1,1-trifluoro-N-[(trifluoromethyl)sulfonyl]methanesulfonamide, hexyltrimethylammonium bis(trifluoromethylsulfonyl)imide, hexyltrimethylammonium bis[(trifluoromethyl)sulfonyl] amide, hexyltrimethylammonium bis[(trifluoromethyl)sulfonyl]imide, N,N,N-trimethyl-1-heptanaminium bis[(trifluoromethyl)sulfonyl]imide, heptyltrimethylammonium 1,1,1-trifluoro-N-[(trifluoromethyl)sulfonyl]methanesulfonamide, heptyltrimethylammonium bis(trifluoro methylsulfonyl)imide, heptyltrimethylammonium bis[(trifluoromethyl)sulfonyl]amide, heptyltrimethylammonium bis[(trifluoromethyl) sulfonyl]imide, N,N,N-trimethyl-1-octanaminium bis [(trifluoromethyl)sulfonyl]imide, trimethyloctylammonium 1,1,1-trifluoro-N-[(trifluoro methyl)sulfonyl]methanesulfonamide, trimethyloctylammonium bis(trifluoromethylsulfonyl)imide, trimethyloctylammonium bis[(trifluoromethyl)sulfonyl]amide, trimethyloctylammonium bis [(trifluoromethyl)sulfonyl]imide, 1-ethyl-3-methylimidazolium ethyl sulfate, or any combination thereof.

Control over surface embedding of additives can be achieved through the proper balancing of the swelling-dispersion-evaporation-application stages. This balance can be controlled by, for example, a solvent-host material interaction parameter, sizes of additives, reactivity and volatility of an embedding fluid, impinging additive momentum or velocity, temperature, humidity, pressure, and others factors. More particularly, examples of processing parameters for surface embedding are listed below for some embodiments of the invention:

Embedding Fluid Selection:
  Solubility parameter relative to the substrate or other host material (e.g.
  Hildebrand and Hansen solubility parameters)
  Compatibility of embedding fluid with surface (e.g., matching or comparison of dielectric constant, partition coefficient, pKa, etc.)
  Azeotropes, miscibility
  Solvent diffusion/mobility
  Viscosity
  Evaporation (flash point, vapor pressure, cooling, etc.)
  Duration of solvent exposure to substrate or other host material
  Dispersants, surfactants, stabilizers, rheology modifiers
  Solvent (VOC, VOC-exempt, VOC-free, aqueous based)
Substrate or Other Host Material:
  Solubility parameters (relative to the solvent formulation)

Crystallinity
Degree of crosslinking
Molecular weight
Surface energy
Co-polymers/composite materials
Surface treatment Additive Type:
  Concentration of additives
  Geometry of additives
  Surface modification (e.g. ligands, surfactants) of additives
  Stability of additives in the solvent formulation Process Operations and Conditions:
  Deposition Type/Application method (e.g., spraying, printing, rolling coating, gravure coating, slot-die coating, capillary coating, meniscus coating, cup coating, blade coating, airbrushing, immersion, dip coating, etc.)
  Duration of solvent exposure to substrate or other host material
  Wetting, surface tension
  Volume of solvent
  Surface (pre)treatment
  Humidity
  Surface (post)treatment
  Impact/momentum/velocity of additives onto surface (e.g., may influence depth or extent of embedding)
  Shear applied to solvent between host material and applicator
  Post-processing conditions (e.g., heating, evaporation, fluid removal, air-drying, etc.)

Other Factors:
  Wetting/surface tension
  Capillary forces, wicking
  Amount of solvent applied to the surface
  Duration of solvent exposure to the surface
  Surface (pre)treatment
  Stability of formulation
  Diffusion of embedding fluid into surface: thermodynamic and kinetics considerations Mitigation of Undesired Effects:
  Irreversible destruction
  Long swelling/solubility time
  Blushing, hazing
  Cracking, crazing
  Environmental conditions (e.g. humidity)
  Permanent softening
  Wettability/uneven wetting
  Solution stability
  Surface Roughness Some, or all, of the aforementioned parameters can be altered or selected to tune a depth or an extent of embedding of additives into a given host material. For example, higher degrees of embedding deep into a surface of a host material can be achieved by increasing a solvency power of an embedding fluid interacting with the host material, matching closely Hansen solubility parameters of the embedding fluid-substrate, prolonging the exposure duration of the embedding fluid in contact with the host material, increasing an amount of the embedding fluid in contact with the host material, elevating a temperature of the system, increasing a momentum of additives impinging onto the host material, increasing a diffusion of either, or both, of the embedding fluid and the additives into the host material, or any combination thereof.

Fluids (e.g., embedding fluids and carrier fluids) can also include salts, surfactants, stabilizers, and other agents useful in conferring a particular set of characteristics on the fluids. Stabilizers can be included based on their ability to at least partially inhibit inter-additive agglomeration. Other stabilizers can be chosen based on their ability to preserve the functionality of additives. Butylated hydroxytoluene (or BHT), for instance, can act as a good stabilizer and as an antioxidant. Other agents can be used to adjust rheological properties, evaporation rate, and other characteristics.

Fluids and additives can be applied so as to be largely stationary relative to a surface of a dry composition. In other embodiments, application is carried out with relative movement, such as by spraying a fluid onto a surface, by conveying a dry composition through a falling curtain of a fluid, or by conveying a dry composition through a pool or bath of a fluid. Application of fluids and additives can be effected by airbrushing, atomizing, nebulizing, spraying, electrostatic spraying, pouring, rolling, curtaining, wiping, spin casting, dripping, dipping, painting, flowing, brushing, immersing, patterning (e.g., stamping, inkjet printing, controlled spraying, controlled ultrasonic spraying, and so forth), flow coating methods (e.g., slot die, capillary coating, meniscus coating, meyer rod, blade coating, cup coating, draw down, and the like), printing, gravure printing, lithography, screen printing, flexo printing, offset printing, roll coating, inkjet printing, intaglio printing, or any combination thereof. In some embodiments, additives are propelled, such as by a sprayer, onto a surface, thereby facilitating embedding by impact with the surface. In other embodiments, a gradient is applied to a fluid, additives, or both. Suitable gradients include magnetic and electric fields. The gradient can be used to apply, disperse, or propel the fluid, additives, or both, onto a surface. In some embodiments, the gradient is used to manipulate additives so as to control the extent of embedding. An applied gradient can be constant or variable. Gradients can be applied before a dry composition is softened or swelled, while the dry composition remains softened or swelled, or after the dry composition is softened or swelled. It is contemplated that a dry composition can be heated to achieve softening, and that either, or both, a fluid and additives can be heated to promote embedding. In some embodiments, embedding of additives can be achieved primarily or solely through application of an embedding fluid, without requiring application of gradients or external pressure. In some embodiments, embedding of additives can be achieved through application of pressure (e.g., pressure rollers) in place of, or in conjunction with, an embedding fluid.

Application of fluids and additives and embedding of the additives can be spatially controlled to yield patterns. In some embodiments, spatial control can be achieved with a physical mask, which can be placed between an applicator and a surface to block a segment of applied additives from contacting the surface, resulting in controlled patterning of additive embedding. In other embodiments, spatial control can be achieved with a photomask. A positive or negative photomask can be placed between a light source and a surface, which can correspond to a photoresist. Light transmitted through non-opaque parts of the photomask can selectively affect a solubility of exposed parts of the photoresist, and resulting spatially controlled soluble regions of the photoresist can permit controlled embedding of additives. In other embodiments, spatial control can be achieved through the use of electric gradients, magnetic gradients, electromagnetic fields, thermal gradients, pressure or mechanical gradients, surface energy gradients (e.g., liquid-solid-gas interfaces, adhesion-cohesion forces, and capillary effects), printing, or any combination thereof. Spatial control can also be achieved by printing a material that differs from a host material and in which embedding does not occur (or is otherwise inhibited). Further details on patterning are described below.

As noted above, additives can be dispersed in an embedding fluid, and applied to a dry composition along with the embedding fluid via one-step embedding. Additives also can be applied to a dry composition separately from an embedding fluid via two-step embedding. In the latter scenario, the additives can be applied in a wet form, such as by dispersing in a carrier fluid or by dispersing in the same embedding fluid or a different embedding fluid. Still in the latter scenario, the additives can be applied in a dry form, such as in the form of aerosolized powder. It is also contemplated that the additives can be applied in a quasi-dry form, such as by dispersing the additives in a carrier fluid that is volatile, such as methanol, another low boiling point alcohol, or another low boiling point organic solvent, which substantially vaporizes prior to impact with a dry composition.

By way of example, one embodiment involves spraying, airbrushing, or otherwise atomizing a solution of nanowires or other additives dispersed in an appropriate carrier fluid onto a dry composition.

As another example, one embodiment involves pre-treating a dry composition by spraying or otherwise contacting an embedding fluid with the dry composition, and then, after the passage of time $t_1$, spraying or airbrushing nanowires or other additives with velocity such that the combination of the temporarily softened dry composition and the velocity of the impinging nanowires allow rapid and durable surface-embedding of the nanowires. $t_1$ can be, for example, in the range of about 0 nanosecond to about 24 hours, such as from about 1 nanosecond to about 24 hours, from about 1 nanosecond to about 1 hour or from about 1 second to about 1 hour. Two spray nozzles can be simultaneously or sequentially activated, with one nozzle dispensing the embedding fluid, and the other nozzle dispensing, with velocity, atomized nanowires dispersed in a carrier fluid towards the dry composition. Air-curing or higher temperature annealing optionally can be included.

As another example, one embodiment involves spraying, airbrushing, or otherwise atomizing a solution of nanowires or other additives dispersed in a carrier fluid onto a dry composition. After the passage of time $t_2$, a second spraying, airbrushing, or atomizing operation is used to apply an embedding fluid so as to permit efficient surface-embedding of the nanowires. $t_2$ can be, for example, in the range of about 0 nanosecond to about 24 hours, such as from about 1 nanosecond to about 24 hours, from about 1 nanosecond to about 1 hour or from about 1 second to about 1 hour. Two spray nozzles can be simultaneously or sequentially activated, with one nozzle dispensing the embedding fluid, and the other nozzle dispensing, with velocity, atomized nanowires dispersed in the carrier fluid towards the dry composition. Air-curing or higher temperature annealing optionally can be included.

A time period for exposure or otherwise contacting an embedding fluid with a dry composition can be selected, for example, according to a desired extent of embedding, while mitigating against undesired effects such as hazing, crazing, blushing, and so forth. In some embodiments, a exposure time can be, for example, in the range of about 0.1 second to about 24 hours, such as from about 0.5 second to about 12 hours, from about 1 second to about 6 hours, from about 1 second to about 3 hours, from about 1 second to about 2 hours, from about 1 second to about 1 hour, from about 1 minute to about 50 minutes, from about 1 minute to about 40 minutes, from about 1 minute to about 30 minutes, or from about 1 minute to about 20 minutes.

Figure 2C:
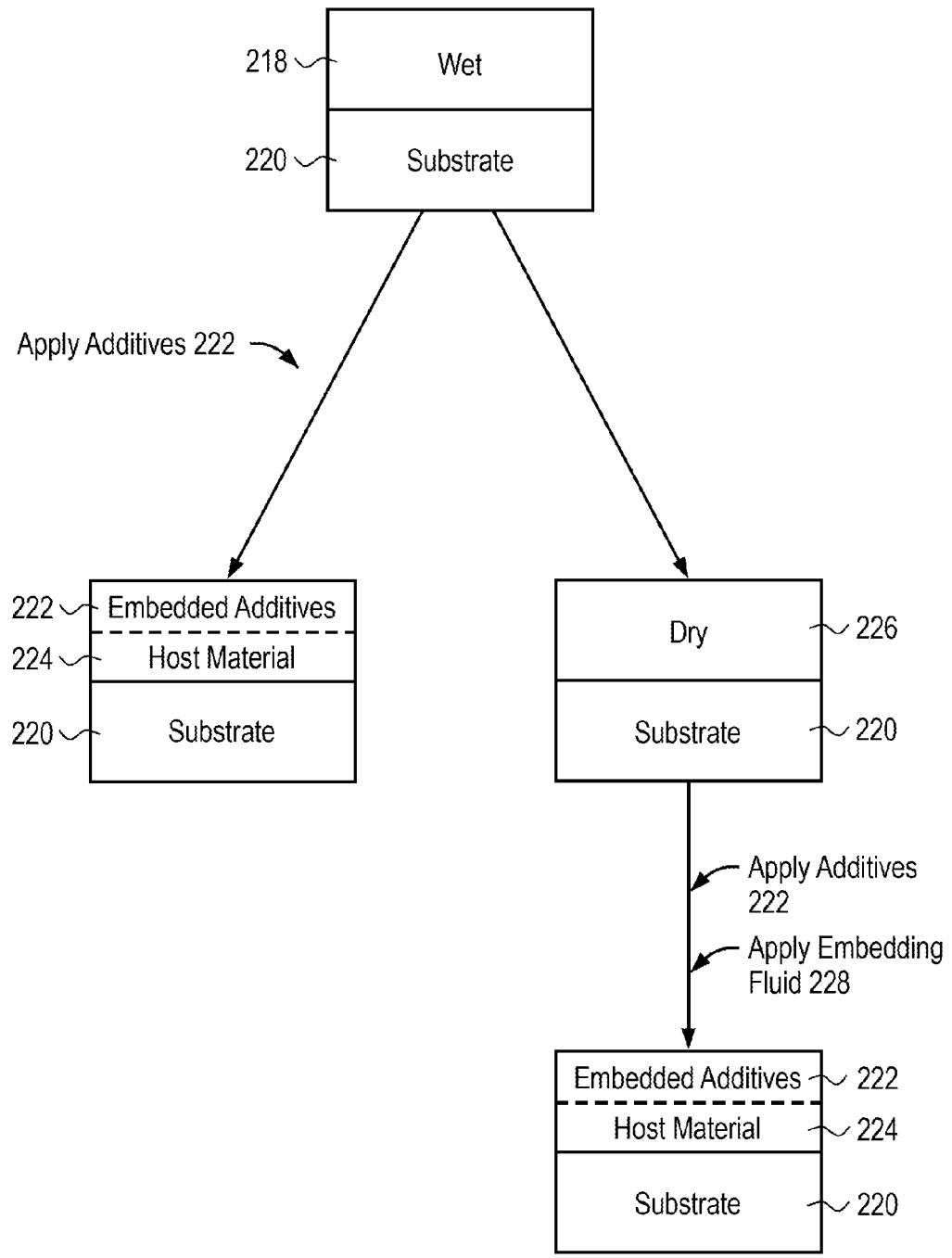

Attention next turns to FIG. 2C, which illustrates a manufacturing method for surface embedding additives 222 into a wet composition 218, according to an embodiment of the invention. Referring to FIG. 2C, the wet composition 218 is applied to a substrate 220 in the form of a coating or a layer that is disposed on top of the substrate 220. The wet composition 218 can correspond to a dissolved form of a host material and, in particular, can include a dissolved form, a colloidal form, a nanoparticle form, a sol-form of any material previously listed as suitable host materials. It is also contemplated that the wet composition 218 can correspond to a host material precursor, which can be converted into the host material by suitable processing, such as drying, curing, cross-linking, polymerizing, sintering, calcining, or any combination thereof. For example, the wet coating composition 218 can be a coating or a layer that is not fully cured or set, a cross-linkable coating or layer that is not fully cross-linked, which can be subsequently cured or cross-linked using suitable polymerization initiators or cross-linking agents, or a coating or a layer of monomers, oligomers, or a combination of monomers and oligomers, which can be subsequently polymerized using suitable polymerization initiators or cross-linking agents. The wet composition 218 also can be patterned, for instance, with printing methods like screen, reverse offset gravure, flexo, or ink-jet, printing, or another method. In some embodiments, the wet composition 218 can include a material with a liquid phase as well as a solid phase, or can include a material that is at least partially liquid or has properties resembling those of a liquid, such as a sol, a semi-solid, a gel, and the like. The substrate 220 can be transparent or opaque, can be flexible or rigid, and can be composed of, for example, a polymer, an ionomer, EVA, PVB, TPO, TPU, PE, PET, PETG, PMMA, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 220 can serve as a temporary substrate that is subsequently removed during device assembly, or can be retained in a resulting device as a layer or other component of the device.

Next, according to the option on the left-side of FIG. 2C, the additives 222 are applied to the wet composition 218 prior to drying or while it remains in a state that permits embedding of the additives 222 within the wet composition 218. In some embodiments, application of the additives 222 is via a flow coating method (e.g., slot die, capillary coating, meyer rod, cup coating, draw down, and the like). Although not illustrated on the left-side, it is contemplated that an embedding fluid can be simultaneously or separately applied to the wet composition 218 to facilitate the embedding of the additives 222. In some embodiments, embedding of the additives 222 can be achieved through application of pressure (e.g., pressure rollers) in place of, or in conjunction with, an embedding fluid. Subsequently, the resulting host material 224 has at least some of the additives 222 partially or fully embedded into a surface of the host material 224. Suitable processing can be carried out to convert the wet composition 218 into the host material 224. During device assembly, the host material 224 with the embedded additives 222 can be laminated or otherwise connected to adjacent device layers, or can serve as a substrate onto which adjacent device layers are formed, laminated, or otherwise applied.

Certain aspects regarding the application of the additives 222 and the embedding of the additives 222 on the left-side of FIG. 2C can be carried out using similar processing conditions and materials as described above for FIG. 2A and FIG. 2B, and those aspects need not be repeated below.

Referring to the option on the right-side of FIG. 2C, the wet composition 218 can be initially converted into a dry composition 226 by suitable processing, such as by at least partially drying, curing, cross-linking, polymerization, or any combination thereof. Next, the additives 222 and an embedding fluid 228 can be applied to the dry composition 226. The additives 222 can be in solution or otherwise dispersed in the embedding fluid 228, and can be simultaneously applied to the dry composition 226 via one-step embedding. Alternatively, the additives 222 can be separately applied to the dry composition 226 before, during, or after the embedding fluid 228 treats the dry composition 226. As noted above, embedding involving the separate application of the additives 222 can be referred as two-step embedding. Subsequently, the resulting host material 224 has at least some of the additives 222 partially or fully embedded into the surface of the host material 224. Optionally, suitable processing can be carried out to convert the dry composition 226 into the host material 224, such as by additional drying, curing, cross-linking, polymerization, or any combination thereof. Any, or all, of the manufacturing stages illustrated in FIG. 2C can be carried out in the presence of a vapor environment of a suitable fluid (e.g., an embedding fluid or other suitable fluid) to facilitate the embedding of the additives 222, to slow drying of the wet composition 218, or both.

Certain aspects regarding the application of the additives 222 and the embedding fluid 228 and the embedding of the additives 222 on the right-side of FIG. 2C can be carried out using similar processing conditions and materials as described above for FIG. 2A and FIG. 2B, and those aspects need not be repeated below. In particular, and in at least certain aspects, the processing conditions for embedding the additives 222 into the dry composition 226 on the right-side of FIG. 2C can be viewed as largely parallel to those used when embedding the additives 212 into the dry composition 208 of FIG. 2B.

In the case of a patterned transparent conductor, surface embedding according to FIG. 2C can be carried out generally uniformly across the wet composition 218 or the dry composition 226, followed by spatially selective or varying treatment to yield higher conductance and lower conductance portions across the host material 224. Alternatively, or in conjunction, surface embedding according to FIG. 2C can be carried out in a spatially selective or varying manner, such as by disposing or forming the wet composition 218 in a spatially selective or varying manner over the substrate 220, by applying the additives 222 in a spatially selective or varying manner across either, or both, of the wet composition 218 and the substrate 220, by applying the additives 222 in a spatially selective or varying manner across either, or both, of the dry composition 226 and the substrate 220, by applying the embedding fluid 228 in a spatially selective or varying manner across either, or both, of the dry composition 226 and the substrate 220, or any combination thereof.

Patterning of Transparent Conductors

Patterned transparent conductors can be used in, for example, touch sensors, liquid crystal display (or LCD) pixel electrodes, and other electronic devices. Adequate electrical isolation between conductive traces is desirable to isolate electrical signals to achieve spatial resolution in touch sensing or pixel switching. Adequate transparency of the transparent conductors is desirable to achieve higher display brightness, contrast ratio, image quality, and power consumption efficiency, while adequate electrical conductivity is desirable to maintain high signal to noise ratios, switching speeds, refresh rates, response time, and uniformity. For applications where electrical patterning is desirable but optically (e.g., visible to the human eye) observable patterning is undesirable, adequate pattern invisibility or low pattern visibility is desirable. Electrically isolated patterns which are nearly or substantially indistinguishable by the human eye are particularly desirable.

According to some embodiments, an electrically conductive pattern of additives can be surface embedded into selected portion or portions of a substrate or an unpatterned coating. For example, printing on the substrate or the coating can achieve patterning of a transparent conductor by surface embedding. Other spatially selective or varying manner of application of either, or both, additives and an embedding fluid can be used. Examples of techniques useful for directly patterning a substrate or a coating include printing methods such as screen, ink-jet, aerosol-jet, ultrasonic spray, continuous deposition, gravure, intaglio, pad, roll, offset, mimeography, and imprint, and other methods such as using a mask.

In some embodiments, an embedding dispersion including additives and an embedding fluid that swells or softens a host material can be printed into a pattern directly onto the host material. In some embodiments, the embedding dispersion is i) substantially free of binders or fillers, and ii) includes volatile (e.g., alcohol) solvent(s). Binders and fillers that negatively affect electrical and optical characteristics can be omitted, although the lack of binders and fillers may inhibit the use of certain printing techniques. Fillers can be included to make printing easier by reducing settling and increasing viscosity. Certain fillers may reduce conductivity to varying degrees, which can be advantageous (e.g., to form lower conductance portions that should be optically similar to higher conductance portions), or can be omitted where conductivity is desirable. Polymethyl methacrylate (or PMMA, MW of about 1M) when used as a filler can increase viscosity and slow settling (e.g., 5× slower settle rate) without significantly hindering performance.

FIG. 3A illustrates a manufacturing method of a patterned transparent conductor 300, according to an embodiment of the invention. As shown in FIG. 3, an active substrate 302 can be provided. By "active," it will be understood that the substrate 302 is sufficiently affected by, or is otherwise sufficiently susceptible to, an embedding fluid to permit surface embedding of additives in the presence of the embedding fluid, whether or not the resulting surface-embedded additives form a network that is electrically conductive. "Active" can be contrasted with "inactive" for which surface embedding does not occur (or is otherwise inhibited). It will also be understood that "active" can be relative to a particular embedding fluid, such that the substrate 302 (or other host material) can be active relative to one embedding fluid, but inactive relative to another embedding fluid.

Next, additives 304 and an embedding fluid (not shown) can be applied to the substrate 302 in a spatially selective or varying manner, such as by printing or another technique. The additives 304 can be electrically conductive or semiconducting, such as in the form of nanowires, nanotubes, or other nano-sized or micron-sized structures having an aspect ratio of about 3 or greater. The additives 304 can be in solution or otherwise dispersed in the embedding fluid, and can be simultaneously applied to the substrate 302 via one-step embedding. Alternatively, the additives 304 can be separately applied to the substrate 302 before, during, or after the embedding fluid treats the substrate 302. As noted above, the separate application of the additives 304 and the embedding fluid can be referred as two-step embedding. In the case of two-step embedding, the additives 304 can be applied in a spatially selective or varying manner, while the embedding fluid can be applied uniformly or non-uniformly across the substrate 302. Subsequently, the resulting patterned transparent conductor 300 has at least some of the additives 304 partially or fully embedded into a surface of the substrate 302, and arranged according to a pattern to form higher conductance portions 306. Gaps between the higher conductance portions 306 are substantially devoid of the additives 304 and form lower conductance portions 308. It will be understood that "lower conductance" or "lower sheet conductance" can encompass an insulating nature in an absolute sense, but need not necessarily refer to such absolute sense. Rather, "lower-conductance" more generally can refer to a portion that is sufficiently insulating for purposes of electrical isolation, or can be relative to another portion having a higher sheet conductance. In some embodiments, an electrical contrast between the portions 306 and 308 can be such that a surface or sheet resistance of the lower conductance portions 308 can be at least about 2 times a sheet resistance of the higher conductance portions 306, such as at least about 5 times, at least about 10 times, at least about 20 times, at least about 50 times, at least about 100 times, at least about 500 times, at least about 1,000 times, or at least about 10,000 times, and up to about 100,000 times, up to about 1,000,000 times, or more. In some embodiments, a surface or sheet resistance of the lower conductance portions 308 can be at least about 100 $\Omega$/sq, such as at least about 200 $\Omega$/sq, at least about 500 $\Omega$/sq, at least about 1,000 $\Omega$/sq, at least about 10,000 $\Omega$/sq, or at least about 100,000 $\Omega$/sq, and up to about 1,000,000 $\Omega$/sq, up to about 10,000,000 $\Omega$/sq, or more.

A similar sequence of operations as set forth in FIG. 3A can be carried out on surfaces on different sides of the substrate 302, thereby resulting in multiple-sided (e.g., two-sided) patterning. FIG. 3B illustrates a patterned transparent conductor 314 similar to the patterned transparent conductor 300 of FIG. 3A, but also having additives 316 partially or fully embedded into an opposite, bottom surface of the substrate 302, and arranged according to a pattern to form higher conductance portions 310 and lower conductance portions 312. The additives 304 and 316 can be the same or different. A top pattern can substantially overlie a bottom pattern, or, as shown in FIG. 3B, the top pattern can be offset or arranged in a staggered manner relative to the bottom pattern, such that the higher conductance portions 306 can overlie the lower conductance portions 312, and the lower conductance portions 308 can overlie the higher conductance portions 310. This offset arrangement can achieve low visibility of the top and bottom patterns. Other arrangements of the top and bottom patterns are contemplated, such as in a cross-wise manner.

FIG. 4 illustrates a manufacturing method of a patterned transparent conductor 400, according to another embodiment of the invention. As shown in FIG. 4, a substrate 402 can be provided, where the substrate 402 can be either active or inactive, and an active, unpatterned coating 404 is applied on top of the substrate 402. Next, additives 406 and an embedding fluid (not shown) can be applied to the coating 404 in a spatially selective or varying manner via one-step embedding or two-step embedding, such as by printing or another technique. In the case of two-step embedding, the additives 406 can be applied in a spatially selective or varying manner, while the embedding fluid can be applied uniformly or non-uniformly across the coating 404. Subsequently, the resulting patterned transparent conductor 400 has at least some of the additives 406 partially or fully embedded into a surface of the coating 404, and arranged according to a pattern to form higher conductance portions 408. Gaps between the higher conductance portions 408 are substantially devoid of the additives 406 and form lower conductance portions 410. A similar sequence of operations as set forth in FIG. 4 can be carried out on surfaces on different sides of the patterned transparent conductor 400, thereby resulting in multiple-sided (e.g., two-sided) patterning. Certain aspects of the method of FIG. 4 and the patterned transparent conductor 400 can be similarly implemented as described above for FIG. 3, and those aspects are repeated.

Other embodiments for direct patterning are contemplated. For example, to reduce an optical contrast between higher conductance and lower conductance portions, a material can be disposed or included in the lower conductance portions to sufficiently match optical characteristics of surface-embedded additives in the higher conductance portions. In such manner, the higher and lower conductance portions can yield low visibility patterning, while an electrical contrast is maintained between the higher and lower conductance portions. By sufficiently matching optical characteristics of the higher and lower conductance portions, these portions can be rendered substantially visually indistinguishable or undetectable to the human eye. The extent to which a patterning of the higher and lower conductance portions is visually indistinguishable can be evaluated, for example, across a group of normally sighted human subjects (e.g., in the young to middle adult age range) and under photopic conditions. In some embodiments, the patterning of the higher and lower conductance portions can be deemed substantially visually indistinguishable if the patterning is undetected by at least about 90% of the human subjects, such as at least about 93%, at least about 95%, at least about 97%, at least about 98%, at least about 99%, or more.

For example, lower conductance portions can include additives that do not readily form a percolating network, but have optical characteristics (e.g., haze, transmittance, absorbance, and reflectance) that closely match optical characteristics of a percolating network in higher conductance portions of a patterned transparent conductor. Examples of additives for the lower conductance portions include nanoparticles (or other spheroidal structures having an aspect ratio less than about 3) formed of non-conductive or lower-conductivity materials, or nanowires (or other elongated structures) that form a non-percolating network because of nanowire geometry or because of surface treatment. Examples of surface treatments for reducing or degrading electrically conductivity of otherwise conductive nanowires include silane-based materials such as vinyl triethoxysilane and aminopropyl triethoxysilane.

In some embodiments, a difference in transmittance values (e.g., absolute difference between transmittance values each expressed as a percentage) of the higher and lower conductance portions can be no greater than about 10%, such as no greater than about 5%, no greater than about 4%, no greater than about 3%, no greater than about 2%, no greater than 1%, or no greater than 0.5%, and down to about 0.1%, down to about 0.01%, down to about 0.001%, or less, where the transmittance values can be expressed in terms of human vision or photometric-weighted transmittance, transmittance at a given wavelength or range of wavelengths in the visible range, such as about 550 nm, solar-flux weighted transmittance, transmittance at a given wavelength or range of wavelengths in the infrared range, or transmittance at a given wavelength or range of wavelengths in the ultraviolet range. In some embodiments, a difference in haze values (e.g., absolute difference between haze values each expressed as a percentage) of the higher and lower conductance portions can be no greater than about 5%, such as no greater than about 4%, no greater than about 3%, no greater than about 2%, no greater than about 1%, no greater than 0.5%, or no greater than 0.1%, and down to about 0.05%, down to about 0.01%, down to about 0.001%, or less, where the haze values can be expressed as human vision or photometric-weighted haze, haze at a given wavelength or range of wavelengths in the visible range, such as about 550 nm, solar-flux weighted haze, haze at a given wavelength or range of wavelengths in the infrared range, or haze at a given wavelength or range of wavelengths in the ultraviolet range. In some embodiments, a difference in absorbance values (e.g., absolute difference between absorbance values each expressed as a percentage) of the higher and lower conductance portions can be no greater than about 10%, such as no greater than about 5%, no greater than about 4%, no greater than about 3%, no greater than about 2%, no greater than 1%, or no greater than 0.5%, and down to about 0.1%, down to about 0.01%, down to about 0.001%, or less, where the absorbance values can be expressed as human vision or photometric-weighted absorbance, absorbance at a given wavelength or range of wavelengths in the visible range, such as about 550 nm, solar-flux weighted absorbance, absorbance at a given wavelength or range of wavelengths in the infrared range, or absorbance at a given wavelength or range of wavelengths in the ultraviolet range. In some embodiments, a difference in reflectance values (e.g., absolute difference between diffuse reflectance values each expressed as a percentage) of the higher and lower conductance portions can be no greater than about 10%, such as no greater than about 5%, no greater than about 4%, no greater than about 3%, no greater than about 2%, no greater than 1%, or no greater than 0.5%, and down to about 0.1%, down to about 0.01%, down to about 0.001%, or less, where the reflectance values can be expressed as human vision or photometric-weighted reflectance, reflectance at a given wavelength or range of wavelengths in the visible range, such as about 550 nm, solar-flux weighted reflectance, reflectance at a given wavelength or range of wavelengths in the infrared range, or reflectance at a given wavelength or range of wavelengths in the ultraviolet range.

For example, using a surface embedding formulation targeted to a substrate or a coating, nanowires (or another conductive or semiconductive additive) can be printed and embedded where conductivity is desired, and a non-conductive filler can be printed and embedded where conductivity is not desired. Reversing this order of embedding is also contemplated. In this example, the filler can render the conductive nanowire pattern to be substantially invisible, by matching optical characteristics of the nanowires while remaining non-conductive. In place of, or in conjunction with, the non-conductive filler, nanowires (or another conductive or semiconductive additive) that are bulk incorporated in a suitable coating material can be printed where conductivity is not desired. Bulk incorporation inhibits junction formation of nanowires for reduced conductivity, while the presence of the non-conductive, bulk incorporated nanowires can match optical characteristics of the conductive embedded nanowires.

As another example, using a surface embedding formulation targeted to a substrate or a coating, nanowires (or another conductive or semiconductive additive) can be printed and embedded where conductivity is desired. Using another formulation that still allows embedding but inhibits conductivity, nanowires (or another conductive or semiconductive additive) can be printed and embedded where conductivity is not desired. For example, the latter formulation can include a binder or filler that disrupts junction formation between nanowires, or can inhibit junction formation by promoting deep embedding of the nanowires below a surface. Reversing this order of embedding is also contemplated. In this example, the presence of nanowires in both the higher conductance and lower conductance regions can render the conductive nanowire pattern to be substantially invisible, because the lower conductance embedded nanowires match optical characteristics of the higher conductance embedded nanowires while remaining non-conductive. In some embodiments, a loading level of nanowires in the lower conductance portions can be at least about $1/20$ of a loading level of nanowires in the higher conductance portions, such as at least about $1/10$, at least about $1/5$, at least about $1/2$, at least about $6/10$, at least about $7/10$, at least about $8/10$, or at least about $9/10$, and up to, or somewhat greater than, the loading level in the higher conductance portions.

As another example, using a surface embedding formulation targeted to a substrate or a coating, a non-conductive filler can be coated and embedded substantially uniformly, and then, using the same or a different surface embedding formulation, nanowires (or another conductive or semiconductive additive) can be printed and embedded where conductivity is desired. Reversing this order of embedding is also contemplated. Here, the resulting conductive nanowire pattern can remain visible to some extent, although the presence of non-conductive filler in gaps between or interspersed within the pattern can reduce an optical contrast between higher and lower conductance portions by avoiding a large step-like optical transition between the portions. Further improvements in optical contrast can be achieved by smoothing the optical transition away from a step-like transition, such as according to a horizontal or lateral gradient profile.

As another example, using a surface embedding formulation targeted to a substrate or a coating, nanowires (or another conductive or semiconductive additive) can be coated and embedded substantially uniformly at a loading level below the percolation threshold. Then, using the same or a different surface embedding formulation, additional nanowires (or another conductive or semiconductive additive) can be printed and embedded in portions where conductivity is desired, yielding a combined loading level of nanowires above the percolation threshold in those portions. Reversing this order of embedding is also contemplated. Here, the resulting conductive nanowire pattern can remain visible to some extent, although the presence of nanowires in gaps between or interspersed within the pattern can reduce an optical contrast between higher and lower conductance portions by avoiding a large step-like optical transition between the portions. Further improvements in optical contrast can be achieved by smoothing the optical transition away from a step-like transition, such as according to a horizontal or lateral gradient profile.

As another example, using a formulation that still allows embedding in a substrate or a coating but inhibits conductivity, nanowires (or another conductive or semiconductive additive) can be coated and embedded substantially uniformly at a loading level below the percolation threshold. Then, using a surface embedding formulation targeted to the substrate or the coating, nanowires (or another conductive or semiconductive additive) can be printed and embedded in portions where conductivity is desired, yielding a combined loading level of nanowires above the percolation threshold in those portions. Reversing this order of embedding is also contemplated. Here, the resulting conductive nanowire pattern can remain visible to some extent, although the presence of nanowires in gaps between or interspersed within the pattern can reduce an optical contrast between higher and lower conductance portions by avoiding a large step-like optical transition between the portions. Further improvements in optical contrast can be achieved by smoothing the optical transition away from a step-like transition, such as according to a horizontal or lateral gradient profile.

As a further example, instead of printing, a physical mask, a patterned photoresist layer, or other type of mask can be placed adjacent to a surface of a substrate or a coating. The mask has a pattern that covers selected portion or portions of the surface while leaving other portions uncovered. A dispersion including additives and an embedding solvent that swells or softens the surface is applied onto the covered and uncovered portions. Additives are embedded into portions that are left unmasked to form higher conductance portions whereas additives are not embedded (or inhibited from embedding) into portions that are covered by the mask, thereby leaving these latter portions of lower conductance. The mask can be bonded to the underlying surface, such as by an adhesive, to inhibit the embedding dispersion from penetrating underneath the mask. The physical mask also can be applied under pressure onto the surface for the aforementioned purpose. The mask can be flat or can be in the form of a roller.

According to some embodiments, patterning of transparent conductors can be carried out without relying on printing of additives or other spatially selective application of additives to a host material. As noted above, binders and fillers used in certain printing techniques sometimes can negatively affect electrical and optical characteristics of resulting embedded additives, such as by inhibiting formation of a percolating network. Advantageously, some embodiments can achieve patterning through a substantially uniform application of additives to a host material, thereby decoupling the application of additives from binders and fillers used in certain printing techniques.

In some embodiments, patterning of transparent conductors can be carried out by applying a spatially selective or varying treatment to inhibit percolation over portion or portions where electrical conductivity is not desired. In physical inhibition of percolation, additives embedded in lower conductance portions are physically or otherwise treated to inhibit effective contact with one another to form a percolating network, whereas additives embedded in higher conductance portions can contact one another, resulting in a percolating network over the higher conductance portions. Physical inhibition of percolation can involve physically degrading junctions between additives, physically degrading the additives themselves, such as through partial or complete removal, or both, and can be accomplished by subtractive processes, such as laser ablation, corona arc discharge, milling, or any combination thereof. In chemical inhibition of percolation, additives embedded in lower conductance portions are exposed to a chemical agent or otherwise chemically treated to inhibit or inactivate electron conduction across different additives in a network. Chemical inhibition of percolation can involve chemically degrading junctions between additives, chemically degrading the additives themselves, such as by dissolving the additives or converting the additives into structures with higher resistivity, or both, and can be accomplished by subtractive processes, such as oxidation or sulfidation, by introducing insulating molecular ligands between the additives to inhibit electron conduction across junctions, or any combination thereof. It will be understood that the classification of "physical" and "chemical" inhibition of percolation is for ease of presentation, and that certain treatments can inhibit percolation through a combination of physical and chemical degradation of electrical conductivity.

In some embodiments, embedded additives can be selectively removed. For example, a laser can be rastered over a surface with embedded additives to ablate away additives in a spatially selective or varying manner, forming lower conductance portion or portions. Ablation can be partial or full. For example, a dispersion including additives and an embedding solvent can be applied substantially uniformly over a surface of a substrate or a coating, thereby swelling or softening the surface to embed the additives into the surface. Selected portion or portions of the surface with unpatterned, embedded additives can be ablated to form a pattern of higher and lower conductance portions. For applications for which low visibility or invisibility of patterns is desired, partial laser ablation can be performed, so as to electrically pattern the materials with reduced optical contrast. Advantageously, although additives can be ablated sufficiently to render them electrically isolated in the lower conductance portions, the resulting patterns are largely or substantially indistinguishable or undetectable.

In some embodiments, a patterned transparent conductor can be formed through spatially selective or varying application of an etchant, such as through a mask or by printing. Etching can be partial or full. For example, an unpatterned transparent conductor can be formed by embedding nanowires into a surface of a substrate or a coating. Selected portions of the surface can be masked, and the resulting masked surface can be subjected to a selective chemical etch to remove additives from unmasked portions, forming lower conductance portions. Masked portions of the surface are protected from etching by the mask and remain conductive. For applications for which low visibility or invisibility of patterns is desired, an etchant can have the effect of degrading or reducing electrical conductivity of additives in etched portions, but leaving the etched portions largely or substantially optically unchanged as viewed by the human eye. This effect can be attained, for example, by partially degrading the additives, by disrupting junctions between the additives, or both. A rinsing operation can be employed to remove the etchant, but can also be used to neutralize the etchant during the rinse, so as not to damage parts of the surface which are intended to remain un-etched.

An etchant can be an acid, a base, or a largely neutral solution (e.g., a pH in the range of about 5.5 to about 8.5 or about 5.5 to about 7 encompassing weak acids and weak bases), and can be in a liquid state, a gaseous state, or a both. Examples of etchants include oxidants, which can refer to a variety of materials that remove electrons from another reactant in a redox chemical reaction. In the case of silver nanowires or other types of conductive or semiconductive additives, a variety of oxidants, which react with silver (or another material forming the additives) can be used, such as oxygen, ozone, hydrogen peroxide, inorganic peroxide, polyether oxide, hypochlorite, hypohalite compounds, and so forth. In the case of hydrogen peroxide, chemical etching of silver-containing additives can proceed according to the following reaction scheme: $2Ag+H_2O_2 \rightarrow Ag_2O+H_2O$. In the case of printing, a printable etchant (e.g., a screen-printable etchant) can be water-based (i.e., aqueous) and can be formulated based on hydrogen peroxide (or another oxidant or combination of oxidants), along with one or more of (1) a viscosity enhancer or aid for printing, (2) a surfactant or a wetting agent, and (3) an anti-foaming or anti-bubbling agent. Since both hydrogen peroxide and water are high surface tension liquids, the formulation can be designed to allow uniform printing over a hydrophobic surface, which allows uniform degrading of electrical conductivity over selected portions of the surface. Chemical etching can be partial or full by, for example, adjusting the formulation of an etchant (e.g., acidity or type of oxidant), adjusting the application conditions (e.g., exposure duration to the etchant), or both.

FIG. 5 illustrates a manufacturing method of a patterned transparent conductor 500, according to an embodiment of the invention. As shown in FIG. 5, an active substrate 502 is provided. Next, additives 504 and an embedding fluid (not shown) can be applied to the substrate 502 in a substantially uniform manner via one-step embedding or two-step embedding, resulting in the additives 504 becoming partially or fully embedded into a surface of the substrate 502. Then, an etchant 506 can be applied to the substrate 502 with the surface-embedded additives 504 in a spatially selective or varying manner, such as by screen printing or through the use of a mask. In this embodiment, the etchant 506 is applied so as to largely or substantially remove additives 504 over portions exposed to the etchant 506, forming lower conductance portions 510. Portions that are not exposed to the etchant 506 remain conductive, forming higher conductance portions 508. Optionally, a cleaning or rinsing operation can be carried out to remove any remaining etchant 506. In place of, or in conjunction with, etching, another subtractive process can be used, such as laser ablation, corona arc discharge, milling, or a combination thereof. Certain aspects of the method of FIG. 5 and the patterned transparent conductor 500 can be similarly implemented as described above for FIG. 3 through FIG. 4, and those aspects are repeated.

FIG. 6 illustrates a manufacturing method of a patterned transparent conductor 600, according to another embodiment of the invention. As shown in FIG. 6, a substrate 602 can be provided, where the substrate 602 can be either active or inactive, and an active, unpatterned coating 604 is applied on top of the substrate 602. Next, additives 606 and an embedding fluid (not shown) can be applied to the coating 604 in a substantially uniform manner via one-step embedding or two-step embedding, resulting in the additives 606 becoming partially or fully embedded into a surface of the coating 604. Then, an etchant 608 can be applied to the coating 604 with the surface-embedded additives 606 in a spatially selective or varying manner, such as by screen printing or through the use of a mask. In this embodiment, the etchant 608 is applied so as to largely or substantially remove additives 606 over portions exposed to the etchant 608, forming lower conductance portions 612. Portions that are not exposed to the etchant 608 remain conductive, forming higher conductance portions 610. In place of, or in conjunction with, etching, another subtractive process can be used, such as laser ablation, corona arc discharge, milling, or a combination thereof. Certain aspects of the method of FIG. 6 and the patterned transparent conductor 600 can be similarly implemented as described above for FIG. 3 through FIG. 5, and those aspects are repeated.

FIG. 7 illustrates a manufacturing method of a patterned transparent conductor 700, according to an embodiment of the invention. As shown in FIG. 7, an active substrate 702 is provided. Next, additives 704 and an embedding fluid (not shown) can be applied to the substrate 702 in a substantially uniform manner via one-step embedding or two-step embedding, resulting in the additives 704 becoming partially or fully embedded into a surface of the substrate 702. Then, an etchant 706 can be applied to the substrate 702 with the surface-embedded additives 704 in a spatially selective or varying manner, such as by screen printing or through the use of a mask. To obtain low visibility patterning, the etchant 706 is applied so as to partially remove or degrade additives 704 over portions exposed to the etchant 706, forming lower conductance portions 710. For example, additives 704 in the lower conductance portions 710 can be etched sufficiently to render them electrically isolated in the lower conductance portions 710, without fully etching away the additives 704 from those portions 710. Portions along the substrate 702 that are not exposed to the etchant 706 remain conductive, forming higher conductance portions 708. In place of, or in conjunction with, etching, another subtractive process can be used, such as laser ablation, corona arc discharge, milling, or a combination thereof. Certain aspects of the method of FIG. 7 and the patterned transparent conductor 700 can be similarly implemented as described above for FIG. 3 through FIG. 6, and those aspects are repeated.

FIG. 8 illustrates a manufacturing method of a patterned transparent conductor 800, according to another embodiment of the invention. As shown in FIG. 8, an inactive substrate 802 can be provided, although the substrate 802 also can be active in another embodiment, and an active, unpatterned coating 804 is applied on top of the substrate 802. Next, additives 806 and an embedding fluid (not shown) can be applied to the coating 804 in a substantially uniform manner via one-step embedding or two-step embedding, resulting in the additives 806 becoming partially or fully embedded into a surface of the coating 804. Then, an etchant 808 can be applied to the coating 804 with the surface-embedded additives 806 in a spatially selective or varying manner, such as by screen printing or through the use of a mask. To obtain low visibility patterning, the etchant 808 is applied so as to partially remove or degrade additives 806 over portions exposed to the etchant 808, forming lower conductance portions 812. For example, additives 806 in the lower conductance portions 812 can be etched sufficiently to render them electrically isolated in the lower conductance portions 812, without fully etching away the additives 806 from those portions 812. Portions along the coating 804 that are not exposed to the etchant 808 remain conductive, forming higher conductance portions 810. In place of, or in conjunction with, etching, another subtractive process can be used, such as laser ablation, corona arc discharge, milling, or a combination thereof. Certain aspects of the method of FIG. 8 and the patterned transparent conductor 800 can be similarly implemented as described above for FIG. 3 through FIG. 7, and those aspects are repeated.

According to some embodiments, patterning of a transparent conductor can be carried out by implementing an embedding depth offset across a horizontal or laterally extending direction along the transparent conductor, such that different portions along the transparent conductor include conductive or semiconductive additives that are surface embedded to varying extents. Typically, deeply embedding beneath a surface such that additives are enveloped and covered by a non-conductive host material can inhibit electrical conductivity across a network of the additives, whereas embedding partially into the surface can enhance network percolation and electrical conductivity. Also, little or no embedding, such as in the case of surface-deposited additives, can inhibit junction formation and result in reduced electrical conductivity. By adjusting or tuning embedding depth in a spatially varying or selective manner across a transparent conductor, lower conductance portions can be formed with additives deeply embedded into a surface or remaining on the surface, and higher conductance portions can be formed in which the additives are partially embedded into a surface.

In some embodiments, a substrate or a coating can be converted in a spatially varying or selective manner to render certain portions more or less susceptible to surface embedding. Upon surface embedding, an embedding depth offset is obtained across the substrate or the coating, such that electrically conductive or semiconductive additives percolate and can carry current in some portions but not in other portions. In general, the process of conversion can include spatially selective application of an electromagnetic radiation (e.g., UV, microwave radiation, or laser radiation), an electric field, ozone, a flame treatment, a chemical radical, a gas, a plasma treatment, a plasma spray, a plasma oxidation, chemical reduction (e.g., a chemical reducing atmosphere), chemical oxidation (e.g., a chemical oxidizing atmosphere), vapor, a chemical precursor, an acid, a base, a cross-linking agent, an etchant, or any combination thereof. Because additives can be present in both higher and lower conductance portions at substantially the same or similar loading levels (albeit with different depths of embedding), the higher conductance portions can be largely or substantially indistinguishable from the lower conductance portions. For example, an embedding solvent, corona treatment, UV ozone treatment, or deposition of a material can be carried out on certain portions of a substrate or a coating to render those portions more susceptible to embedding, thereby promoting a larger extent of embedding such that additives in those portions do not form a percolation network.

Spatial patterning of higher and lower conductance portions of an additive network can involve the use of a physical mask, a photomask, a stencil, or the like, which can be positioned in front of a conversion source, in front of a substrate or a coating, in contact with the substrate or the coating, or on a reverse side of the substrate or the coating opposite to the conversion source.

In some embodiments, conversion of a substrate or a coating can occur before deposition of additives. In such embodiments, selected spatial portions of the substrate or the coating can be converted to control the degree of embedding or to control the morphology of an additive network such that converted portions allow electron conduction whereas untreated portions do not allow electron conduction (or allow conduction to a low degree). Alternatively, selected portions of the substrate or the coating can be converted to spatially control the degree of embedding or the morphology of an additive network such that converted portions do not allow electron conduction (or allow conduction to a low degree) whereas untreated portions allow electron conduction.

In other embodiments, conversion of a substrate or a coating can occur after deposition of additives. In such embodiments, additives can be surface-deposited in a substantially uniform manner over the substrate or the coating. Next, surface embedding can be performed by printing an embedding fluid over portions where conductivity is desired. The embedding fluid promotes embedding of the additives to permit contact and percolation between the additives. Alternatively, or in conjunction, surface embedding can be performed by printing an embedding fluid over portions where conductivity is not desired. The embedding fluid promotes embedding of the additives to inhibit contact and percolation between the additives, such as by over-embedding the additives beneath a surface, by over-coating the individual additives with an insulating material, or both. Another option involves surface depositing additives substantially uniformly over a substrate or a coating, and then convert selected portions where conductivity is desired. The conversion itself can impart conductivity, or can be followed with an embedding fluid treatment (e.g., liquid or vapor) or heat treatment. Yet another option involves surface depositing additives substantially uniformly over a substrate or a coating, and then convert selected portions where conductivity is not desired. The conversion can degrade or reduce conductivity by itself, or can be followed by another suitable treatment for such purpose.

Figure 9:
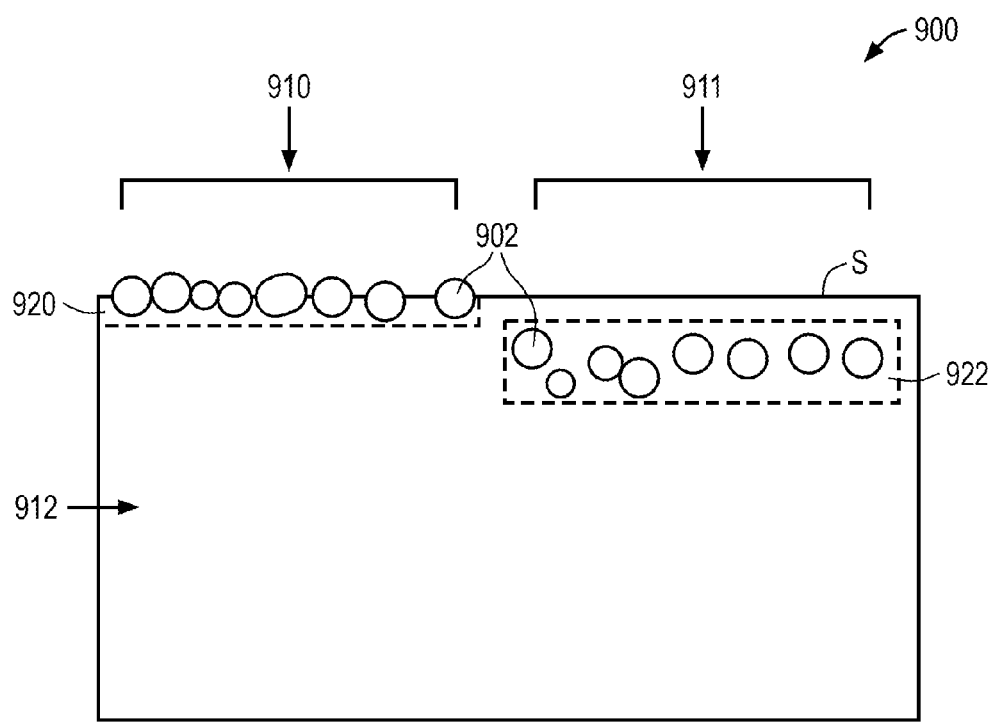
FIG. 9 illustrates a cross section of a patterned transparent conductor including additives that are embedded to varying depths into an embedding surface S of a host material, according to an embodiment of the invention.

FIG. 9 illustrates a cross section of a patterned transparent conductor 900 including additives 902 that are embedded to varying depths into an embedding surface S of a host material 912, according to an embodiment of the invention. Additives 902 in one portion 910 are surface conductive and are partially embedded into the embedding surface S and partially exposed at the embedding surface S. Additives 902 in an adjacent portion 911 are more deeply embedded beneath the surface S and are rendered non-conductive. As shown in FIG. 9, the additives 902 in the higher conductance portion 910 are localized within an embedded region 920 of the host material 912, and the embedded region 920 is relatively thin and is adjacent to the embedding surface S. The additives 902 in the lower conductance portion 911 are localized within an embedded region 922 of the host material 912, and the embedded region 922 is relatively thick and is below and spaced apart from the embedding surface S. A thickness of the embedded region 922 can be at least about 1.1 times a thickness of the embedded region 920, such as at least about 1.2 times, at least about 1.5 times, at least about 2 times, at least about 2.5 times, or at least about 3 times, and up to about 5 times, up to about 10 times, or more. A surface coverage of the additives 902 in the higher conductance portion 910 can be at least about 25%, such as at least about 30%, at least about 40%, at least about 50%, at least about 60%, or at least about 75%, and up to about 90%, up to about 95%, or up to about 100%, while a surface coverage of the additives 902 in the lower conductance portion 911 can be below 25%, such as up to about 20%, up to about 15%, up to about 10%, up to about 5%, or up to about 3%, and down to about 2%, down to about 1%, or up to about 0%. Although FIG. 9 illustrates embedding depth offset, it is also contemplated that the additives 902 in the higher and lower conductance portions 910 and 911 can be embedded to the same or similar depth relative to the embedding surface S, but subjected to chemical or other inhibition of percolation as explained above.

Figure 10:
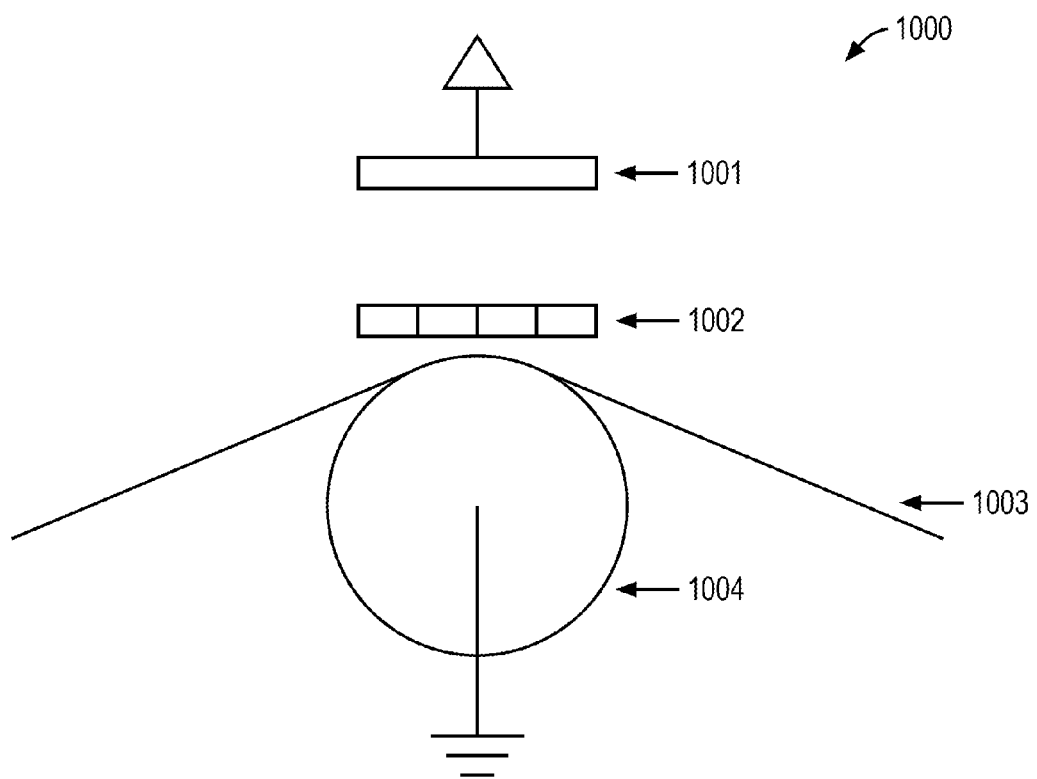
FIG. 10 through FIG. 12 illustrate roll-to-roll techniques that use corona treatment, according to embodiments of the invention.

A variety of techniques can be used for forming transparent conductors via embedding depth offset. FIG. 10 illustrates a roll-to-roll technique that uses corona treatment, according to an embodiment of the invention. In FIG. 10, a roll-to-roll corona treatment device 1000 includes a corona electrode 1001, which can be connected to a high voltage generator (not shown). The corona electrode 1001 is mounted in a spaced relationship to a ground electrode 1004 that acts as a roller conveying a film web 1003. A capacitance is induced between the corona electrode 1001 and the ground electrode 1004. A stencil or mask 1002 is placed between the two electrodes 1001 and 1004 to allow selective corona treatment of a surface of the web 1003 with a high voltage arc discharge from a corona or plasma induced between the electrodes 1001 and 1004. A stencil pattern can be any arbitrary pattern along a longitudinal direction of the film web 1003, a transverse direction, or any other geometry. The stencil 1002 can be located at various distances between the corona electrode 1001 and the film web 1003 with air or another dielectric material in between. The stencil 1002 can be formed of any suitable material that can effectively mask off certain portions for which corona treatment is not desired. Ozone, oxidants, or other chemical agents also can be introduced facilitate surface treatment. The stencil 1002 can be moving or stationary. In place of, or in conjunction with, embedding depth offset, the roll-to-roll corona treatment device 1000 can be used to obtain patterning via physical or chemical inhibition of percolation.

Figure 11:
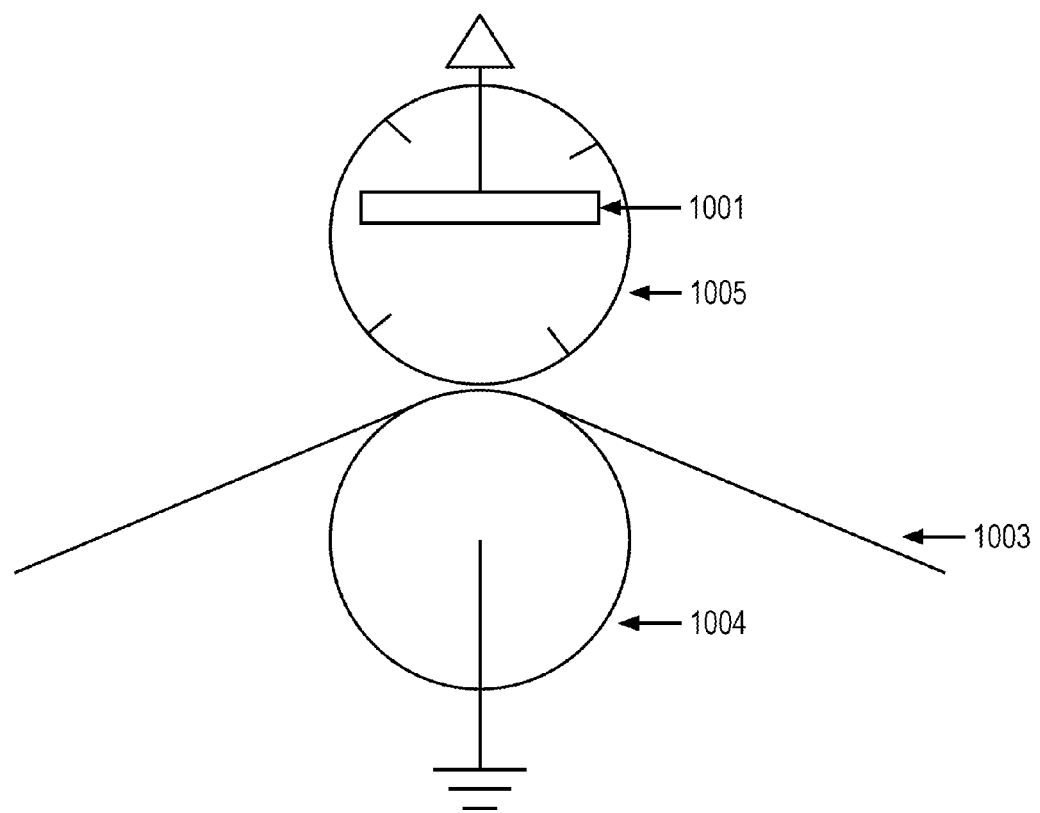
Figure 12:
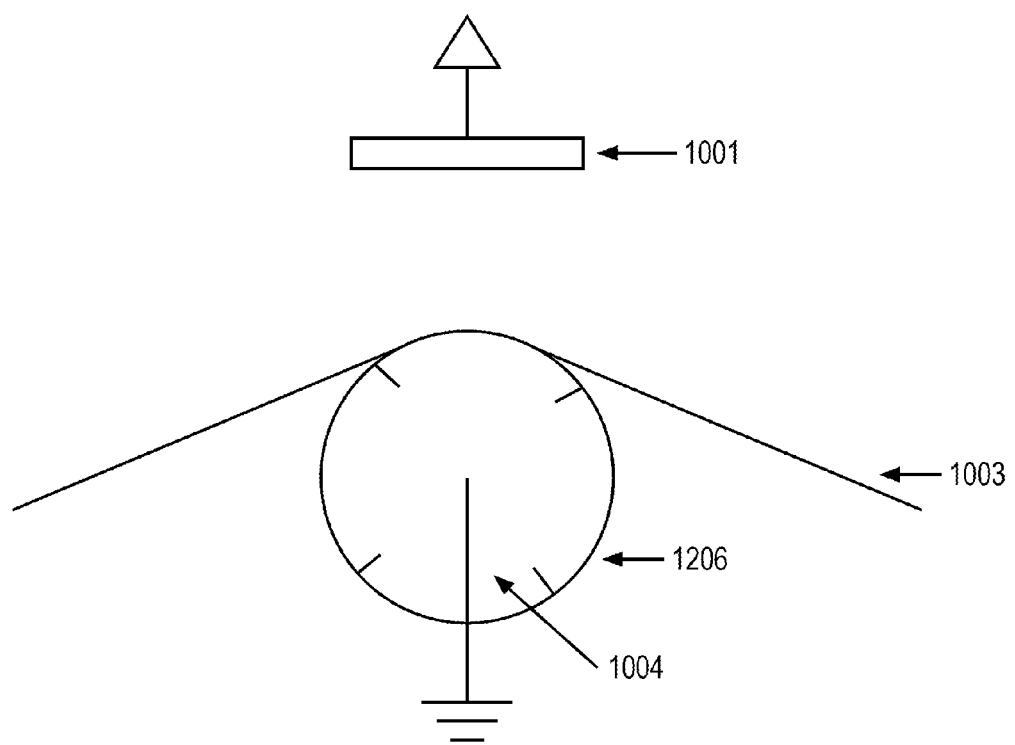

FIG. 11 illustrates a roll-to-roll technique similar to that shown in FIG. 10, in which a stencil or mask 1105 is in the form of a roller that houses the corona electrode 1001, or is otherwise disposed between the corona electrode 1001 and the surface of the film web 1003. In another embodiment, illustrated in FIG. 12, a stencil or mask 1206 is located behind the film web 1003 and between the film web 1003 and the ground electrode 1004. The stencil 1206 in this embodiment can be formed of an electrically conductive material to attract corona arc discharges. The corona arc discharges can selectively treat portions of the film web 1003 directly above patterned conductors on a roller below.

FIG. 13 illustrates a manufacturing method of a patterned transparent conductor 1300, according to an embodiment of the invention. As shown in FIG. 13, an active substrate 1302 can be provided. Next, an over-active inducing agent 1304 can be applied to the substrate 1302 in a spatially selective or varying manner, such as by screen printing or through the use of a mask. By "over-active inducing," it will be understood that agent 1304 affects or renders the substrate 1302 susceptible to an extent of embedding that inhibits junction formation and electrical percolation, such as by over-embedding beneath a surface of the substrate 1302. For example, in the case of a polycarbonate film or sheet as the substrate 1302, the over-active inducing agent 1304 can include cyclohexanone or another embedding fluid having a high solvency for the substrate 1302. Optionally, a cleaning or rinsing operation can be carried out to remove any remaining over-active inducing agent 1304. Then, additives 1306 and an embedding fluid (not shown) can be applied to the substrate 1302 in a substantially uniform manner via one-step embedding or two-step embedding, resulting in higher conductance portions 1308 with the partially embedded additives 1306 and lower conductance portions 1310 with the over-embedded additives 1306. Certain aspects of the method of FIG. 13 and the patterned transparent conductor 1300 can be similarly implemented as described above for FIG. 3 through FIG. 12, and those aspects are repeated. Another embodiment can be implemented in a similar manner as shown in FIG. 13, in which the processing operations are carried out over an active coating that is on top of a substrate, which can be either active or inactive.

FIG. 14 illustrates a manufacturing method of a patterned transparent conductor 1400, according to an embodiment of the invention. As shown in FIG. 14, an active substrate 1402 can be provided. Next, the substrate 1402 is treated in a spatially selective or varying manner, such as using plasma, corona, or UV ozone treatment, to render over-active certain portions of the substrate. By "over-active," it will be understood that the spatially selective treatment affects or renders the substrate 1402 susceptible to an extent of embedding that inhibits junction formation and electrical percolation, such as by over-embedding beneath a surface of the substrate 1402. The spatially selective treatment can be carried out through the use of a mask 1404. Then, additives 1406 and an embedding fluid (not shown) can be applied to the substrate 1402 in a substantially uniform manner via one-step embedding or two-step embedding, resulting in higher conductance portions 1408 with the partially embedded additives 1406 and lower conductance portions 1410 with the over-embedded additives 1406. Certain aspects of the method of FIG. 14 and the patterned transparent conductor 1400 can be similarly implemented as described above for FIG. 3 through FIG. 13, and those aspects are repeated. Another embodiment can be implemented in a similar manner as shown in FIG. 14, in which the processing operations are carried out over an active coating that is on top of a substrate, which can be either active or inactive.

FIG. 15 illustrates a manufacturing method of a patterned transparent conductor 1500, according to an embodiment of the invention. As shown in FIG. 15, an active substrate 1502 can be provided. Next, a patterned over-active layer 1504 can be formed on the substrate 1502 in a spatially selective or varying manner, such as by printing or through the use of a mask. By "over-active," it will be understood that the layer 1504 is sufficiently affected by, or is otherwise sufficiently susceptible to, an embedding fluid to permit an extent of embedding that inhibits junction formation and electrical percolation, such as by over-embedding beneath a surface of the substrate 1502. It will also be understood that "over-active" can be relative to a particular embedding fluid, such that the layer 1504 (or other host material) can be over-active relative to one embedding fluid, but active or inactive relative to another embedding fluid. For example, in the case of a polycarbonate film or sheet as the substrate 1502, the over-active layer 1504 can be a layer of polymethyl methacrylate that has greater solubility in, or lesser solvent resistance towards, a particular embedding fluid. Then, additives 1506 and an embedding fluid (not shown) can be applied to the substrate 1502 and the over-active layer 1504 in a substantially uniform manner via one-step embedding or two-step embedding, resulting in higher conductance portions 1508 with the additives 1506 partially embedded into the substrate 1502 and lower conductance portions 1510 with the additives 1506 over-embedded into the layer 1504. Certain aspects of the method of FIG. 15 and the patterned transparent conductor 1500 can be similarly implemented as described above for FIG. 3 through FIG. 14, and those aspects are repeated. Another embodiment can be implemented in a similar manner as shown in FIG. 15, in which the processing operations are carried out over an active coating that is on top of a substrate, which can be either active or inactive.

FIG. 16 illustrates a manufacturing method of a patterned transparent conductor 1600, according to an embodiment of the invention. As shown in FIG. 16, an active substrate 1602 can be provided. Next, a patterned inactive layer 1604 can be formed on the substrate 1602 in a spatially selective or varying manner, such as by printing or through the use of a mask. By "inactive," it will be understood that the layer 1604 is sufficiently unaffected by, or is otherwise immune to, an embedding fluid such that little or no surface embedding occurs in the layer 1604. It will also be understood that "inactive" can be relative to a particular embedding fluid, such that the layer 1604 (or other host material) can be inactive relative to one embedding fluid, but active or over-active relative to another embedding fluid. To obtain low visibility patterning, the layer 1604 includes nanoparticles, fillers, or another material dispersed therein for optical matching, such as liquid crystal materials, photochromic materials (e.g., silver halides for glass substrates or organic photochromic molecules such as oxazines, or naphthopyrans for polymer substrates). Then, additives 1606 and an embedding fluid (not shown) can be applied to the substrate 1602 and the inactive layer 1604 in a substantially uniform manner via one-step embedding or two-step embedding, resulting in higher conductance portions 1608 with the additives 1606 partially embedded into the substrate 1602 and lower conductance portions 1610 with the additives 1606 surface-deposited on the layer 1604. Optionally, a cleaning or rinsing operation can be carried out to remove the surface-deposited additives 1606, although at least some of the surface-deposited additives 1606 can be retained to tune an extent of optical matching between the higher and lower conductance portions 1608 and 1610. Certain aspects of the method of FIG. 16 and the patterned transparent conductor 1600 can be similarly implemented as described above for FIG. 3 through FIG. 15, and those aspects are repeated. Another embodiment can be implemented in a similar manner as shown in FIG. 16, in which the processing operations are carried out over an active coating that is on top of a substrate, which can be either active or inactive.

FIG. 17 illustrates a manufacturing method of a patterned transparent conductor 1700, according to an embodiment of the invention. As shown in FIG. 17, an active substrate 1702 can be provided. Next, a de-activating agent 1704 can be applied to the substrate 1702 in a spatially selective or varying manner, such as by screen printing or through the use of a mask. By "de-activating," it will be understood that the agent 1704 affects or renders the substrate 1702 sufficiently immune to an embedding fluid such that little or no surface embedding occurs over portions of the substrate 1702 exposed to the agent 1704. For example, the de-activating agent 1704 can include a cross-linking agent, which can be applied along with UV or heat treatment to cross-link certain portions of the substrate 1702 to inhibit surface embedding. As another example, the de-activating agent 1704 can include a de-wetting agent to inhibit wetting by an embedding fluid. Optionally, a cleaning or rinsing operation can be carried out to remove any remaining de-activating agent 1704. Then, additives 1706 and an embedding fluid (not shown) can be applied to the substrate 1702 in a substantially uniform manner via one-step embedding or two-step embedding, resulting in higher conductance portions 1708 with the additives 1706 partially embedded into the substrate 1702 and lower conductance portions 1710 with the additives 1706 surface-deposited on the substrate 1702. Optionally, a cleaning or rinsing operation can be carried out to remove the surface-deposited additives 1706, although at least some of the surface-deposited additives 1706 can be retained for optical matching between the higher and lower conductance portions 1708 and 1710. Certain aspects of the method of FIG. 17 and the patterned transparent conductor 1700 can be similarly implemented as described above for FIG. 3 through FIG. 16, and those aspects are repeated. Another embodiment can be implemented in a similar manner as shown in FIG. 17, in which the processing operations are carried out over an active coating that is on top of a substrate, which can be either active or inactive.

FIG. 18 illustrates a manufacturing method of a patterned transparent conductor 1800, according to an embodiment of the invention. As shown in FIG. 18, an active substrate 1802 can be provided. Next, a patterned inactive layer 1804 can be formed on the substrate 1802 in a spatially selective or varying manner, such as by printing or through the use of a mask. Then, additives 1806 and an embedding fluid (not shown) can be applied to the substrate 1802 and the inactive layer 1804 in a substantially uniform manner via one-step embedding or two-step embedding, resulting in higher conductance portions 1808 with the additives 1806 partially embedded into the substrate 1802 and lower conductance portions 1810 with the additives 1806 surface-deposited on the layer 1804. Optionally, a cleaning or rinsing operation can be carried out to remove the surface-deposited additives 1806, although at least some of the surface-deposited additives 1806 can be retained for optical matching between the higher and lower conductance portions 1808 and 1810. Certain aspects of the method of FIG. 18 and the patterned transparent conductor 1800 can be similarly implemented as described above for FIG. 3 through FIG. 17, and those aspects are repeated. Another embodiment can be implemented in a similar manner as shown in FIG. 18, in which the processing operations are carried out over an active coating that is on top of a substrate, which can be either active or inactive.

FIG. 19 illustrates a manufacturing method of a patterned transparent conductor 1900, according to an embodiment of the invention. As shown in FIG. 19, an inactive substrate 1902 can be provided. Next, a patterned active layer 1904 can be formed on the substrate 1902 in a spatially selective or varying manner, such as by printing or through the use of a mask. For example, in the case the substrate 1902 is formed of glass or a polymer having a high degree of crystallinity or cross-linking (e.g., polyethylene terephthalate), the active layer 1904 can be a layer of polymethyl methacrylate that has greater solubility in, or lesser solvent resistance towards, a particular embedding fluid. Then, additives 1906 and an embedding fluid (not shown) can be applied to the substrate 1902 and the active layer 1904 in a substantially uniform manner via one-step embedding or two-step embedding, resulting in higher conductance portions 1908 with the additives 1906 partially embedded into the layer 1904 and lower conductance portions 1910 with the additives 1906 surface-deposited on the substrate 1902. Optionally, a cleaning or rinsing operation can be carried out to remove the surface-deposited additives 1906, although at least some of the surface-deposited additives 1906 can be retained for optical matching between the higher and lower conductance portions 1908 and 1910. Certain aspects of the method of FIG. 19 and the patterned transparent conductor 1900 can be similarly implemented as described above for FIG. 3 through FIG. 18, and those aspects are repeated. Another embodiment can be implemented in a similar manner as shown in FIG. 19, in which the processing operations are carried out over an inactive coating that is on top of a substrate, which can be either active or inactive.

FIG. 20 illustrates a manufacturing method of a patterned transparent conductor 2000, according to an embodiment of the invention. As shown in FIG. 20, an inactive substrate 2002 can be provided. Next, an unpatterned active coating 2004 can be formed on the substrate 2002. For example, in the case the substrate 2002 is formed of glass or a polymer having a high degree of crystallinity or cross-linking, the active coating 2004 can be a coating of polymethyl methacrylate that has greater solubility in, or lesser solvent resistance towards, a particular embedding fluid. Next, a de-activating agent 2006 can be applied to the coating 2004 in a spatially selective or varying manner, such as by screen printing or through the use of a mask. For example, the de-activating agent 2006 can include a cross-linking agent, which can be applied along with UV or heat treatment to cross-link certain portions of the coating 2004 to inhibit surface embedding. As another example, the de-activating agent 2006 can include a de-wetting agent to inhibit wetting by an embedding fluid. Optionally, a cleaning or rinsing operation can be carried out to remove any remaining de-activating agent 2006. Then, additives 2008 and an embedding fluid (not shown) can be applied to the coating 2004 in a substantially uniform manner via one-step embedding or two-step embedding, resulting in higher conductance portions 2010 with the additives 2008 partially embedded into the coating 2004 and lower conductance portions 2012 with the additives 2008 surface-deposited on the coating 2004. Optionally, a cleaning or rinsing operation can be carried out to remove the surface-deposited additives 2008, although at least some of the surface-deposited additives 2008 can be retained for optical matching between the higher and lower conductance portions 2010 and 2012. Certain aspects of the method of FIG. 20 and the patterned transparent conductor 2000 can be similarly implemented as described above for FIG. 3 through FIG. 19, and those aspects are repeated. Another embodiment can be implemented in a similar manner as shown in FIG. 20, in which the processing operations are carried out over an inactive coating that is on top of a substrate, which can be either active or inactive.

Figure 21:
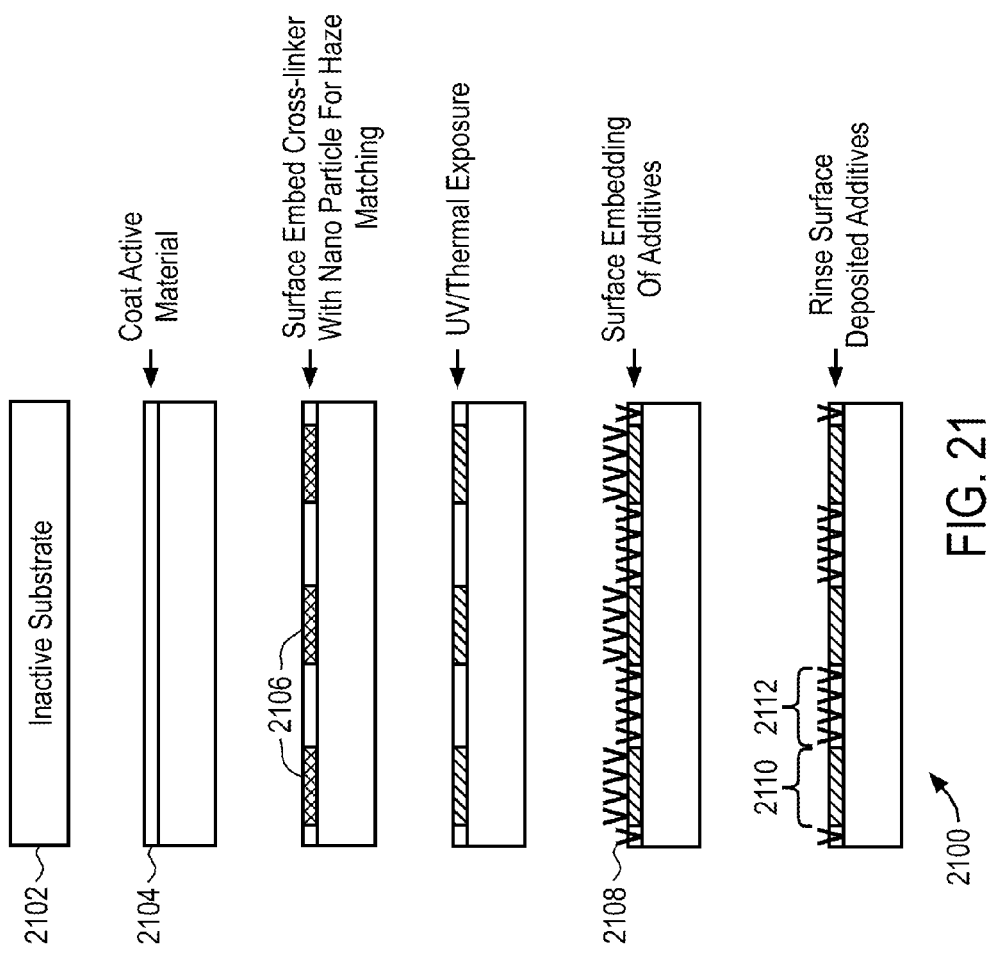
FIG. 21 illustrates a manufacturing method of a patterned transparent conductor, according to an embodiment of the invention.

FIG. 21 illustrates a manufacturing method of a patterned transparent conductor 2100, according to an embodiment of the invention. As shown in FIG. 21, an inactive substrate 2102 can be provided. Next, an unpatterned active coating 2104 can be formed on the substrate 2102. Next, a de-activating agent

2106 can be surface embedded into the coating 2104 in a spatially selective or varying manner, such as by printing or through the use of a mask. For example, the de-activating agent 2006 can include a cross-linking agent, which can be surface embedded along with nanoparticles, fillers, or another material for optical matching and low visibility patterning. Next, UV or heat treatment can be applied to cross-link certain portions of the coating 2104 to inhibit surface embedding. Then, additives 2108 and an embedding fluid (not shown) can be applied to the coating 2104 in a substantially uniform manner via one-step embedding or two-step embedding, resulting in higher conductance portions 2110 with the additives 2108 partially embedded into the coating 2104 and lower conductance portions 2112 with the additives 2108 surface-deposited on the coating 2104. Optionally, a cleaning or rinsing operation can be carried out to remove the surface-deposited additives 2108, although at least some of the surface-deposited additives 2108 can be retained to tune an extent of optical matching between the higher and lower conductance portions 2110 and 2112. Certain aspects of the method of FIG. 21 and the patterned transparent conductor 2100 can be similarly implemented as described above for FIG. 3 through FIG. 20, and those aspects are repeated. Another embodiment can be implemented in a similar manner as shown in FIG. 21, in which the processing operations are carried out over an inactive coating that is on top of a substrate, which can be either active or inactive.

Figure 22A:
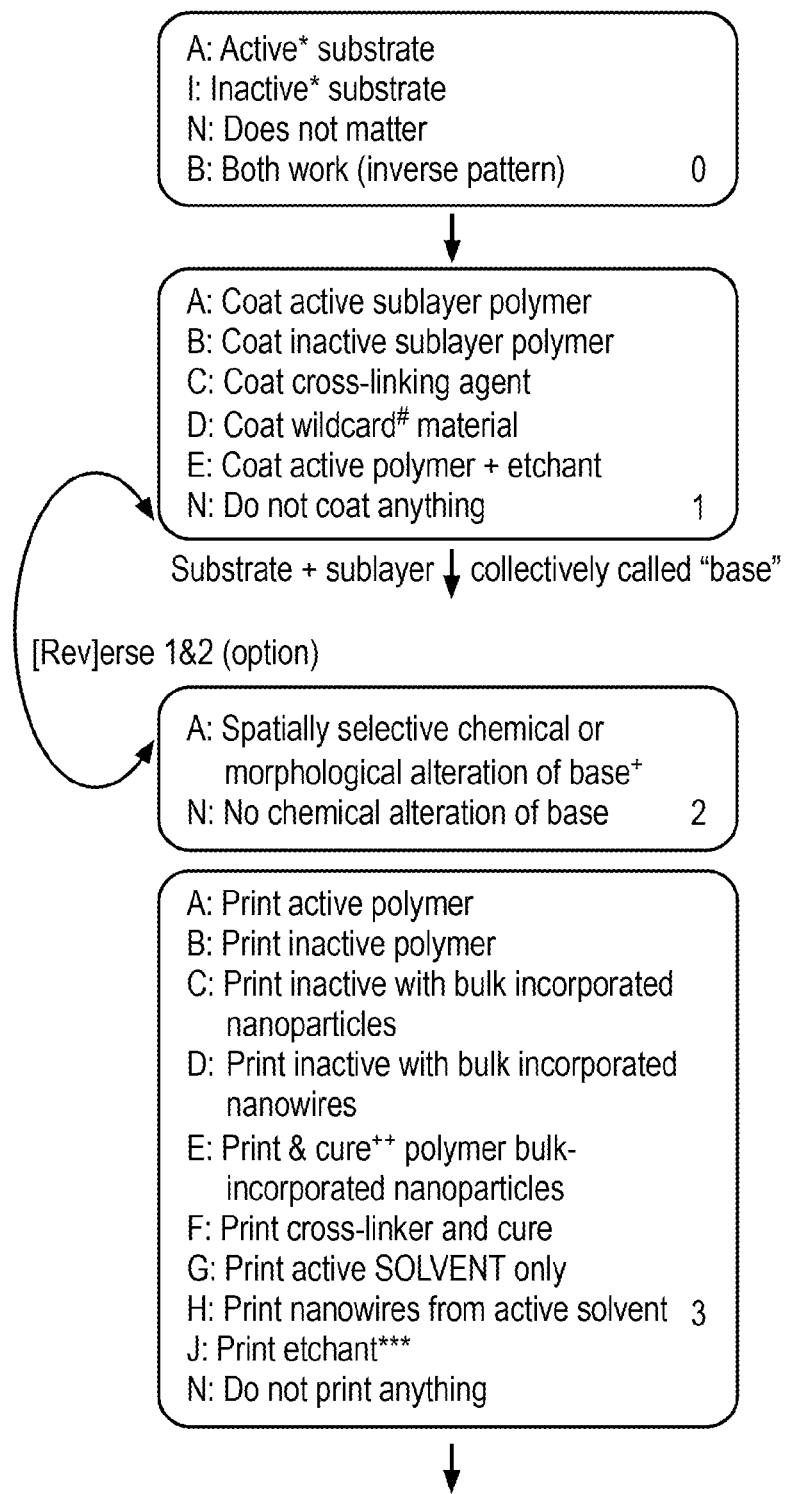
FIG. 22A through FIG. 22C illustrate various options of a generalized manufacturing method of a patterned transparent conductor, according to embodiments of the invention.
Figure 22B:
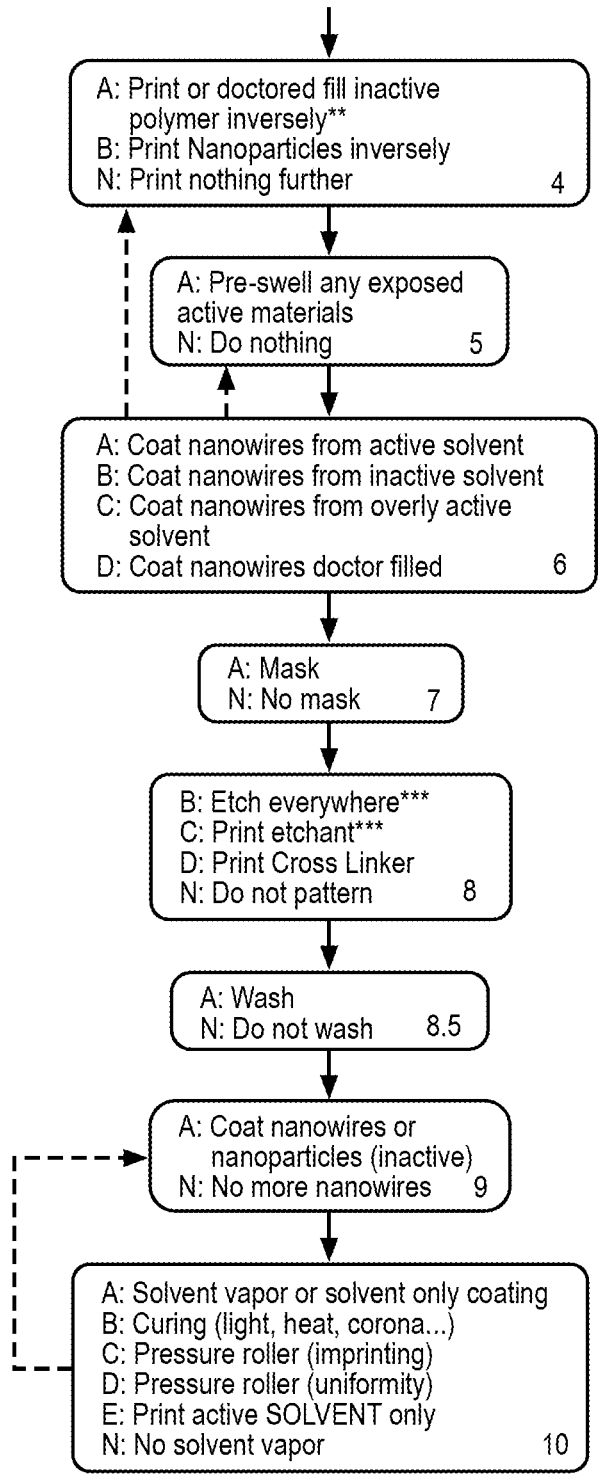
Figure 22C:
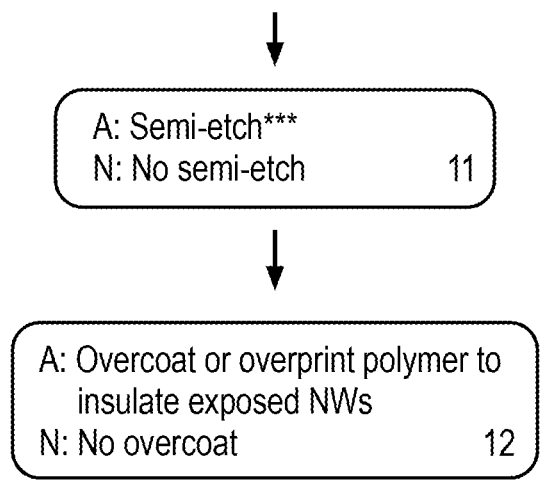

Various options of a generalized manufacturing method of a patterned transparent conductor are illustrated in FIG. 22A through FIG. 22C, according to embodiments of the invention. It is noted that certain stages in the method are optional, and each stage can be implemented in a number of different ways. Thus, various possible permutations of the method are illustrated in FIG. 22A through FIG. 22C, all of which are within the scope of embodiments herein.

Referring to FIG. 22A, the transparent conductor is formed starting from a substrate, as indicated in stage 0. The substrate can be active or inactive. For some embodiments (e.g., inverse patterning), both active and inactive substrate types can be used. In some embodiments, processing can be carried out regardless of the substrate type.

In stage 1, which is optional, the substrate can be coated in a substantially uniform manner with an active or inactive layer (e.g., a polymer layer or sub-layer), a cross-linking agent, a combination of an active layer and an etchant, or a material that can be referred as a "wildcard" material, such as one included for optical matching. Wildcard materials can include materials other than nanoparticles and nanowires that afford substantially the same or similar optical characteristics as silver nanowires. Examples of wildcard materials include liquid crystal materials or photochromic materials (e.g., silver halides for glass substrates or organic photochromic molecules such as oxazines or naphthopyrans for polymer substrates). Where the substrate is coated with an active or inactive layer, a combination of substrate and the layer is sometimes referred to as a "base".

In stage 2, the base can undergo an optional spatially selective chemical, physical, or other morphological conversion. Examples of such conversion include exposure of the base to a directed plasma source, depositing a cross-linking agent in a spatially selective manner followed by curing, or masking followed by broad exposure to a plasma source or a cross-linking agent. It is noted that the order of implementation of stages 1 and 2 can be reversed in some embodiments.

In stage 3, a patterned surface optionally can be formed, such as by masking or printing. The surface can be patterned by printing an active or inactive polymer. In some cases, the polymer that is printed can include bulk incorporated nanoparticles, nanowires, or other additives. In other cases, the polymer that is printed can include bulk incorporated nanoparticles, nanowires, or other additives, and can be cured. Curing can include cross-linking of a polymer (e.g., after adding a cross-linking agent or based on the formulation of an original polymer resin) as well as other hardening resulting in a substantially permanent configuration. In other cases, a substrate or a layer can be patterned by printing a solvent that is capable of softening or swelling a material of the substrate or the layer. In other cases, a pattern can be formed by printing nanowires from a solvent. In still other cases, the surface can be patterned by printing an etchant. The etchant can deactivate electrical conductivity of a nanowire network while largely or substantially retaining optical characteristics of the nanowire network. An etchant can be implemented chemically, such as by wet chemistry or vapor chemistry. Another subtractive process, such as scribing or milling with a laser, corona discharge, and the like, also can be used in place of, or in conjunction with, chemical etching.

Referring next to FIG. 22B, the method can proceed to optional stage 4, in which a polymer, nanowires, or nanoparticles can be applied in a spatially selective manner (e.g., printed or doctor filled) to form an inverse pattern. In inverse printing of a polymer, a polymer of a type opposite to that printed in a previous stage can be printed in spaces or gaps between portions of the previously printed polymer. For example, if an active polymer pattern is printed in stage 3, an inactive polymer pattern can be printed in spaces between the active polymer pattern in stage 4. Alternatively, if an inactive polymer pattern is printed in stage 3, an active polymer pattern can be printed in spaces between the inactive polymer pattern in stage 4. Similarly, if a pattern of nanowires is printed in stage 3, nanoparticles can be inversely printed in spaces between the nanowire pattern in stage 4. Alternatively, if a pattern of nanoparticles is printed in stage 3, nanowires can be inversely printed in spaces between the nanoparticle pattern in stage 4.

In an optional stage 5, any exposed active materials can be pre-swelled by exposing them to a solvent.

In stage 6, the substrate or the layer can be coated in a substantially uniform manner with nanowires. The nanowires can be coated by dispersing them in a solvent, and then coating the substrate or the layer with the nanowire-containing solvent. The substrate or the layer can be inactive, active, or over-active relative to the solvent. In some embodiments, the coating of the nanowires can be doctor filled. It is noted that, in some embodiments, stage 6 can be performed before stage 5, or before stage 4. After coating, an optional mask can be disposed over the coated substrate or the coated layer in stage 7.

Additional patterning optionally can be performed in stage 8, such as by etching across the entire surface, by patterned etching (e.g., by printing of an etchant), or by printing of a cross-linking agent. As noted above, an etchant can be implemented chemically, such as by wet chemistry or vapor chemistry. Another subtractive process also can be used, such as scribing or milling with a laser, corona discharge, and the like.

An optional rinsing or washing stage 8.5 can be implemented at this point to remove any undesired or un-embedded nanoparticles or nanowires.

In stage 9, additional nanowires or nanoparticles optionally can be applied to selected portions of the surface (e.g., inactive portions), such as for the purpose of optical matching.

In stage 10, either of, or both, nanoparticles and nanowires can be surface embedded into active portions of the surface. The particular portions into which nanowires or nanoparticles are embedded depend on the previous process stages. In general, nanowires or nanoparticles can be embedded into active portions, but with little or no embedding into inactive portions. The embedding at stage 10 can involve exposure of the entire surface to solvent vapor or by coating the surface with a solvent, if a solvent has not been applied previously. The embedding optionally can involve curing of active portions including nanoparticles or nanowires, such as by application of light, heat, and so forth. The embedding also optionally can involve pressure rolling with a patterned imprinting roller, an uniform roller, or a combination of both types of rollers. In addition, a pattern of a solvent can be selectively printed over the surface, where the surface is active relative to the solvent.

After stage 10 and referring next to FIG. 22C, an optional partial etching stage 11 can be implemented. In place of, or in conjunction with stage 11, an optional stage 12 can involve overcoating or overprinting the surface to insulate or protect exposed nanowires, such as using a polymer.

FIG. 23A through FIG. 23F illustrate examples of patterned transparent conductors 2300, 2302, 2304, 2306, 2308, and 2310 formed according to the method of FIG. 22A through FIG. 22C, according to embodiments of the invention. It is noted that the patterned transparent conductors 2300, 2302, 2304, 2306, 2308, and 2310 are provided by way of example, and that a number of other configurations can be obtained by the methods described above, including those set forth in FIG. 22A through FIG. 22C.

Figure 23A:
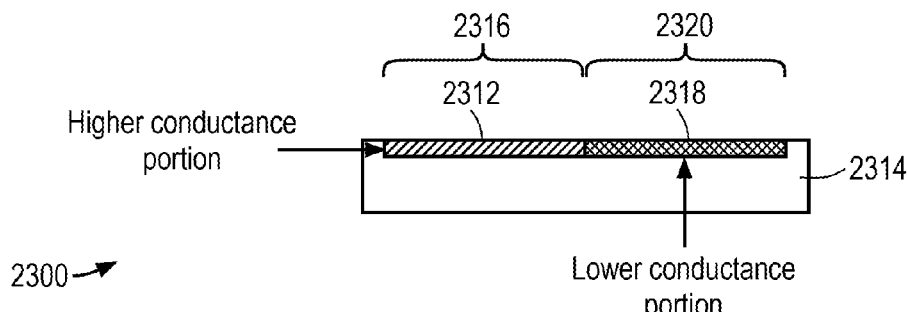
FIG. 23A through FIG. 23F illustrate examples of patterned transparent conductors formed according to the method of FIG. 22A through FIG. 22C, according to embodiments of the invention.

As shown in FIG. 23A, the patterned transparent conductor 2300 includes a first set of additives 2312 that are surface-embedded into one portion of an active substrate 2314 to form a higher conductance portion 2316, and a second set of additives 2318 that are surface-embedded into another portion of the active substrate 2314 to form a lower conductance portion 2320. For example, the additives 2312 can include nanowires, nanotubes, or other elongated structures having an aspect ratio of about 3 or more, while the additives 2318 can include nanoparticles or other spheroidal structures having an aspect ratio less than about 3. As another example, the additives 2312 can be partially embedded into a surface of the substrate 2314, while the additives 2318 can be more deeply embedded below the surface of the substrate 2314. As a further example, the additives 2318 can be partially etched or otherwise treated to degrade or reduce the electrically conductivity of the lower conductance portion 2320. The higher conductance portion 2316 and the lower conductance portion 2320 can have optical characteristics that are largely or substantially matching for low visibility patterning.

Figure 23B:
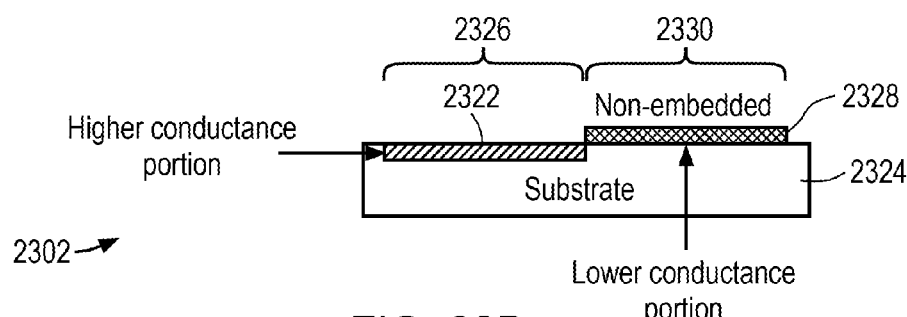

As shown in FIG. 23B, the patterned transparent conductor 2302 includes a first set of additives 2322 that are surface-embedded into one portion of a substrate 2324 to form a higher conductance portion 2326, and a second set of additives 2328 that are surface-deposited (with little or no embedding) on another portion of the substrate 2324 to form a lower conductance portion 2330. The additives 2322 and the additives 2328 can be the same or different, and the higher conductance portion 2326 and the lower conductance portion 2330 can have optical characteristics that are largely or substantially matching for low visibility patterning.

Figure 23C:
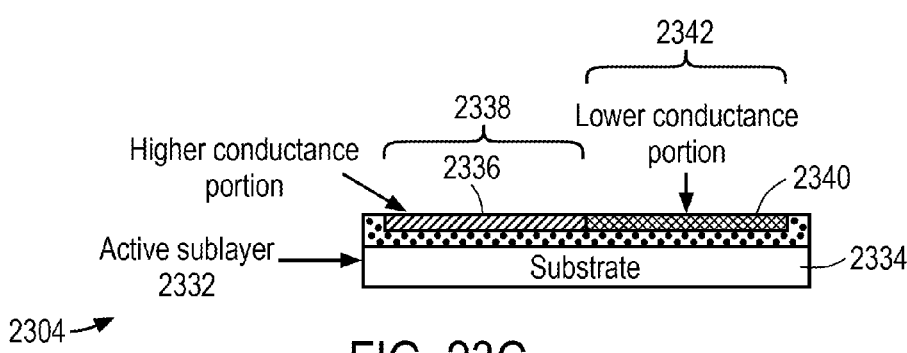

As shown in FIG. 23C, the patterned transparent conductor 2304 includes an active layer 2332 that is disposed on top of a substrate 2334, which can be either active or inactive. The layer 2332 can be formed as a coating of a polymer, for example. A first set of additives 2336 are surface-embedded into one portion of the layer 2332 to form a higher conductance portion 2338, and a second set of additives 2340 are surface-embedded into another portion of the layer 2332 to form a lower conductance portion 2342. For example, the additives 2336 can include nanowires, nanotubes, or other elongated structures having an aspect ratio of about 3 or more, while the additives 2340 can include nanoparticles or other spheroidal structures having an aspect ratio less than about 3. As another example, the additives 2336 can be partially embedded into a surface of the layer 2332, while the additives 2340 can be more deeply embedded below the surface of the layer 2332. As a further example, the additives 2340 can be partially etched or otherwise treated to degrade or reduce the electrically conductivity of the lower conductance portion 2342. The higher conductance portion 2338 and the lower conductance portion 2342 can have optical characteristics that are largely or substantially matching for low visibility patterning.

Figure 23D:
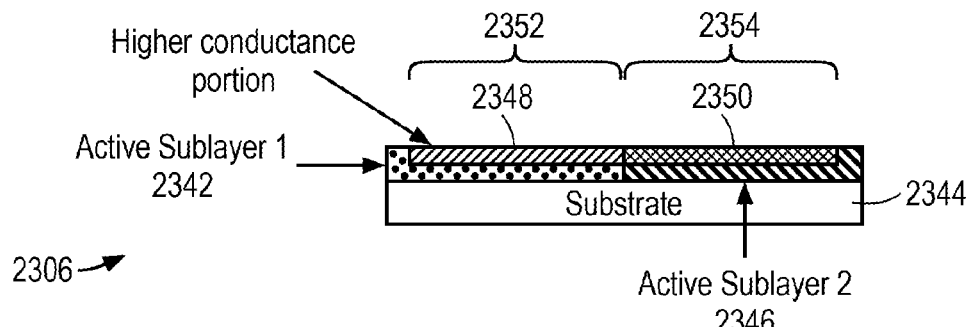

As shown in FIG. 23D, the patterned transparent conductor 2306 includes a first active layer 2342 that is disposed on top of a substrate 2344, which can be either active or inactive, as well as a second active layer 2346 that is disposed on top of the substrate 2344 and is laterally adjacent to the first active layer 2342. The first layer 2342 can be a patterned layer of a host material that permits surface embedding in a manner that promotes the formation of a percolating network, while the second layer 2346 can be a patterned layer of a different host material that permits surface embedding in a manner that inhibits the formation of a percolating network. Examples of suitable materials for the first layer 2342 include acrylics (e.g., polymethyl methacrylate), polycarbonates, polyimides, and the like, and examples of suitable materials for the second layer 2346 include ceramics (e.g., a silane-based material), certain forms of acrylics, and the like. A first set of additives 2348 are surface-embedded into the first layer 2342 to form a higher conductance portion 2352, and a second set of additives 2350 are surface-embedded into the second layer 2346 to form a lower conductance portion 2354. The additives 2348 and the additives 2350 can be the same or different, and the higher conductance portion 2352 and the lower conductance portion 2354 can have optical characteristics that are largely or substantially matching for low visibility patterning.

Figure 23E:
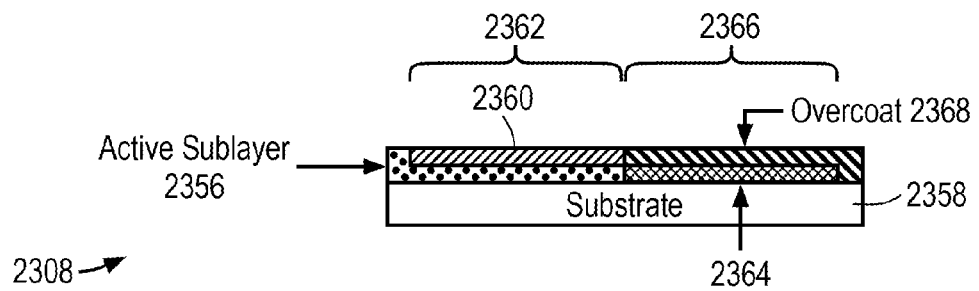
Figure 23F:
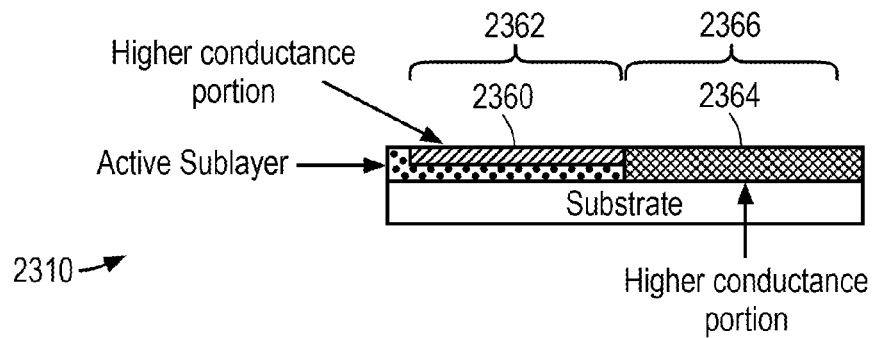

As shown in FIG. 23E, the patterned transparent conductor 2308 includes an active layer 2356 that is disposed on top of a substrate 2358. The layer 2356 can be a patterned layer of a host material that is applied in a spatially selective manner to cover certain areas of the substrate 2358, while remaining areas of the substrate 2358 remain uncovered by the layer 2356. A first set of additives 2360 are surface-embedded into the layer 2356 to form a higher conductance portion 2362, and a second set of additives 2364 are surface-deposited (with little or no embedding) on uncovered or exposed areas of the substrate 2358 to form a lower conductance portion 2366. An overcoat 2368 can be applied in a spatially selective manner over the surface-deposited additives 2364 to retain the additives 2364 and to planarize a surface of the patterned transparent conductor 2308. The overcoat 2368 also can be omitted as shown for the patterned transparent conductor 2310 of FIG. 23F, in which a thickness or an amount of the surface-deposited additives 2364 is adjusted to planarize the surface. The additives 2360 and the additives 2364 can be the same or different, and the higher conductance portion 2362 and the lower conductance portion 2366 can have optical characteristics that are largely or substantially matching for low visibility patterning.

Devices Including Transparent Conductors

The transparent conductors described herein can be used as transparent conductive electrodes in a variety of devices. Examples of suitable devices include solar cells (e.g., thin-film solar cells and crystalline silicon solar cells), display devices (e.g., flat panel displays, liquid crystal displays ("LCDs"), plasma displays, organic light emitting diode ("OLED") displays, electronic-paper ("e-paper"), quantum dot displays (e.g., QLED Displays), and flexible displays), solid-state lighting devices (e.g., OLED lighting devices), touch sensor devices (e.g., projected capacitive touch sensor devices, touch-on-glass sensor devices, touch-on-lens projected capacitive touch sensor devices, on-cell or in-cell projected capacitive touch sensor devices, self capacitive touch sensor devices, surface capacitive touch sensor devices, and resistive touch sensor devices), smart windows (or other windows), windshields, aerospace transparencies, electromagnetic interference shields, charge dissipation shields, and anti-static shields, as well as other electronic, optical, optoelectronic, quantum, photovoltaic, and plasmonic devices. The transparent conductors can be tuned or optimized depending on the particular application, such as work function matching in the context of photovoltaic devices or tuning of the transparent conductors to form Ohmic contacts with other device components or layers.

In some embodiments, the transparent conductors can be used as electrodes in touch screen devices. A touch screen device is typically implemented as an interactive input device integrated with a display, which allows a user to provide inputs by contacting a touch screen. The touch screen is typically transparent to allow light and images to transmit through the device.

Figure 24:
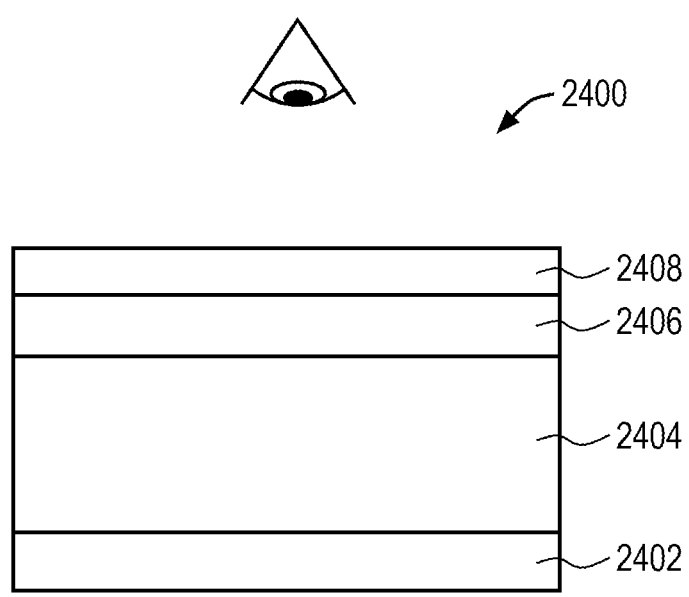
FIG. 24 illustrates a touch screen device according to an embodiment of the invention.

FIG. 24 illustrates an example of a projected capacitive touch screen device 2400 according to an embodiment of the invention. The touch screen device 2400 includes a thin-film separator 2404 that is disposed between a pair of patterned transparent conductive electrodes 2402 and 2406, as well as a rigid touch screen 2408 that is disposed adjacent to a top surface of the transparent conductive electrode 2406. A change in capacitance occurs when a user contacts the touch screen 2408, and a controller (not illustrated) senses the change and resolves a coordinate of the user contact. Advantageously, either, or both, of the transparent conductive electrodes 2402 and 2406 can be implemented using the transparent conductors described herein. It is also contemplated that the transparent conductors can be included in resistive touch screen devices (e.g., 4-wire, 5-wire, and 8-wire resistive touch screen devices), which include a flexible touch screen and operate based on electrical contact between a pair of transparent conductive electrodes when a user presses the flexible touch screen.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Nanowire Dispersion

In one implementation, a first population of nanowires (having a first set of morphological characteristics) is combined in solution with a second population of nanowires (having a second set of morphological characteristics), and then surface-embedded in one operation. For example, the first population can include nanowires of about 20 nm in diameter (on average) and about 20 µm in length (on average), and the second population can include larger-sized nanowires of about 100 nm in diameter (on average) and about 100 µm in length (on average). The first population and the second population are mixed in about 40% (by volume) trifluoroethanol and about 60% (by volume) isopropanol, and then slot-die coated onto a polyimide layer on a glass substrate. Each nanowire population is included at a concentration of about 2 mg/ml, and a resulting surface-embedded structure exhibits about 92% in transmittance and about 100 Ohms/sq in sheet resistance.

In another implementation, a first population of nanowires (having a first set of morphological characteristics) is initially surface-embedded into a host material, and then a second population of nanowires (having a second set of morphological characteristics) is subsequently surface-embedded into the same region of the host material. The host material can be a coating, a substrate, or otherwise serve as a matrix for the surface-embedded nanowires. For example, one population of nanowires can include nanowires of about 40 nm in diameter (on average) and about 20 µm in length (on average), and the other population of nanowires can include larger-sized nanowires of about 200 nm in diameter (on average) and about 200 µm in length (on average). Each population of nanowires is dispersed in about 40% (by volume) trifluoroethanol and about 60% (by volume) isopropanol at a concentration of about 2 mg/ml, and then sequentially slot-die coated onto a polyimide layer on a glass substrate. A resulting surface-embedded structure exhibits about 92% in transmittance and about 100 Ohms/sq in sheet resistance.

Example 2

Formation of Patterned Transparent Conductor

A polydimethylsiloxane stamp is laser etched to form a patterned stamp, and the patterned stamp is used to stamp onto a reservoir of silver nanowires in a solution of about 50% (by volume) isopropanol and about 50% (by volume) trifluoroethanol at a concentration of about 5 mg/ml. The patterned stamp is stamped onto a polyimide planarization layer of about 1 µm in thickness. The polyimide layer, which can be patterned or unpatterned, is disposed on a color filter. A bottom surface of the stamp can be the main or sole point of contact between the stamp and the polyimide layer, while other patterned portions away from the bottom face of the stamp can make little or no contact with the polyimide layer. In such manner, the pattern of the bottom surface of the stamp can be effectively transferred onto the polyimide layer. The alcohol solution facilitates durable and spatially varying surface-embedding of silver nanowires into the polyimide layer according to the transferred pattern. The stamping process is desirably carried out in a manner such that at least a portion of the alcohol solution remains during surface-embedding. The stamp can be reused, such as by re-immersing or re-stamping onto the silver nanowire dispersion to transfer another pattern. The stamp can take on the form factor of a roller, similar to a rotogravure used in intaglio printing. In other implementations, the stamp can be formed of another polymer, an elastomer, a metal, a ceramic, or another suitable material.

Example 3

Formation of Patterned Transparent Conductor

A similar stamping process is carried out as set forth in Example 2, except where a stamp's bottom surface and top surface (which is recessed from the bottom surface as patterned by laser etching) are both wetted by a nanowire dispersion. Nanowires exposed on the bottom surface of the stamp are wiped off, leaving nanowires on the top surface. The stamp is applied onto a polyimide substrate, and nanowires are surface-embedded in regions according to the pattern of the top surface of the stamp.

Example 4

Formation of Patterned Transparent Conductor

A laser or another light source is used to crosslink or otherwise render inactive certain portions of a PMMA photoresist, a polymer, or another host material deposited on a cyclic olefin copolymer substrate. For example, a laser beam can be rastered across the polymer to form an inverse pattern. Then, a silver nanowire dispersion employing about 10% or more (by volume) trifluoroethanol in isopropanol can be slot-die coated across the polymer. Silver nanowires deposited over inactive portions of the polymer are inhibited against surface-embedding, while silver nanowires deposited over non-crosslinked portions are surface-embedded. Then, a washing operation optionally can be used to selectively remove silver nanowires from the inactive portions that were rendered insoluble to the embedding solution, leaving nanowires that are surface-embedded into temporarily solubilized portions of the polymer. Alternatively, the surface can be left unwashed so that the inactive portions (with nanowires remaining on the surface) have reduced conductivity but blend in optically with nearby portions (with surface-embedded nanowires) that have higher conductivity.

Example 5

Formation of Patterned Transparent Conductor

A similar patterning process is carried out as set forth in Example 4, except where a photolithographic mask is used to selectively expose certain portions of a photoresist to UV light. Regardless of whether the photoresist is positive or negative, the photolithographic masking process forms solubilized portions of the photoresist to be developed and etched away, leaving remaining portions with durably surface-embedded nanowires.

Example 6

Formation of Patterned Transparent Conductor

A chemical agent is used to crosslink or otherwise render inactive certain portions of a photoresist, a polymer, or another host material deposited on a glass substrate. For example, the chemical agent can be printed across the polymer to form an inverse pattern using any printing technique, such as screen printing, gravure printing, offset printing, and so forth. Then, a silver nanowire dispersion employing about 10% or more (by volume) trifluoroethanol in isopropanol can be slot-die coated across the polymer. Then, a rinsing or washing operation optionally can be used to selectively remove silver nanowires from the inactive portions that were rendered insoluble to the embedding solution, leaving nanowires that are surface-embedded into temporarily solubilized portions of the polymer. Alternatively, the surface can be left unwashed so that the inactive portions (with nanowires remaining on the surface) have reduced conductivity but blend in optically with nearby portions (with surface-embedded nanowires) that have higher conductivity.

Example 7

Formation of Patterned Transparent Conductor

On a glass substrate overcoated with a polyimide planarization layer, a physical mask is applied tightly either by pressure or using an adhesive. Then, a nanowire dispersion including an embedding solvent is applied onto the masked layer via slot-die coating. Either before or after the polyimide layer has dried, the mask is removed, leaving nanowires durably surface-embedded within unmasked portions of the layer. If the mask is still wet during removal, the mask can be rinsed or immersed in a solution to collect any remaining nanowires into a bath, which can be re-condensed via settling or centrifugation for subsequent use. The physical mask can be formed of a metal, a polymer, a ceramic, or another material that is substantially insoluble in the embedding solvent. In place of, or in conjunction with, polyimide, another polymer (e.g., polymethyl methacrylate) or host material that can be affected by an embedding solvent can be used.

Example 8

Formation of Patterned Transparent Conductor

Onto a glass substrate, a layer of polyimide is applied in a patterned fashion by any suitable method, such as gravure printing, intaglio printing, ink-jet printing, lithography, imprint, screen printing, and so forth. Then, a nanowire embedding dispersion is applied using any coating method, and nanowires are selectively surface-embedded into the polyimide pattern. Specifically, nanowires deposited over the polyimide pattern are surface-embedded, while nanowires deposited over portions of the glass substrate without the polyimide pattern are inhibited against surface-embedding. In place of, or in conjunction with, polyimide, another polymer (e.g., polymethyl methacrylate) or host material that can be affected by an embedding solvent can be used.

Example 9

Formation of Patterned Transparent Conductor

Onto a glass substrate, a layer of polyimide is applied in a patterned fashion by any suitable method, such as gravure printing, intaglio printing, ink-jet printing, lithography, imprint, screen printing, and so forth. Some portions of the patterned layer include polyimide of Type A, while others portions include polyimide of Type B. Type A promotes higher conductivity, while Type B promotes lower conductivity. Nanowires can remain on a surface of the Type B portions, or can be surface-embedded into the Type B portions although exhibiting reduced conductivity. Then, a nanowire embedding dispersion is applied using any coating method, and nanowires are selectively surface-embedded into the polyimide pattern. In addition, portions of the pattern including polyimide of Type A exhibit high conductivity, while those portions of the pattern including polyimide of type B exhibit little or no conductivity. In place of, or in conjunction with, polyimide, another polymer (e.g., polymethyl methacrylate) or host material that can be affected by an embedding solvent can be used.

Example 10

Formation of Patterned Transparent Conductor

Onto a glass substrate, a layer of polyimide is applied in a first pattern by any suitable method, such as gravure printing, intaglio printing, ink-jet printing, lithography, imprint, screen printing, and so forth. Then, a nanowire embedding dispersion is applied using any coating method, and nanowires are selectively surface-embedded into the first pattern. A second pattern in the inverse of the first pattern is then printed, with a formulation that substantially optically matches the first pattern but electrically disables nanowires. In place of, or in conjunction with, polyimide, another polymer (e.g., polymethyl methacrylate) or host material that is susceptible to an embedding solvent can be used.

Example 11

Formation of Patterned Transparent Conductor

Onto a glass substrate, a layer of polyimide is applied in a first pattern by any suitable method, such as gravure printing, intaglio printing, ink-jet printing, lithography, imprint, screen printing, and so forth. A second pattern in the inverse of the first pattern is then printed so as to planarize the surface. The second pattern has a formulation that disables electrically conductivity of a nanowire network. Then, a nanowire embedding dispersion is applied using any coating method, resulting in the first pattern with surface-embedded nanowires exhibiting high conductivity, and the second pattern with surface-embedded nanowires exhibiting little or no conductivity. In place of, or in conjunction with, polyimide, another polymer (e.g., polymethyl methacrylate) or host material that can be affected by an embedding solvent can be used. Also, the second, inverse pattern can include a material that is not susceptible to the embedding solvent, thereby not permitting surface-embedding or permitting surface-embedding to a low degree. A rinsing or washing operation optionally can be used to selectively remove nanowires that are superficially deposited on the second, non-embedded pattern. The second, non-embedded pattern can have a formulation that substantially matches optical characteristics of the first pattern, such as one or more of transmittance, reflectance, haze, clarity, or another characteristic of the first pattern with the surface-embedded nanowire network, thereby masking the patterns, hiding the patterns, or rendering the patterns hard to detect visually or optically.

Example 12

Formation of Patterned Transparent Conductor

An inverse pattern includes a material having one or more of absorbance, transmittance, reflectance, haze, or another optical characteristic matched or similar to those of a surface-embedded silver nanowire network. For example, if the silver nanowire network in surface-embedded portions of a first polyimide pattern has a transmittance of about 90%, a haze of about 4%, an absorbance of about 1%, and a reflectance of about 9%, then a second, inverse pattern can include polyimide engineered to exhibit about 90% in transmittance, about 4% in haze, about 1% in absorbance, and about 9% in reflection. Methods of engineering polyimide can include modifying its polymerization chemistry and compounding or embedding fillers into the polyimide, such as one or more of scattering particles, absorbing particles, and reflecting particles. In place of, or in conjunction with, polyimide, another polymer (e.g., polymethyl methacrylate) or host material that can be affected by an embedding solvent can be used.

Example 13

Formation of Patterned Transparent Conductor

Using a mimeograph, a glass substrate overcoated with a polyimide layer is surface-embedded with a dispersion of nanowires in ethanol and trifluoroethanol. The dispersion is placed in a drum of a rotary machine, such that when the substrate is pulled through the machine, the rotating drum forces the dispersion through openings of a stencil. The design of the stencil dictates a pattern of nanowires transferred onto the polyimide layer. In place of, or in conjunction with, polyimide, another polymer (e.g., polymethyl methacrylate) or host material that can be affected by an embedding solvent can be used.

Example 14

Formation of Patterned Transparent Conductor

Areas over a substrate (where conductive traces are to be formed) are printed with a host material that promotes higher conductivity, and remaining areas over the substrate (corresponding to gaps between the conductive traces) are printed with a different host material that inhibits effective contact between nanowires, thereby creating lower conductivity or insulating portions. For example, a silane-based material, such as tetraethoxysilane, can be printed over areas between the conductive traces.

Example 15

Formation of Patterned Transparent Conductor

With a printing tool, positive portions of a pattern are printed in a spatially selective manner with conductive (e.g., silver) nanowires in a solution that surface-embeds the conductive nanowires into a substrate to form a percolating network. The negative portions of the pattern are then printed with a silver-containing dispersion (e.g., silver nanoparticle dispersion) with a surface density or a concentration to substantially match optical characteristics of the positive, higher conductance portions, and the silver nanoparticles are similarly surface-embedded into the substrate surface. This method yields higher conductance portions and lower conductance portions, yet matching transmission, reflection, scattering, and other optical characteristics across the two portions to a desirable degree. The patterning can be achieved by physical masking, shadow masking, a stencil, mimeograph, offset gravure, or any other printing method. The substrate can be a plastic film, a plastic sheet, a glass substrate, a glass substrate overcoated with a coating, or the like.

Example 16

Formation of Patterned Transparent Conductor

With a printing tool, positive portions of a pattern are printed in a spatially selective manner on a surface of a substrate with a polymer susceptible to surface-embedding. Negative portions of the pattern are not printed and, therefore, correspond to uncovered portions of the substrate. Then, a nanowire embedding dispersion is applied using any coating method, resulting in a surface-embedded conductive nanowire network in positive portions of the pattern. The negative portions of the pattern can include nanowires that remain on the surface of the substrate, or the nanowires can be surface-embedded into the negative portions although exhibiting reduced conductivity. Since nanowires are present in both the positive (higher conductance) and negative (lower conductance) portions of the pattern, the resulting pattern is largely invisible. The functionality of the positive and negative portions of the pattern can be reversed, meaning that the positive portions of the pattern can be of lower conductance, and the negative portions of the pattern can be of higher conductance.

Example 17

Formation of Patterned Transparent Conductor

With a laser ablation tool, a substantially uniformly surface-embedded silver nanowire network adjacent to a surface of a substrate or an overcoat is ablated in a spatially selective manner to form lower conductance regions. The ablation can be partial or full, resulting in about 1-100% of silver nanowires adjacent to the surface ablated away to tune an electrical contrast across the substrate. For example, partially ablating about 50% of the nanowires from a portion can render that portion insulating, whereas adjacent portions remain conductive, thereby achieving electrical isolation. This partial ablation also achieves low optical contrast between portions. Adjusting one or more of a power of the laser, a number of laser ablation passes, a speed of the laser, a laser pulse width, a concentration of the nanowires, a substrate material, and other parameters can be used to control the extent of ablation.

Example 18

Formation of Patterned Transparent Conductor

Onto a glass substrate, a layer of polyimide is applied in a patterned fashion by any suitable method, such as gravure printing, intaglio printing, ink-jet printing, lithography, imprint, screen printing, and so forth. Some portions of the patterned layer include polyimide of Type A, while others portions include polyimide of Type B. Type A promotes higher conductivity, while Type B promotes lower conductivity. A corona or UV ozone treatment is then applied to either, or both, of the Type A portions and the Type B portions with or without a photomask. The corona or UV ozone treatment modifies the interaction of a nanowire dispersion with the treated portions, such as by modifying their susceptibility to surface-embedding. Then, a nanowire embedding dispersion is applied using any coating method, and nanowires are selectively surface-embedded into the polyimide pattern. In addition, portions of the pattern including polyimide of Type A exhibit high conductivity, while those portions of the pattern including polyimide of type B exhibit little or no conductivity. In place of, or in conjunction with, polyimide, another polymer (e.g., polymethyl methacrylate) or host material that can be affected by an embedding solvent can be used.

Example 19

Formation of Patterned Transparent Conductor

A similar patterning process is carried out as set forth in Example 18, except that nanowires are initially applied without an embedding solvent that interacts with either the Type A portions or the Type B portions. Then in a subsequent operation, an embedding solvent is applied over the substrate and the polyimide pattern using a coating tool or via embedding solvent vapor exposure.

Example 20

Formation of Patterned Transparent Conductor

A polycarbonate film (available under the trademark Lexan®) is masked with a conductive stencil, and then treated in an UV ozone chamber (UVOCS) for about 0.8 min. The film is then subjected to an application of a silver nanowire formulation of about 4 mg/ml concentration in about 95% (by volume) isopropanol and about 5% (by volume) cyclohexanone. This formulation is deposited onto the polycarbonate film via a draw-down application of a rod coater with about 0.75 mil gap at a speed of about 2 inches/second. The portions exposed to the UV ozone environment (i.e., the unmasked portions) allow surface-embedding of silver nanowires in a manner that inhibits electrical percolation, such as by deeply embedding the nanowires beneath the surface of the polycarbonate. The masked portions allow surface-embedding of silver nanowires in a manner that promotes electrical percolation. Resulting higher and lower conductance portions exhibit little or no differences in optical characteristics (e.g., transmittance, haze, reflection, and absorption), thereby forming isolated conductive traces that are substantially visually undetectable. This example yields higher conductance portions of about 100 Ohms/sq and lower conductance portions of greater than about 100,000 Ohms/sq with substantially indistinguishable boundaries between the two portions.

Example 21

Formation of Patterned Transparent Conductor

A cyclic olefin copolymer ("COC") film is initially treated with toluene via a draw-down rod coater with about 2 mil gap and about 2 inch/second linear conveyance speed. After about 30 seconds to allow the toluene to partially evaporate, an application of silver nanowires in isopropanol is similarly drawn with the rod coater with about 1 mil gap and about 2 inch/second linear conveyance speed. This renders the silver nanowires durably surface-embedded into the COC film, via a direct embedding approach and without requiring an overcoat. After the silver nanowires are embedded uniformly in the COC film, the COC film is masked with a conductive stencil, exposing certain portions that are subjected to a corona arc discharge treatment. This treatment discharges electricity onto the exposed or unmasked portions, overloading current in those portions of a nanowire network and degrading junctions where the resistance is highest. In such manner, the exposed portions become lower conductance portions, while preserving substantially matching optical characteristics (e.g., transmittance, haze, reflection, and absorption) relative to masked portions that remain conductive.

Example 22

Formation of Patterned Transparent Conductor

A patterning process is carried out using a screen-printable etchant with a formulation designed to degrade silver nanowire conductivity via partial etching of surface-embedded silver nanowires. A polycarbonate sheet of about 180 μm in thickness is surface-embedded with silver nanowires to yield an optical transmission of about 90.6%, a haze of about 1.32%, and a surface resistivity of about 147 Ω/sq.

An aqueous screen-printable etchant is formulated based on (1) about 5-20 vol % of hydrogen peroxide, (2) about 10-30 wt % hydroxyethyl cellulose and about 0.1-5 wt % of polyethylene oxide as viscosity enhancers and aids for forming a printed film matrix, (3) about 0.01-1 wt % of a silicon surfactant (available as BYK-348) and about 1-10% vol % of isopropanol or trifluoroethanol as surfactants or wetting agents, and (4) about 0.01-2 vol % of an anti-foaming or anti-bubbling agent (available as Rhodaline 646). Since both hydrogen peroxide and water are high surface tension liquids, the formulation is designed to allow uniform printing over a hydrophobic surface, which allows uniform degrading of electrical conductivity over selected portions of the surface. The screen-printable etchant is applied in a spatially selective manner over the polycarbonate sheet with surface-embedded nanowires, and then dried at room temperature or with moderate heat for about 5-30 minutes and rinsed off using de-ionized water. The surface resistivity of the lower conductance portions became effectively infinite while maintaining a similar transmission of about 92.1% and a similar haze of about 1.26%.

Figure 25A:
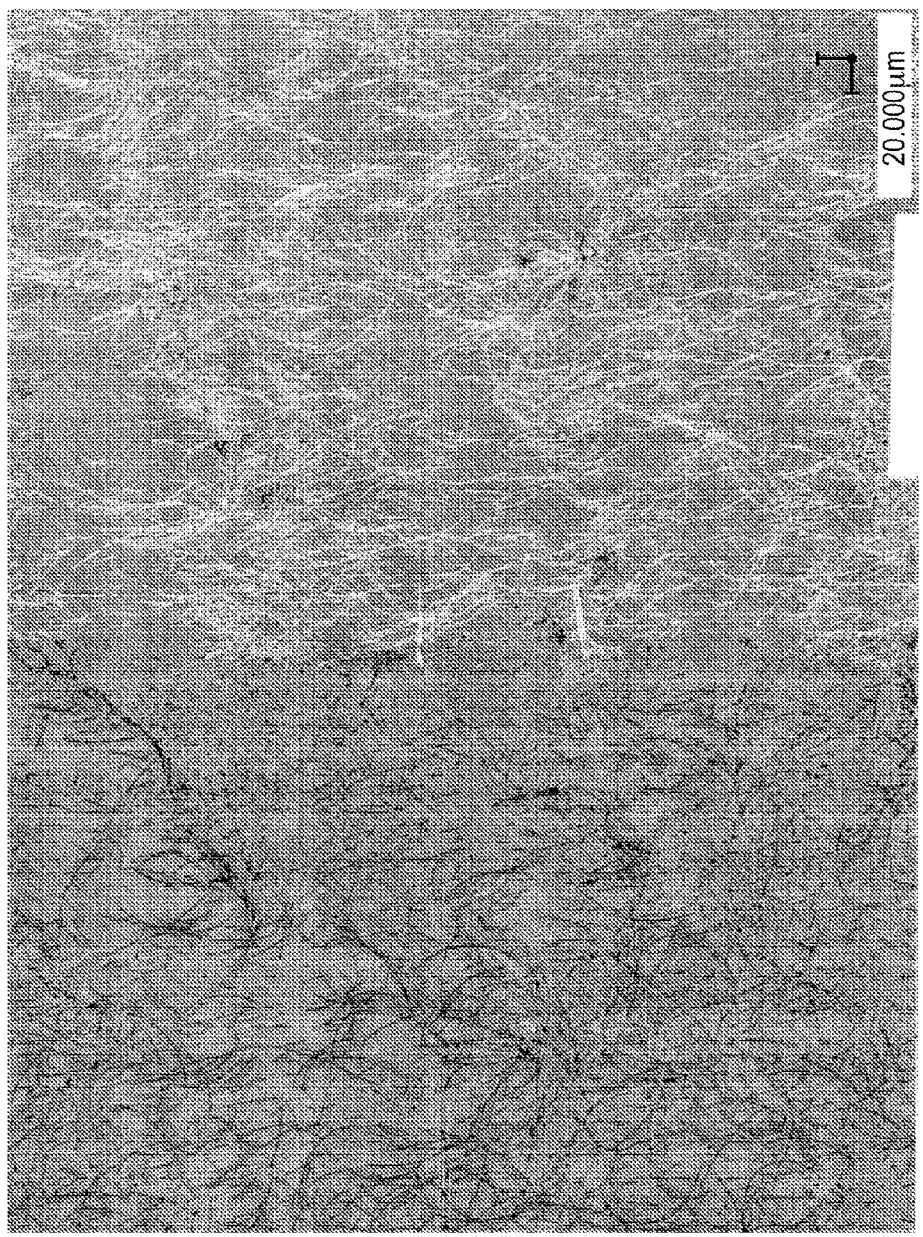
FIG. 25A and FIG. 25B include microscope images illustrating a patterned transparent conductor, according to embodiments of the invention.
Figure 25B:
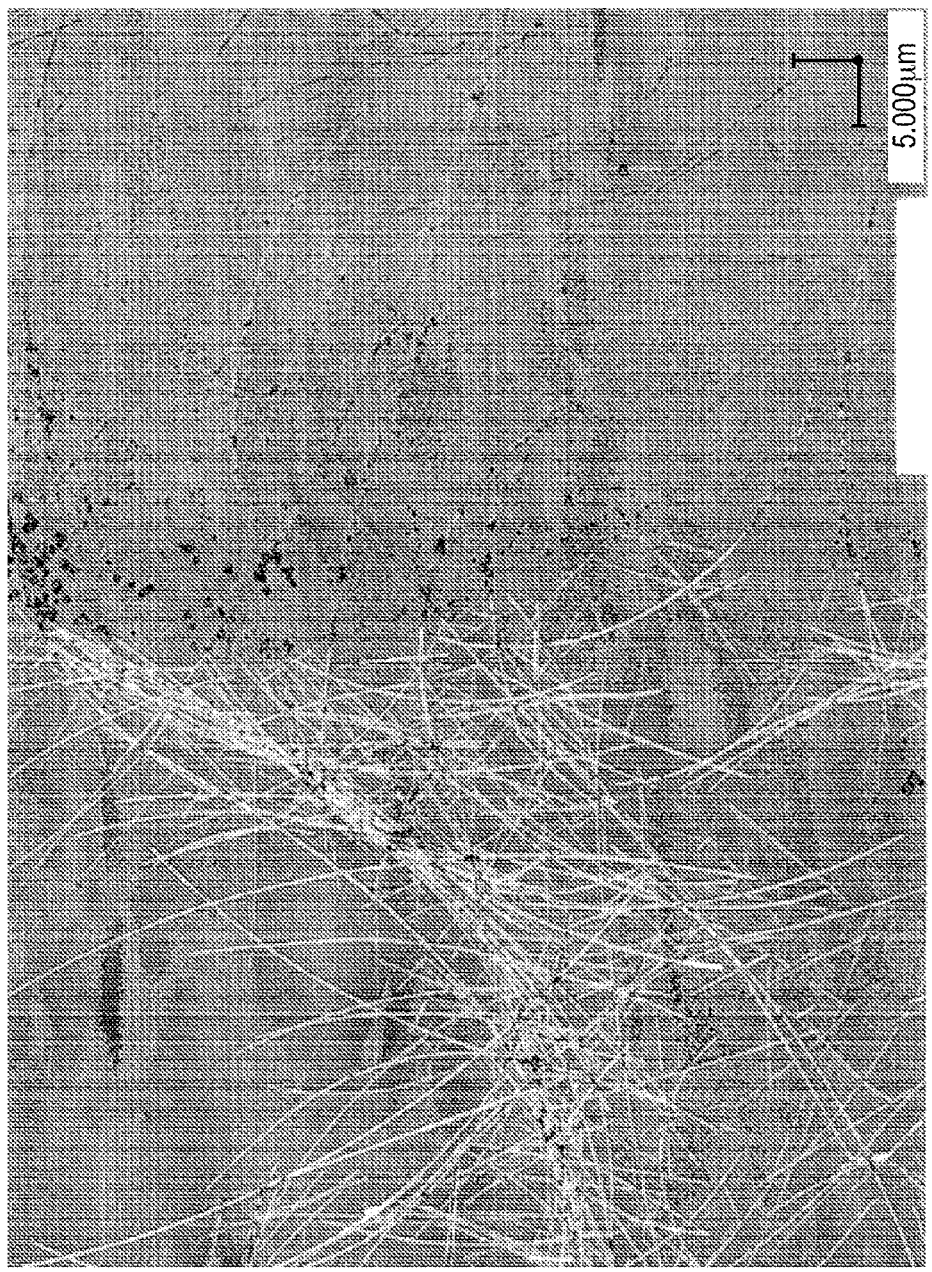

FIG. 25A and FIG. 25B include microscope images illustrating a transparent conductor patterned using an aqueous screen-printable etchant, according to an embodiment of the invention. In FIG. 25A, a partially etched portion is on the left-hand side, and an un-etched portion is on the right-hand side. In FIG. 25B (which is at a higher magnification than FIG. 25A), an un-etched portion is on the left-hand side, and a partially etched portion is on the right-hand side. The partially etched and un-etched portions can be discerned at the magnifications shown in FIG. 25A and FIG. 25B, but are largely or substantially visually indistinguishable to the unaided human eye.

Example 23

Formation of Patterned Transparent Conductor

A polycarbonate sheet (available as Lexan® HP92S) with about 180 μm in thickness is used as a substrate. As a screen-printable over-active layer, about 5-30 wt % of polystyrene, polystyrene-based copolymer, polymethyl methacrylate, polymethyl methacrylate-based copolymer (e.g., polymethyl methacrylate-n-butyl methacrylate copolymer or polymethyl methacrylate-co-polylauryl methacrylate copolymer), polyethyl methacrylate, poly n-butyl methacrylate, polyisobutyl methacrylate, poly-n-butyl-polyisobutyl methacrylate copolymer, or a combination thereof is dissolved in hexanol. The solution is screen printed in a spatially selective manner over areas of the substrate to result in lower conductance portions.

A dispersion of silver nanowires in about 0.1-10 vol % of cyclohexanone in isopropanol is prepared. The nanowires are about 40-80 nm in diameter (on average) and about 20-80 μm in length (on average). A concentration of the nanowires is about 0.3-0.5 wt/vol % of the solvent mixture. The nanowire dispersion is coated over the entire sample, such that nanowires are surface-embedded into exposed portions of the substrate to achieve a surface resistance of about 10-500 Ω/sq, and nanowires are more deeply embedded below a surface of the over-active layer to yield an insulating surface. After surface-embedding, similar amounts of silver nanowires are embedded into higher and lower conductance portions to yield similar transmission and haze values across the portions.

Example 24

Formation of Patterned Transparent Conductor

A polyethylene terephthalate (available as Melinex ST580) with about 76 μm in thickness is used as a substrate. As a screen-printable active layer, about 5-30 wt % of polystyrene, polystyrene-based copolymer, polymethyl methacrylate, polymethyl methacrylate-based copolymer (e.g., polymethyl methacrylate-n-butyl methacrylate copolymer or polymethyl methacrylate-co-polylauryl methacrylate copolymer), or a combination thereof is dissolved in anisole, cyclohexanone, methyl ethyl ketone, or methyl isobutyl ketone. The solution is screen printed in a spatially selective manner over areas of the substrate to result in higher conductance portions.

A dispersion of silver nanowires in about 0.1-40 vol % of trifluoroethanol, tetrafluoroethanol, dioxane, methyl isobutyl ketone, or cyclohexanone in isopropanol is prepared. The nanowires are about 40-80 nm in diameter (on average) and about 20-80 μm in length (on average). A concentration of the nanowires is about 0.3-0.5 wt/vol % of the solvent mixture. The nanowire dispersion is coated over the entire sample, such that nanowires are surface-embedded into the active layer to achieve a surface resistance of about 10-500 Ω/sq, and nanowires remain superficially deposited (with little or no embedding) on exposed portions of the substrate.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A patterned transparent conductor comprising:
   a substrate; and
   additives at least partially embedded into at least one surface of the substrate and localized adjacent to the surface according to a pattern to form higher sheet conductance portions, wherein the higher sheet conductance portions are laterally adjacent to lower sheet conductance portions, wherein the higher sheet conductance portions are electrically isolated from one another, wherein the patterned transparent conductor further comprises a layer covering areas of the surface corresponding to the lower sheet conductance portions.

2. The patterned transparent conductor of claim 1, wherein a sheet resistance of the lower sheet conductance portions is at least 100 times a sheet resistance of the higher sheet conductance portions.

3. The patterned transparent conductor of claim 1, wherein the additives form a percolating network within at least one of the higher sheet conductance portions.

4. The patterned transparent conductor of claim 1, wherein the additives have an aspect ratio of at least 3.

5. The patterned transparent conductor of claim 1, wherein the lower sheet conductance portions and the higher sheet conductance portions are substantially visually indistinguishable.

6. The patterned transparent conductor of claim 1, wherein a difference in transmittance values of the higher sheet conductance portions and the lower sheet conductance portions is no greater than about 5%, and a difference in haze values of the higher sheet conductance portions and the lower sheet conductance portions is no greater than about 5%.

7. A patterned transparent conductor comprising:
a substrate; and
additives at least partially embedded into at least one surface of the substrate and localized adjacent to the surface according to a pattern to form higher sheet conductance portions, wherein the higher sheet conductance portions are laterally adjacent to lower sheet conductance portions, wherein the additives correspond to first additives, and the patterned transparent conductor further comprises second additives included in the lower sheet conductance portions.

8. The patterned transparent conductor of claim 7, wherein the second additives are embedded into the surface of the substrate within areas of the surface corresponding to the lower sheet conductance portions, and an extent of embedding of the second additives within the lower sheet conductance portions is greater than an extent of embedding of the first additives within the higher sheet conductance portions.

9. The patterned transparent conductor of claim 7, wherein the second additives are embedded into the surface of the substrate within areas of the surface corresponding to the lower sheet conductance portions, and the second additives are treated to inhibit formation of a percolating network.

10. The patterned transparent conductor of claim 7, wherein the second additives are deposited on areas of the surface of the substrate corresponding to the lower sheet conductance portions.

11. The patterned transparent conductor of claim 7, wherein the patterned transparent conductor further comprises a patterned layer covering areas of the surface corresponding to the lower sheet conductance portions, and the second additives are at least partially incorporated in the patterned layer.

12. A patterned transparent conductor comprising:
a substrate; and
additives at least partially embedded into at least one surface of the substrate and localized adjacent to the surface according to a pattern to form higher sheet conductance portions, wherein the higher sheet conductance portions are laterally adjacent to lower sheet conductance portions, wherein the additives correspond to first additives, the surface corresponds to a first surface, and the patterned transparent conductor further comprises second additives at least partially embedded into at least a second, opposite surface of the substrate.

13. A touch screen device comprising the patterned transparent conductor of claim 1.

14. A patterned transparent conductor comprising:
a substrate;
a coating disposed over at least one side of the substrate; and
additives embedded into a surface of the coating according to a pattern to form higher sheet conductance portions, wherein the additives are localized within a depth from the surface that is less than a thickness of the coating, and the higher sheet conductance portions are spaced apart by gaps that correspond to lower sheet conductance portions, wherein substantially all of the additives are localized within the depth from the surface that is no greater than 75% of the thickness of the coating.

15. The patterned transparent conductor of claim 14, wherein the additives include silver nanowires.

16. The patterned transparent conductor of claim 14, wherein a difference in absorbance values of the higher sheet conductance portions and the lower sheet conductance portions is no greater than about 5%.

17. A patterned transparent conductor comprising:
a substrate;
a coating disposed over at least one side of the substrate; and
additives embedded into a surface of the coating according to a pattern to form higher sheet conductance portions, wherein the additives are localized within a depth from the surface that is less than a thickness of the coating, and the higher sheet conductance portions are spaced apart by gaps that correspond to lower sheet conductance portions, wherein the additives correspond to first additives, and the patterned transparent conductor further comprises second additives included in the lower sheet conductance portions.

18. The patterned transparent conductor of claim 17, wherein the second additives are embedded into the surface of the coating within areas of the surface corresponding to the lower sheet conductance portions, and a surface coverage of the second additives within the lower sheet conductance portions is less than a surface coverage of the first additives within the higher sheet conductance portions.

19. The patterned transparent conductor of claim 17, wherein the second additives are embedded into the surface of the coating within areas of the surface corresponding to the lower sheet conductance portions, and the second additives are treated to inhibit formation of a percolating network.

20. The patterned transparent conductor of claim 17, wherein the second additives are deposited on areas of the surface of the coating corresponding to the lower sheet conductance portions.

21. A touch screen device comprising the patterned transparent conductor of claim 14.

22. A patterned transparent conductor comprising:
a substrate;
a patterned layer covering an area of the substrate; and
additives embedded into a surface of the patterned layer to form a higher sheet conductance portion, wherein the additives are localized within a depth from the surface that is less than a thickness of the patterned layer, and a laterally adjacent area of the substrate corresponds to a lower sheet conductance portion.

23. The patterned transparent conductor of claim 22, wherein a sheet resistance of the higher sheet conductance portion is no greater than 500 Ω/sq, and a sheet resistance of the lower sheet conductance portion is at least 10,000 Ω/sq.

24. The patterned transparent conductor of claim 22, wherein substantially all of the additives are localized within the depth from the surface that is no greater than 50% of the thickness of the patterned layer.

25. The patterned transparent conductor of claim 22, wherein the additives correspond to first additives, and the patterned transparent conductor further comprises second additives included in the lower sheet conductance portion.

26. The patterned transparent conductor of claim 25, wherein the second additives are deposited on the laterally adjacent area of the substrate.

27. The patterned transparent conductor of claim 25, wherein the patterned layer is a first patterned layer, and the patterned transparent conductor further comprises a second patterned layer covering the laterally adjacent area of the substrate, and the second additives are at least partially incorporated in the second patterned layer.

28. The patterned transparent conductor of claim 25, wherein the first additives have an aspect ratio of at least 3, and the second additives have an aspect ratio less than 3.

29. The patterned transparent conductor of claim 22, wherein a difference in reflectance values of the higher sheet conductance portion and the lower sheet conductance portion is no greater than about 5%.

30. A touch screen device comprising the patterned transparent conductor of claim 22.

* * * * *